(12) United States Patent
Williams

(10) Patent No.: US 8,584,353 B2
(45) Date of Patent: Nov. 19, 2013

(54) METHOD FOR FABRICATING A CONTACT GRID ARRAY

(75) Inventor: John D. Williams, Campbell, CA (US)

(73) Assignee: Neoconix, Inc., Sunnyvale, CA (US)

( * ) Notice: Subject to any disclaimer, the term of this patent is extended or adjusted under 35 U.S.C. 154(b) by 752 days.

(21) Appl. No.: 11/445,272

(22) Filed: Jun. 2, 2006

(65) Prior Publication Data

US 2007/0054515 A1    Mar. 8, 2007

Related U.S. Application Data

(63) Continuation-in-part of application No. 10/412,729, filed on Apr. 11, 2003, now Pat. No. 7,056,131, and a continuation-in-part of application No. 10/731,213, filed on Dec. 8, 2003, now abandoned.

(51) Int. Cl.
*H01K 3/10* (2006.01)

(52) U.S. Cl.
USPC .................................. 29/852; 29/832; 29/840

(58) Field of Classification Search
USPC .......... 29/852, 593, 832, 840; 439/66, 74, 81, 439/83, 591, 885
See application file for complete search history.

(56) References Cited

U.S. PATENT DOCUMENTS

| | | | |
|---|---|---|---|
| 1,668,011 A | 5/1928 | Friedmann |
| 2,382,771 A | 8/1945 | Bowers |
| 3,212,049 A | 10/1965 | Mittler et al. |
| 3,543,587 A | 12/1970 | Kawada |
| 3,634,807 A | 1/1972 | Grobe et al. |
| 3,670,409 A | 6/1972 | Reimer |
| 3,850,500 A | 11/1974 | Cobaugh et al. |
| 4,087,146 A | 5/1978 | Hudson, Jr. |
| 4,175,810 A | 11/1979 | Holt et al. |
| 4,257,417 A | 3/1981 | Gibilisco |
| 4,344,430 A | 8/1982 | Astrove |
| 4,548,451 A | 10/1985 | Benarr et al. |
| 4,592,617 A | 6/1986 | Seidler |
| 4,657,336 A | 4/1987 | Johnson et al. |

(Continued)

FOREIGN PATENT DOCUMENTS

| | | |
|---|---|---|
| EP | 0692823 A1 | 1/1996 |
| EP | 1005086 A2 | 5/2000 |

(Continued)

OTHER PUBLICATIONS

Kromann, Gary B., et al., "Motorola's PowerPC 603 and PowerPC 604 RISC Microprocessor: the C4/Cermanic-ball-grid Array Interconnect Technology", *Motorola Advanced Packaging Technology*, Motorola Inc.,(1996),1-10 Pgs.

(Continued)

*Primary Examiner* — Thiem Phan
(74) *Attorney, Agent, or Firm* — Kenneth A. Seaman

(57) ABSTRACT

A method for producing scalable, low cost, reliable, compliant, low profile, low insertion force, high-density, separable and reconnectable interposer for high speed, high performance electronic circuitry and semiconductors. The method can be used to make, for example, electrical connections from components such as a Printed Circuit Board (PCB) to another PCB, MPU, NPU, or other semiconductor device. A normalized working range for an array of elastic contacts of the interposer can be about 0.2 to 1.0. A reversible normalized working range is maintained through multiple connections and reconnections using a highly elastic material for the contact arms. In one aspect, a first electrical component having a first array pitch can be connected to a second electrical component having a second array pitch.

22 Claims, 46 Drawing Sheets

(56) References Cited

U.S. PATENT DOCUMENTS

| | | |
|---|---|---|
| 4,734,053 A | 3/1988 | Imai |
| 4,790,777 A | 12/1988 | Iimori et al. |
| 4,893,172 A | 1/1990 | Matsumoto et al. |
| 4,944,690 A | 7/1990 | Imai |
| 4,960,407 A | 10/1990 | Cope |
| 4,998,885 A | 3/1991 | Beaman |
| 5,010,641 A | 4/1991 | Sisler |
| 5,053,083 A | 10/1991 | Sinton |
| 5,135,403 A | 8/1992 | Rinaldi |
| 5,139,427 A | 8/1992 | Boyd et al. |
| 5,148,266 A | 9/1992 | Khandros et al. |
| 5,152,695 A | 10/1992 | Grabbe et al. |
| 5,161,983 A | 11/1992 | Ohno et al. |
| 5,173,055 A | 12/1992 | Grabbe |
| 5,199,879 A | 4/1993 | Kohn et al. |
| 5,228,861 A | 7/1993 | Grabbe |
| 5,257,950 A | 11/1993 | Lenker et al. |
| 5,292,558 A | 3/1994 | Heller et al. |
| 5,299,939 A | 4/1994 | Walker et al. |
| 5,316,496 A | 5/1994 | Imai |
| 5,338,209 A | 8/1994 | Brooks et al. |
| 5,358,411 A | 10/1994 | Mroczkowski et al. |
| 5,366,380 A | 11/1994 | Reymond |
| 5,373,964 A | 12/1994 | Moore |
| 5,380,210 A | 1/1995 | Grabbe et al. |
| 5,409,200 A | 4/1995 | Zingher et al. |
| 5,423,687 A | 6/1995 | Laub |
| 5,468,655 A | 11/1995 | Greer |
| 5,483,741 A | 1/1996 | Akram et al. |
| 5,509,814 A | 4/1996 | Mosquera |
| 5,528,456 A | 6/1996 | Takahashi |
| 5,529,504 A | 6/1996 | Greenstein et al. |
| 5,530,288 A | 6/1996 | Stone |
| 5,532,612 A | 7/1996 | Liang |
| 5,562,487 A | 10/1996 | Ii et al. |
| 5,575,662 A | 11/1996 | Yamamoto et al. |
| 5,583,378 A | 12/1996 | Marrs et al. |
| 5,590,460 A | 1/1997 | DiStefano et al. |
| 5,593,903 A | 1/1997 | Beckenbaugh et al. |
| 5,629,837 A | 5/1997 | Barabi et al. |
| 5,632,631 A | 5/1997 | Fjelstad et al. |
| 5,634,821 A | 6/1997 | Crane |
| 5,654,231 A | 8/1997 | Liang et al. |
| 5,691,913 A | 11/1997 | Tsuchida et al. |
| 5,751,556 A | 5/1998 | Butler et al. |
| 5,759,047 A | 6/1998 | Brodsky et al. |
| 5,772,451 A | 6/1998 | Dozier, II et al. |
| 5,791,911 A | 8/1998 | Fasano et al. |
| 5,802,699 A | 9/1998 | Fjelstad et al. |
| 5,812,378 A | 9/1998 | Fjelstad et al. |
| 5,842,273 A | 12/1998 | Schar |
| 5,860,585 A | 1/1999 | Rutledge et al. |
| 5,896,038 A | 4/1999 | Budnaitis et al. |
| 5,903,059 A | 5/1999 | Bertin et al. |
| 5,906,498 A | 5/1999 | Nagafuji |
| 5,911,597 A | 6/1999 | Oshitani |
| 5,934,914 A | 8/1999 | Fjelstad et al. |
| 5,938,453 A | 8/1999 | Ichimura |
| 5,956,575 A | 9/1999 | Bertin et al. |
| 5,967,797 A | 10/1999 | Maldonado |
| 5,967,850 A | 10/1999 | Crane |
| 5,980,335 A | 11/1999 | Barbieri et al. |
| 5,981,870 A | 11/1999 | Barcley et al. |
| 5,984,704 A | 11/1999 | Hashiguchi |
| 5,989,994 A | 11/1999 | Khoury et al. |
| 5,993,247 A | 11/1999 | Kidd |
| 6,000,280 A | 12/1999 | Miller et al. |
| 6,019,611 A | 2/2000 | McHugh et al. |
| 6,027,366 A | 2/2000 | Mori et al. |
| 6,029,344 A | 2/2000 | Khandros et al. |
| 6,031,282 A | 2/2000 | Jones et al. |
| 6,032,356 A | 3/2000 | Eldridge et al. |
| 6,042,387 A | 3/2000 | Jonaidi |
| 6,044,548 A | 4/2000 | Distefano et al. |
| 6,056,572 A | 5/2000 | Matsumoto et al. |
| 6,063,640 A | 5/2000 | Mizukoshi et al. |
| 6,072,323 A | 6/2000 | Hembree et al. |
| 6,083,837 A | 7/2000 | Millet |
| 6,084,312 A | 7/2000 | Lee |
| 6,089,904 A | 7/2000 | Wu |
| 6,133,534 A | 10/2000 | Fukutomi et al. |
| 6,142,789 A | 11/2000 | Nolan et al. |
| 6,146,151 A | 11/2000 | Li |
| 6,152,771 A | 11/2000 | Juntwait |
| 6,156,484 A | 12/2000 | Bassous et al. |
| 6,170,808 B1 | 1/2001 | Kutschi |
| 6,181,144 B1 | 1/2001 | Hembree et al. |
| 6,184,699 B1 | 2/2001 | Smith et al. |
| 6,191,368 B1 | 2/2001 | Di Stefano et al. |
| 6,196,852 B1 | 3/2001 | Neumann et al. |
| 6,200,143 B1 | 3/2001 | Haba et al. |
| 6,203,347 B1 | 3/2001 | Crane |
| 6,204,065 B1 | 3/2001 | Ochiai |
| 6,205,660 B1 | 3/2001 | Fjelstad et al. |
| 6,208,157 B1 | 3/2001 | Akram et al. |
| 6,218,848 B1 | 4/2001 | Hembree et al. |
| 6,220,869 B1 | 4/2001 | Grant et al. |
| 6,221,750 B1 | 4/2001 | Fjelstad |
| 6,224,392 B1 | 5/2001 | Fasano et al. |
| 6,250,933 B1 | 6/2001 | Khoury et al. |
| 6,255,727 B1 | 7/2001 | Khoury |
| 6,255,736 B1 | 7/2001 | Kaneko |
| 6,263,566 B1 | 7/2001 | Hembree et al. |
| 6,264,477 B1 | 7/2001 | Smith et al. |
| 6,293,806 B1 | 9/2001 | Yu |
| 6,293,808 B1 | 9/2001 | Ochiai |
| 6,297,164 B1 | 10/2001 | Khoury et al. |
| 6,298,552 B1 | 10/2001 | Li |
| 6,300,782 B1 | 10/2001 | Hembree et al. |
| 6,306,752 B1 | 10/2001 | DiStefano et al. |
| 6,315,616 B1 | 11/2001 | Hayashi |
| 6,332,801 B1 | 12/2001 | Watanbe |
| 6,335,210 B1 | 1/2002 | Farooq et al. |
| 6,336,269 B1 | 1/2002 | Eldridge et al. |
| 6,337,575 B1 | 1/2002 | Akram |
| 6,345,987 B1 | 2/2002 | Mori et al. |
| 6,352,436 B1 | 3/2002 | Howard |
| 6,361,328 B1 | 3/2002 | Gosselin |
| 6,373,267 B1 | 4/2002 | Hiroi |
| 6,374,487 B1 | 4/2002 | Haba et al. |
| 6,375,474 B1 | 4/2002 | Harper, Jr. et al. |
| 6,384,475 B1 | 5/2002 | Beroz et al. |
| 6,386,905 B1 | 5/2002 | Ito |
| 6,392,524 B1 | 5/2002 | Biegelsen et al. |
| 6,392,534 B1 | 5/2002 | Flick |
| 6,397,460 B1 | 6/2002 | Hembree |
| 6,399,900 B1 | 6/2002 | Khoury et al. |
| 6,402,526 B1 | 6/2002 | Schreiber et al. |
| 6,409,521 B1 | 6/2002 | Rathburn |
| 6,420,661 B1 | 7/2002 | Di Stefano et al. |
| 6,420,789 B1 | 7/2002 | Tay et al. |
| 6,420,884 B1 | 7/2002 | Khoury et al. |
| 6,428,328 B2 | 8/2002 | Haba et al. |
| 6,431,881 B1 | 8/2002 | Engbring et al. |
| 6,436,802 B1 | 8/2002 | Khoury |
| 6,437,591 B1 | 8/2002 | Farnworth et al. |
| 6,442,039 B1 | 8/2002 | Schreiber |
| D463,550 S | 9/2002 | Sherman |
| 6,447,305 B1 | 9/2002 | Roberts |
| 6,452,407 B2 | 9/2002 | Khoury et al. |
| 6,454,573 B2 | 9/2002 | Hayashi et al. |
| 6,461,892 B2 | 10/2002 | Beroz |
| 6,465,748 B2 | 10/2002 | Yamanashi et al. |
| 6,472,890 B2 | 10/2002 | Khoury et al. |
| 6,474,997 B1 | 11/2002 | Ochiai |
| 6,492,251 B1 | 12/2002 | Haba et al. |
| 6,497,581 B2 | 12/2002 | Slocum et al. |
| 6,517,362 B2 | 2/2003 | Hirai et al. |
| 6,520,778 B1 | 2/2003 | Eldridge et al. |
| 6,524,115 B1 | 2/2003 | Gates et al. |
| 6,532,654 B2 | 3/2003 | Guerin et al. |
| 6,551,112 B1 | 4/2003 | Li et al. |
| 6,558,187 B2 | 5/2003 | Aoki |
| 6,576,485 B2 | 6/2003 | Zhou et al. |

(56) References Cited

U.S. PATENT DOCUMENTS

| | | | |
|---|---|---|---|
| 6,577,003 B1 | 6/2003 | Crane et al. |
| 6,580,031 B2 | 6/2003 | Chung |
| 6,604,950 B2 | 8/2003 | Maldonado et al. |
| 6,612,861 B2 | 9/2003 | Khoury et al. |
| 6,616,966 B2 | 9/2003 | Mathieu et al. |
| 6,622,380 B1 | 9/2003 | Grigg |
| 6,627,092 B2 | 9/2003 | Clements et al. |
| 6,640,432 B1 | 11/2003 | Mathieu et al. |
| 6,661,247 B2 | 12/2003 | Maruyama et al. |
| 6,663,399 B2 | 12/2003 | Ali et al. |
| 6,664,131 B2 | 12/2003 | Jackson |
| 6,669,489 B1 | 12/2003 | Dozier, II et al. |
| 6,671,947 B2 | 1/2004 | Bohr |
| 6,672,879 B2 | 1/2004 | Neidich et al. |
| 6,677,245 B2 | 1/2004 | Zhou et al. |
| 6,692,263 B2 | 2/2004 | Villain et al. |
| 6,692,265 B2 | 2/2004 | Kung et al. |
| 6,700,072 B2 | 3/2004 | Distefano et al. |
| 6,701,612 B2 | 3/2004 | Khandros et al. |
| 6,719,569 B2 | 4/2004 | Ochiai |
| 6,730,134 B2 | 5/2004 | Neidich |
| 6,733,326 B2 | 5/2004 | Lee |
| 6,736,664 B2 | 5/2004 | Ueda et al. |
| 6,736,665 B2 | 5/2004 | Zhou et al. |
| 6,749,459 B2 | 6/2004 | Urbaniak et al. |
| 6,750,136 B2 | 6/2004 | Zhou et al. |
| 6,750,551 B1 | 6/2004 | Frutschy et al. |
| 6,759,257 B2 | 7/2004 | McCormack et al. |
| 6,763,581 B2 | 7/2004 | Hirai et al. |
| 6,791,171 B2 | 9/2004 | Mok et al. |
| 6,814,584 B2 | 11/2004 | Zaderej |
| 6,814,587 B2 | 11/2004 | Ma |
| 6,815,961 B2 | 11/2004 | Mok et al. |
| 6,821,129 B2 | 11/2004 | Tsuchiya |
| 6,843,659 B2 | 1/2005 | Liao et al. |
| 6,847,101 B2 | 1/2005 | Fjelstad et al. |
| 6,848,173 B2 | 2/2005 | Fjelstad et al. |
| 6,848,929 B2 | 2/2005 | Ma |
| 6,853,210 B1 | 2/2005 | Farnworth et al. |
| 6,855,002 B2 | 2/2005 | Chiu |
| 6,857,880 B2 | 2/2005 | Ohtsuki et al. |
| 6,861,747 B2 | 3/2005 | Miyazaki et al. |
| 6,869,290 B2 | 3/2005 | Brown et al. |
| 6,869,307 B2 | 3/2005 | Endo |
| 6,881,070 B2 | 4/2005 | Chiang |
| 6,887,085 B2 | 5/2005 | Hirai |
| 6,898,580 B1 | 5/2005 | Curran et al. |
| 6,898,773 B1 | 5/2005 | Teig et al. |
| 6,902,425 B2 | 6/2005 | Huang |
| 6,916,181 B2 | 7/2005 | Brown et al. |
| 6,920,689 B2 | 7/2005 | Khandros et al. |
| 6,923,656 B2 | 8/2005 | Novotny et al. |
| 6,926,536 B2 | 8/2005 | Ochiai |
| 6,939,143 B2 | 9/2005 | Rathburn |
| 6,957,963 B2 | 10/2005 | Rathburn |
| 6,960,924 B2 | 11/2005 | Akram |
| 6,976,888 B2 | 12/2005 | Shirai et al. |
| 6,980,017 B1 | 12/2005 | Farnworth et al. |
| 6,995,557 B2 | 2/2006 | Goldfine et al. |
| 6,995,577 B2 | 2/2006 | Farnworth et al. |
| 7,001,208 B2 | 2/2006 | Huang |
| 7,002,362 B2 | 2/2006 | Farnworth et al. |
| 7,004,775 B1 | 2/2006 | Sakurai et al. |
| 7,009,413 B1 | 3/2006 | Alghouli |
| 7,021,941 B1 | 4/2006 | Chuang et al. |
| 7,021,970 B2 | 4/2006 | Ozai |
| 7,025,601 B2 | 4/2006 | Dittmann |
| D521,455 S | 5/2006 | Radza |
| D521,940 S | 5/2006 | Radza |
| 7,048,548 B2 | 5/2006 | Mathieu et al. |
| 7,053,482 B2 | 5/2006 | Cho |
| D522,461 S | 6/2006 | Radza |
| D522,972 S | 6/2006 | Long et al. |
| 7,056,131 B1 | 6/2006 | Williams |
| 7,063,560 B2 | 6/2006 | Asao |
| D524,756 S | 7/2006 | Radza |
| 7,070,419 B2 | 7/2006 | Brown et al. |
| 7,074,074 B2 | 7/2006 | Zhang et al. |
| 7,083,425 B2 | 8/2006 | Chong et al. |
| 7,086,869 B1 | 8/2006 | Dangler et al. |
| 7,090,503 B2 | 8/2006 | Dittmann |
| 7,097,496 B2 | 8/2006 | Zhang et al. |
| 7,112,089 B1 | 9/2006 | Liu et al. |
| 7,113,408 B2 | 9/2006 | Brown et al. |
| 7,114,961 B2 | 10/2006 | Williams |
| 7,140,883 B2 | 11/2006 | Khandros et al. |
| 7,156,706 B2 | 1/2007 | Brown et al. |
| 7,189,090 B2 | 3/2007 | Aizawa et al. |
| 7,210,942 B2 | 5/2007 | Uchida et al. |
| 7,238,044 B2 | 7/2007 | Uchida et al. |
| 7,244,125 B2 | 7/2007 | Brown et al. |
| 7,244,195 B1 | 7/2007 | Yamagishi et al. |
| 7,245,137 B2 | 7/2007 | Eldridge et al. |
| 7,252,540 B2 | 8/2007 | Tanaka |
| 7,261,569 B2 | 8/2007 | Uchida et al. |
| 7,261,595 B2 | 8/2007 | Shino |
| 7,263,771 B2 | 9/2007 | Ochiai |
| 7,285,015 B2 | 10/2007 | Helbok et al. |
| 7,347,698 B2 | 3/2008 | Dittmann |
| 7,354,276 B2 | 4/2008 | Dittmann |
| 7,357,644 B2 | 4/2008 | Dittmann |
| 7,371,073 B2 | 5/2008 | Williams |
| 7,383,632 B2 | 6/2008 | Dittmann |
| 7,597,561 B2 | 10/2009 | Radza et al. |
| 7,621,756 B2 | 11/2009 | Dittmann |
| 7,625,220 B2 | 12/2009 | Dittmann et al. |
| 7,628,617 B2 | 12/2009 | Brown et al. |
| 7,645,147 B2 | 1/2010 | Dittmann |
| 7,758,351 B2 | 7/2010 | Brown et al. |
| 7,891,988 B2 | 2/2011 | Dittmann et al. |
| 2001/0001080 A1 | 5/2001 | Eldridge et al. |
| 2001/0024890 A1 | 9/2001 | Maruyama et al. |
| 2002/0006744 A1 | 1/2002 | Tashiro |
| 2002/0008966 A1 | 1/2002 | Fjelstad et al. |
| 2002/0011859 A1 | 1/2002 | Smith et al. |
| 2002/0055282 A1 | 5/2002 | Eldridge et al. |
| 2002/0055289 A1 | 5/2002 | Murakami et al. |
| 2002/0058356 A1 | 5/2002 | Oya |
| 2002/0079120 A1 | 6/2002 | Eskildsen et al. |
| 2002/0117330 A1 | 8/2002 | Eldridge et al. |
| 2002/0129866 A1 | 9/2002 | Czebatul et al. |
| 2002/0129894 A1 | 9/2002 | Liu et al. |
| 2002/0133941 A1 | 9/2002 | Akram et al. |
| 2002/0146919 A1 | 10/2002 | Cohn |
| 2002/0178331 A1 | 11/2002 | Beardsley et al. |
| 2002/0179331 A1 | 12/2002 | Brodsky et al. |
| 2003/0000739 A1 | 1/2003 | Frutschy et al. |
| 2003/0003779 A1 | 1/2003 | Rathburn |
| 2003/0008548 A1 | 1/2003 | Ueda et al. |
| 2003/0013341 A1 | 1/2003 | Urbaniak et al. |
| 2003/0022503 A1 | 1/2003 | Clements et al. |
| 2003/0029907 A1 | 2/2003 | Neidich et al. |
| 2003/0035277 A1 | 2/2003 | Saputro et al. |
| 2003/0049951 A1 | 3/2003 | Eldridge et al. |
| 2003/0064635 A1 | 4/2003 | Ochiai |
| 2003/0089936 A1 | 5/2003 | McCormack et al. |
| 2003/0092293 A1 | 5/2003 | Ohtsuki et al. |
| 2003/0096512 A1 | 5/2003 | Cornell |
| 2003/0099097 A1 | 5/2003 | Mok et al. |
| 2003/0129866 A1 | 7/2003 | Romano et al. |
| 2003/0147197 A1 | 8/2003 | Uriu et al. |
| 2003/0194832 A1 | 10/2003 | Lopata et al. |
| 2004/0029411 A1 | 2/2004 | Rathburn |
| 2004/0033717 A1 | 2/2004 | Peng |
| 2004/0072456 A1 | 4/2004 | Dozier et al. |
| 2004/0072467 A1 | 4/2004 | Jordan et al. |
| 2004/0118603 A1 | 6/2004 | Chambers |
| 2004/0127073 A1 | 7/2004 | Ochiai |
| 2004/0229506 A1 | 11/2004 | Asao |
| 2005/0020125 A1 | 1/2005 | Huang |
| 2005/0042896 A1 | 2/2005 | Huang |
| 2005/0088193 A1 | 4/2005 | Haga |
| 2005/0099193 A1 | 5/2005 | Burgess |
| 2005/0142900 A1 | 6/2005 | Boggs et al. |

(56) References Cited

U.S. PATENT DOCUMENTS

| | | |
|---|---|---|
| 2005/0161797 A1 | 7/2005 | Miller |
| 2005/0164527 A1 | 7/2005 | Radza et al. |
| 2005/0167816 A1 | 8/2005 | Khandros et al. |
| 2005/0208788 A1 | 9/2005 | Dittmann |
| 2005/0287828 A1 | 12/2005 | Stone et al. |
| 2006/0028222 A1 | 2/2006 | Farnworth et al. |
| 2006/0113107 A1 | 6/2006 | Williams |
| 2006/0121756 A1 | 6/2006 | Kuo et al. |
| 2006/0128207 A1 | 6/2006 | Zhang et al. |
| 2006/0173425 A1 | 8/2006 | Meierhoefer |
| 2006/0189179 A1 | 8/2006 | Dittmann et al. |
| 2006/0228933 A1 | 10/2006 | Liu et al. |
| 2006/0276059 A1 | 12/2006 | Dittmann et al. |
| 2006/0281361 A1 | 12/2006 | Uchida et al. |
| 2007/0050738 A1 | 3/2007 | Dittmann |
| 2007/0054544 A1 | 3/2007 | Hirata |
| 2007/0054545 A1 | 3/2007 | Takahira |
| 2007/0105433 A1 | 5/2007 | Shioda et al. |
| 2007/0123074 A1 | 5/2007 | Nishimurs |
| 2007/0134949 A1 | 6/2007 | Dittmann |
| 2007/0141863 A1 | 6/2007 | Williams |
| 2007/0178751 A1 | 8/2007 | Yamamoto |
| 2007/0218710 A1 | 9/2007 | Brown et al. |
| 2007/0259539 A1 | 11/2007 | Brown et al. |
| 2007/0269997 A1 | 11/2007 | Eldridge et al. |
| 2007/0275572 A1 | 11/2007 | Williams et al. |
| 2007/0275579 A1 | 11/2007 | Si et al. |
| 2008/0045076 A1 | 2/2008 | Dittmann et al. |
| 2008/0050958 A1 | 2/2008 | Hashiguchi et al. |
| 2008/0076282 A1 | 3/2008 | Yamaji et al. |
| 2008/0134502 A1 | 6/2008 | Dittmann |
| 2009/0193654 A1 | 8/2009 | Dittmann |
| 2010/0055941 A1 | 3/2010 | Dittmann et al. |
| 2010/0075514 A1 | 3/2010 | Williams |
| 2010/0167561 A1 | 7/2010 | Brown et al. |

FOREIGN PATENT DOCUMENTS

| | | | |
|---|---|---|---|
| EP | 1280241 | A1 | 1/2003 |
| EP | 0692823 | B1 | 2/2003 |
| EP | 1005086 | B1 | 9/2003 |
| EP | 0839321 | B1 | 1/2006 |
| EP | 0839321 | B1 | 1/2006 |
| JP | 200011443 | | 3/1990 |
| JP | 2000-114433 | A | 4/2000 |
| JP | 2001-203435 | A | 7/2001 |
| JP | 2001203435 | A2 | 7/2001 |
| WO | 96/02068 | A1 | 1/1996 |
| WO | WO-9602068 | A1 | 1/1996 |
| WO | 97/43653 | A1 | 11/1997 |
| WO | 97/44859 | A1 | 11/1997 |
| WO | WO-9743653 | A1 | 11/1997 |
| WO | WO-9744859 | A1 | 11/1997 |
| WO | 02/13253 | A1 | 2/2002 |
| WO | WO-0213253 | A1 | 2/2002 |
| WO | 2004/112451 | A1 | 12/2004 |
| WO | 2005/034296 | A1 | 4/2005 |
| WO | 2005/036940 | A1 | 4/2005 |
| WO | WO-2005034296 | A1 | 4/2005 |
| WO | WO-2005036940 | A1 | 4/2005 |
| WO | 2005/067361 | A1 | 7/2005 |
| WO | WO-2005067361 | A1 | 7/2005 |
| WO | 2007/056169 | A2 | 5/2007 |
| WO | 2007/056169 | A3 | 10/2007 |
| WO | 2007/124113 | A2 | 11/2007 |
| WO | WO-2007/143115 | A3 | 12/2007 |
| WO | WO-2007143115 | A2 | 12/2007 |
| WO | 2008/131097 | A2 | 10/2008 |
| WO | 2008/131097 | A3 | 1/2009 |
| WO | 2007/124113 | A3 | 4/2009 |

OTHER PUBLICATIONS

Mahajan, Ravi et al., "Emerging Directions for packaging Technologies", *Intel Technology Journal*, V. 6, Issue 02, (May 16, 2002),62-75 Pgs.

Williams, John D., "Contact Grid Array System", *Patented Socketing System for the BGA/CSP Technology*, E-tec Interconnect Ltd.,(Jun. 2006),1-4 Pgs.

Guerin, Luc et al., "Spring Land Grid Array Development: An Integrated Demountable Solution", MicroNews Third Quarter 2001, pp. 22-24.

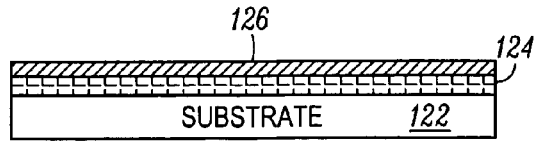
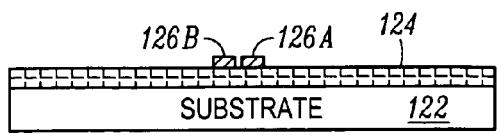
FIG. 15A          FIG. 15B
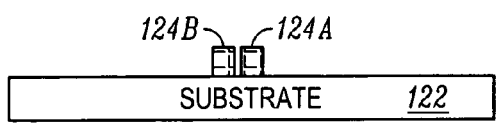
FIG. 15C          FIG. 15D
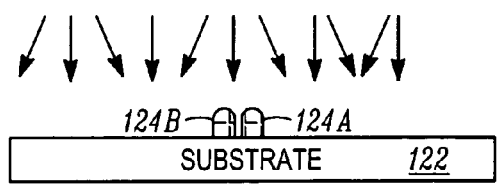
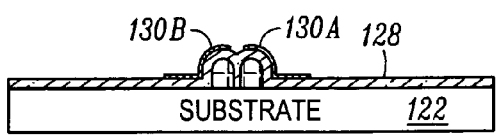
FIG. 15E          FIG. 15F
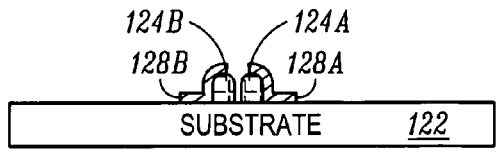
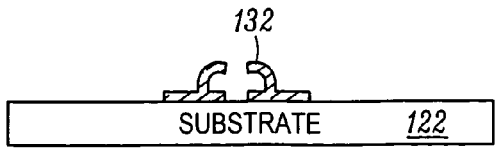
FIG. 15G          FIG. 15H

LOAD-DISPLACEMENT-RESISTANCE PLOT

LOAD-DISPLACEMENT PLOT

METHOD FOR FABRICATING A CONTACT GRID ARRAY

BACKGROUND

This application is a continuation-in-part of U.S. patent application Ser. No. 10/412,729, filed Apr. 11, 2003, now U.S. Pat. No. 7,056,131 and is a continuation in part of U.S. patent application Ser. No. 10/731,213 filed Dec. 8, 2003, now abandoned which are hereby incorporated by reference in their entirety.

FIELD OF THE INVENTION

This invention pertains to processes for making electrical contacts using manufacturing techniques that result in flexibility in design and performance of the contacts.

BACKGROUND OF THE INVENTION

The ability to make separable electrical contact with contacts of miniature electronic circuits has become more problematic as the mechanical, electrical, and reliability requirements of these electrical contacts become more demanding. Nano springs, pogo pins, micro springs, and other miniature contact devices have been developed to deal with the problem of making reliable electrical contact between a microcircuit and the rest of an electronic system. The problem for the industry, however, is that no particular contact design appears to provide all of the properties required, even where specially designed contact elements are used in specific applications. None of the existing contacts can meet all of the design criteria.

It is desirable to have separable electrical connections in electronic applications because these connections are used in system assembly, device testing, and wafer probing.

DESCRIPTION OF THE DRAWINGS

FIGS. 15A to 15H are schematic drawings that illustrate the processing steps for forming a connector according to one aspect of the present invention.

Figure 1:
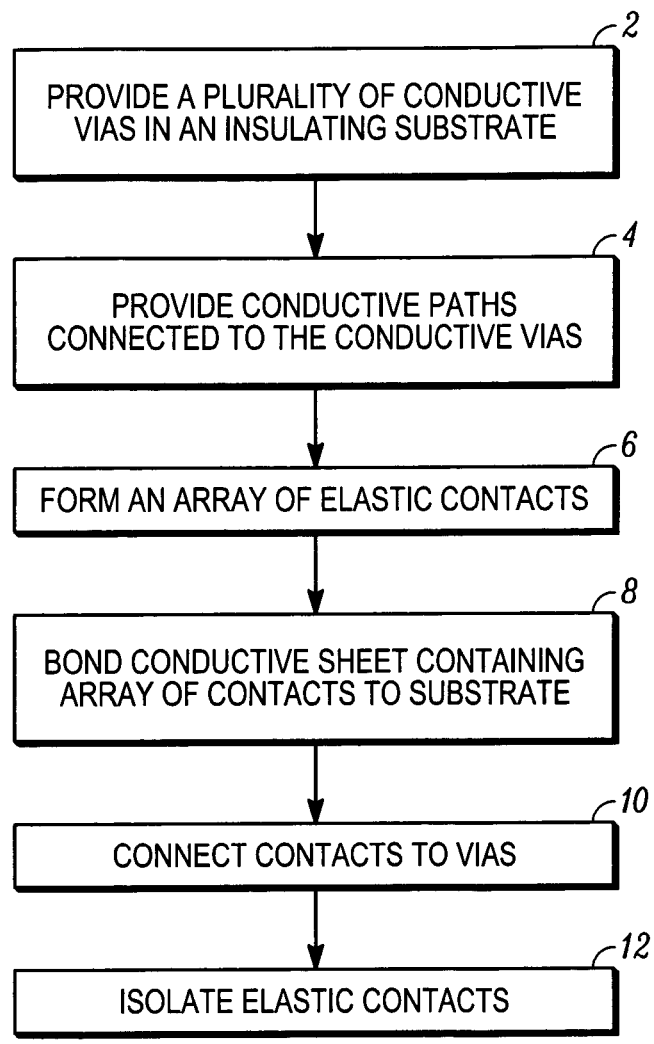
FIG. 1 is a flow chart that illustrates a method for forming an interposer, according to one aspect of this invention.

For purposes of brevity and clarity, like components and elements of the apparatus of this invention will bear the same designations or numbering throughout the figures.

DETAILED DESCRIPTION

Aspects of the present invention are related to methods for fabricating electrical connectors by lithographic patterning of metallic layers to form an array or arrays of contact elements. The metallic layers can be applied to a connector substrate before patterning to form the contact elements, or can be free standing layers that are subjected to patterning before joining to the connector substrates. In general, the contacts can be formed from a single layer of metallic material, but can also be formed from multiple layers of the same material, or of different materials, in which one or more layers can be added to the contacts after a metallic layer is patterned to form a contact array. Connectors formed by these methods include substrates having a contact array disposed on a single side, or having contact arrays disposed on both sides, such as interposers.

Connector elements and interposer layers fabricated according to aspects of the present invention can be produced using one or more of the guidelines set forth below.

Choice of metal for the metallic contacts can be guided by the desired combination of properties for the contact. Examples include choice of material for a core region of the metallic contact to impart the desired elastic properties. Cu, Cu-alloys, and stainless steel are examples of metallic materials that may form a core region of a contact. For example, a stainless steel or Cu-alloy layer can be chosen as a core layer from which to form a contact, due to the strong mechanical elasticity; an intermediate Cu layer can chosen to coat the core layer because of the good conductivity of pure Cu; and an Au or Au-alloy layer can be chosen as an outer layer for low interface resistance and good corrosion resistance.

The choice of a dielectric (electrically insulating) or semiconducting material for the contact array substrate is guided by the particular application. Exemplary configurations of the present invention include connectors having FR4, polymer, ceramic, and semiconductor substrates.

Other configurations of the invention include connectors having multiple, redundant conductive contacts to improve electrical connection between components that are coupled using the connector.

Inclusion of extra structural features in contacts can be chosen to improve performance. In some configurations of the present invention, for example, elastic contacts having asperities are fabricated to improve electrical contact to an external electrical component. The asperities on a contact facilitate making good electrical contact by providing concentrated force to break through any passivation layers covering a conductive surface being engaged by the contact.

The choice of the mix of contact types used in a connector fabricated in accordance with the present invention is generally guided by the particular application. For example, it may be desirable to have the same type of elastic contacts on both sides of the interposer substrate to connect similar components on either side of the interposer. On the other hand, it may be desirable to use solder, conductive adhesive, or some other electrical contact method on one side of a double sided connector, and an elastic contact array on the other side of the connector.

The inclusion of additional features, such as metallic features, within a connector substrate is also guided by the particular application for the connector. For example, additional metal planes or circuits may be chosen for inclusion within the interior of the connector substrate in the case where good thermal dissipation is desired. Inclusion of additional metal planes or circuits within the connector may be guided by the need for electrical shielding, power delivery, addition of electronic components, or otherwise improving the electrical performance of the connector.

The discussion to immediately follow discloses methods for forming electrical connectors containing arrays of elastic contacts, in accordance with aspects of the present invention.

FIG. 1 generally illustrates a method for forming an interposer according to one aspect of this invention. In step 2, a plurality of conductive vias are provided within an insulating substrate. The insulating substrate can be, for example, a PCB-type material or a ceramic. The conductive vias can be formed by a number of methods including electroless plating of through holes formed in a substrate. In one example, the substrate is further provided with a copper cladding on one or both sides. Preferably, the copper cladding thickness is in the range of about 0.2-0.7 mils. The conductive vias can be formed, for example, by drilling the insulating substrate and subsequent plating of the vias.

In step 4, a plurality of (electrically) conductive paths that are coupled to respective vias are provided for the substrate. The term "provided for the substrate" indicates that the conductive paths are affixed to the substrate, either on an outer surface of the substrate or embedded within the substrate. In one configuration, the conductive paths are provided on at least one surface of the insulating substrate. The conductive paths are arranged so that one end of the conductive path electrically connects to a conductive via. In one variant of the invention, steps 2 and 4 are performed in a single step. For example, plated through holes can be formed in which a conductive layer extends onto a surface of the substrate, such that the portion extending on a surface of the substrate constitutes a conductive path that maintains electrical contact with the conductive via. In the case where a substrate is provided with a surface copper (or other metal) cladding, the plating of the vias in step 2 can serve to connect conductive vertical via walls with the copper cladding that lies on the surface of the substrate and surrounds the via. Subsequently, for example, the surface copper cladding is etched into conductive capture pads that surround the via.

On the other hand, the conductive paths can consist of elaborate circuit patterns each of whose conductive lines connect to a respective via and extend along a surface of the substrate or are embedded within the substrate. The circuit patterns can be formed and embedded within a substrate below the substrate surface in step 2. For example, embedded conductive lines can each be formed that contact a via within the substrate. Provisions can be made so that the end of the embedded conductive line opposite the via can be further contacted through a conductive material contained in a second via that extends to a substrate surface. The second via can subsequently be connected to a conductive elastic contact providing an electrical connection from the first conductive via to the elastic contact.

In another variation, a circuit pattern having lines that extend to the conductive vias can be formed within the copper (metal) cladding. The ends of the lines opposite to those connected to vias can be connected to respective elastic contacts in subsequent processing steps.

In step 6, an array of elastic contacts is formed. Preferably, the array of elastic contacts is formed within an electrically conducting sheet. Examples of such electrically conductive sheets include copper alloys, such as BeCu. The sheet thickness is configured to impart the desired elastic behavior to contact arms formed from the conductive sheet. For example, for contact arms having a length in the range of 5-50 mils, the sheet thickness is preferably in the range of about 1-3 mils. The formation of an array of elastic contacts (described further below) generally includes the substeps of patterning a planar conductive sheet; selectively etching the patterned sheet to form two dimensional contact structures; and forming the two dimensional contact structures into three dimensional contacts having elastic contact portions that extend above the plane of the contact sheet. Once formed, the array of elastic contacts comprises an array of semi-isolated features, such as array 202 illustrated in FIG. 2, and discussed further below. After formation, heat treatment of the contacts can be performed to adjust the mechanical properties of the elastic contacts.

In step 8, the conductive sheet containing the array of elastic contacts is bonded to the substrate. This step can be repeated to affix a separate conductive sheet with an array of elastic contacts on a second side of the insulating substrate. As described further below, the bonding step can involve, for example, preparation of the conductive sheet surface to be bonded, providing an adhesive layer between the conductive sheet and substrate, providing features in the substrate and/or conductive sheet to account for adhesive layer flow during bonding, and affixing the conductive sheet to the interposer substrate surface under heat and pressure.

During the bonding process, the positions of contacts within the conductive sheet can be registered so that they are aligned with respect to conductive vias to which the contacts are to be coupled. For example, each contact can be placed above a pre-existing conductive path that is connected to a via. Alternatively, during the bonding process, the positions of contacts within the conductive sheet need to be aligned with vias to which the contacts are to be coupled. After bonding, conductive paths between contacts and respective vias can be defined.

To aid in the bonding process, a lamination spacer is typically provided on an outer surface of the conductive spring sheet. The spacer typically is configured as a thin sheet having an array of holes that correspond to the positions of elastic contacts in the conductive sheet. The lamination spacer is placed such that the surface of the spacer contacts the surface of the spring sheet only in planar portions of the spring sheet, and the holes of the lamination spacer accommodate the elastic contacts, such that the contact arms remain untouched. The thickness of the lamination spacer typically is equal to or greater than the height at which the distal ends of the elastic contacts extend above the conductive sheet surface. In this manner, a planar press plate can be clamped against the outer surface of the lamination spacer without contacting the elastic contact arms, which do not protrude above the top surface of the lamination spacer.

In step 10, the elastic contacts are electrically connected to respective conductive vias. As described in more detail below with respect to FIGS. 3A and 3B, contacts formed in the conductive sheet can be connected to the vias by means of a plating process that fills gaps between the conductive sheet that contain the contacts and the conductive vias.

In step 12, the electrical contacts are electrically isolated from one another (singulated). In this step, unwanted portions of a conductive spring sheet are removed. In so doing, an array of electrical contacts can be formed on one or both sides of an interposer, where some (partially singulated) or all (completely singulated) of the contacts can be electrically isolated from other contacts while individual contacts remain electrically coupled to respective conductive vias. This step of singulation, as discussed further below, is accomplished according to lithographic patterning and etching of the conductive spring sheet. In one variation, also discussed below, the singulation step can also act to define conductive paths in the conductive sheet that connect elastic contacts to conductive vias.

Figure 3A:
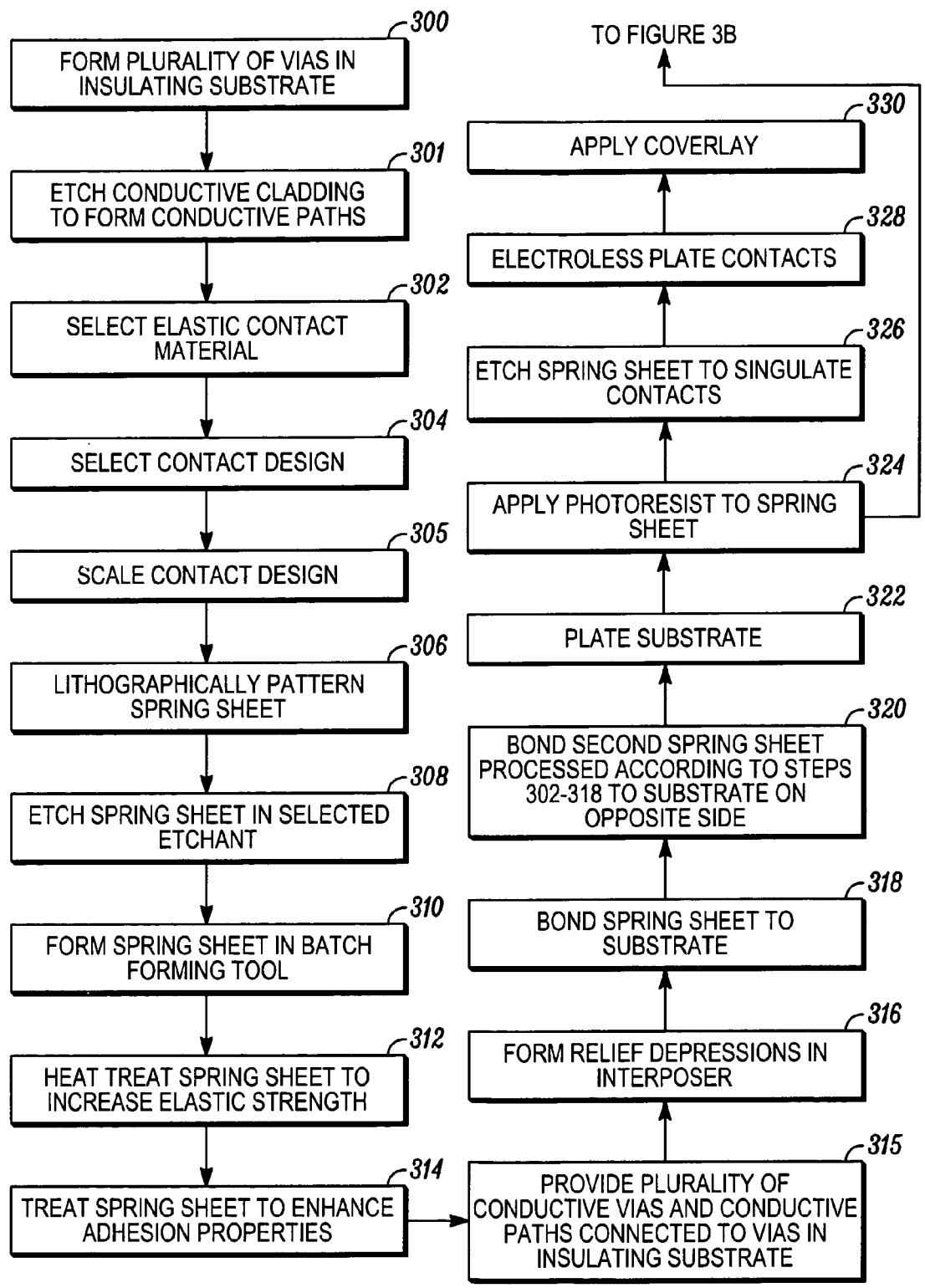
FIG. 3A is a flow chart that illustrates exemplary steps involved in a method for forming an interposer, according to one aspect of the present invention.
Figure 3B:
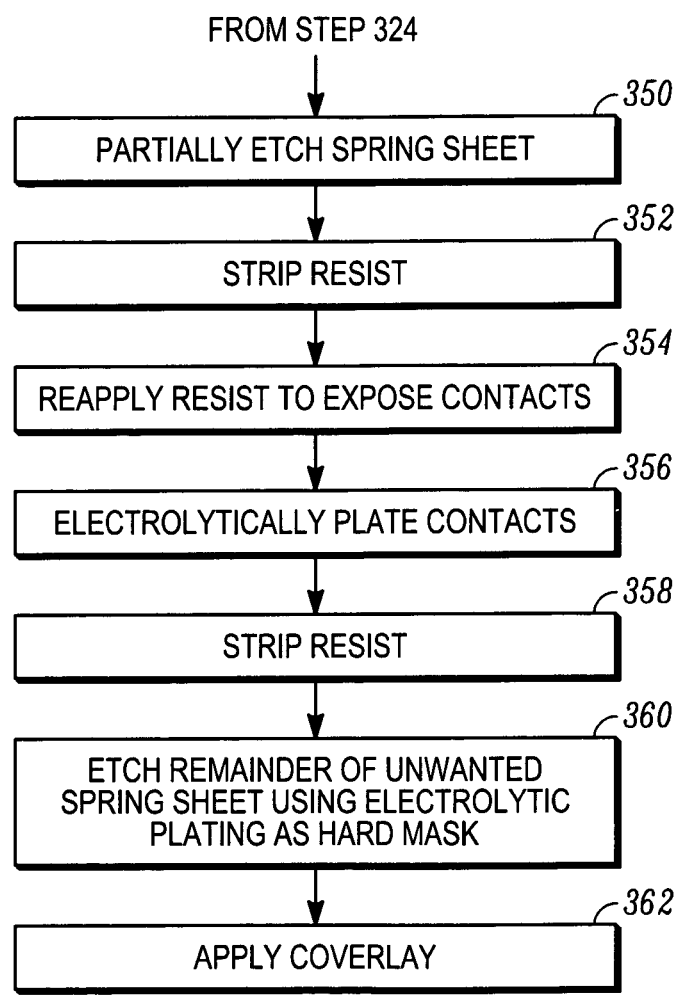
FIG. 3B is a flow chart that depicts exemplary steps involved in a method for forming an interposer, according to another aspect of the present invention.

The methods described below with respect to FIGS. 3A and 3B represent more detailed variations derived from the method of FIG. 1. These steps can be used to fabricate interposer contact structures such as those described in FIGS. 6A-12, 14A-24, and 27A-35 to follow.

FIG. 3A illustrates exemplary steps involved in a method for forming an interposer, according to one aspect of the present invention.

In step 300, a plurality of vias are formed in an insulating substrate. In one configuration of this invention, the insulating substrate is clad on top and bottom surfaces with a conductive cladding layer. In one example, the vias are patterned into a two dimensional array of vias according to a desired pattern. Preferably, the vias are drilled through the entire thickness of the insulating substrate such that a conductive path can be formed from one side of the substrate to the opposite side by plating the vias. Preferably, the vias are subject to at least a seed layer deposition in step 300. The seed layer forms the template for a thicker conductive coating that is subsequently formed by plating.

Figure 4A:
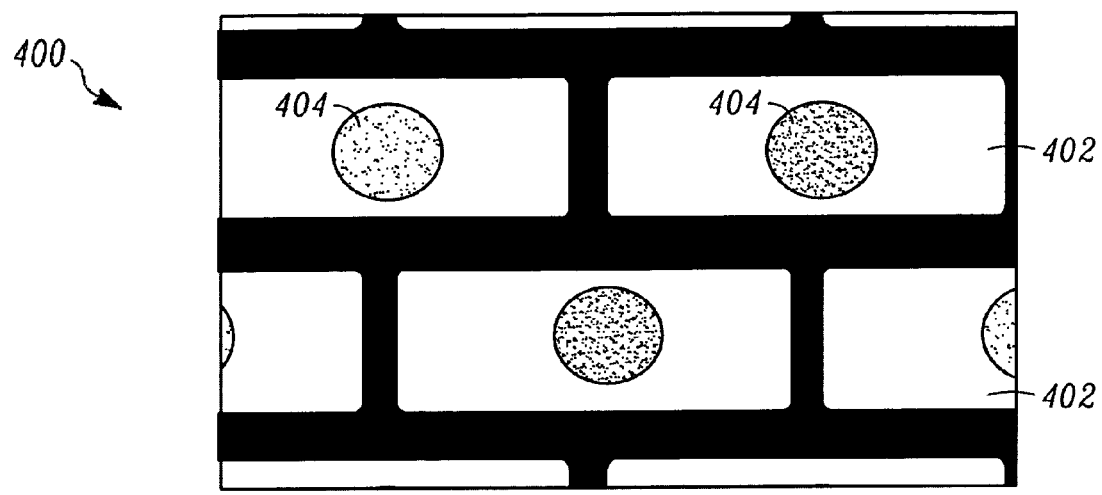
FIG. 4A is an image that illustrates a plan view of an array of capture pads disposed on a substrate, according to one configuration of this invention.

In step 301, if the interposer substrate is provided with a conductive cladding, the cladding can be etched to form isolated conductive regions, where one or more of the isolated conductive regions can form at least a portion of a conductive path to a respective elastic contact, wherein the conductive path serves to electrically connect the elastic contact to a respective conductive via. For example, the isolated conductive regions can be arranged as an array of conductive capture pads. FIG. 4A illustrates a plan view of an arrangement 400 of conductive capture pads 402, according to one configuration of the invention. The conductive capture pads are arranged in a two dimensional array and each include an inner circular region 404 in which the conductive material comprising the pad is removed. The spacing and size of circular portions 404 can be designed to align over an array of conductive vias provided in the substrate, such that the capture pads do not cover the vias. Subsequently, the interposer substrate provided with capture pads can be prepared using a combination of an alkaline clean and a micro etch that includes a dilute sulfuric acid solution. Elastic contacts can subsequently be placed on such capture pads, for example, by bonding a spring sheet containing the elastic contacts to the interposer substrate. The elastic contacts can be electrically connected to the pads, such that an electrical connection between the contact and conductive via is formed.

Figure 4B:
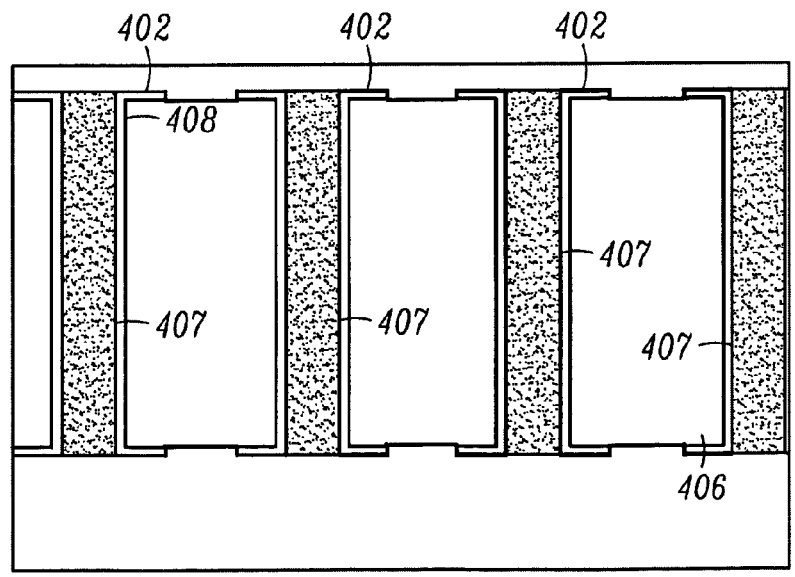
FIG. 4B is an image that illustrates a cross section of an exemplary substrate illustrating a series of conductive vias surrounded by capture pads, according to one configuration of this invention.

FIG. 4B shows a cross section of a substrate 406, arranged according to a configuration of this invention, illustrating a series of conductive vias 407 whose outer portions 408 are each surrounded by capture pads 402 at the surfaces of the substrate. The capture pads 402 are arranged so that a conductive contact structure placed on top of a pad can be conveniently electrically connected to a conductive via.

In step 302, an elastic contact material such as Be—Cu, Spring Steel, titanium copper, phosphor bronze or any other alloy with suitable mechanical properties is selected. The selected material is then provided in the form of a spring sheet to serve as a layer from which contact elements of the interposer are fabricated. The selection of material can be based on the desired application and may entail considerations of mechanical and electrical performance of contacts to be fabricated from the spring sheet, as well as process compatibilities, such as etch characteristics and formability of contacts.

Optionally, the spring sheets can be heat treated prior to subsequent processing or can be treated after subsequent formation of contact elements. In one example, an alloy of copper beryllium (Cu—Be) is chosen that comprises a supersaturated solution of Be. The supersaturated solution has relatively low strength and high ductility and can readily be deformed to form elastic contact elements, such as contact arms as described further below. Subsequent to formation of contact arms, the supersaturated alloy can be treated at a temperature such that precipitation of a second phase occurs, wherein dislocation are pinned and the multiphase material imparts a high strength to the resulting contact arms.

In step 304, a contact shape is designed. The design can comprise simply selecting a known design that can be stored for use within a design program, or can entail designing contacts using CAD tools such as Gerber art work. The design can be loaded into a tool used to pattern a spring sheet to be etched to form elastic contacts. The design can be used, for example, as a mask design, to fabricate a lithography mask used to pattern a resist layer on the spring sheet with the contact design. Because the shape of contacts can be readily altered using design tools such as Gerber, modification of contact design can be quickly accomplished as needed.

In one variation, the contact shape design step includes the use of modeling of contact behavior. For example, an interposer designer may have certain performance criteria for a contact in mind, such as mechanical behavior. Modeling tools such as COSMOS®, produced by Structural Research and Analysis Corporation, and ANSYS,™ produced by ANSYS, Inc., can be used to model the behavior of a basic contact shape in three dimensions, aiding in selection of an overall design of contact shape and size. Once the desired contact shape and size is determined, this information can be stored as a mask design and subsequently used for patterning the spring sheet.

As part of the contact design process of step 304, the desired orientation of a contact shape with respect to a spring sheet used to form the contacts can be specified. The grain structure of metallic sheets is generally anisotropic. Contacts formed in specific alignments with respect to the grain orientation are more resilient as a spring. Consequently, contact alignment with respect to the grain orientation can be used to select the degree of resiliency desired. Accordingly, after establishing the relative grain anisotropy within a spring sheet to be used for forming contacts, the grain anisotropy can be used to select the alignment direction of longitudinal portions of an elastic contact arm design, in order to impart the desired resiliency to the contact.

Figure 5:
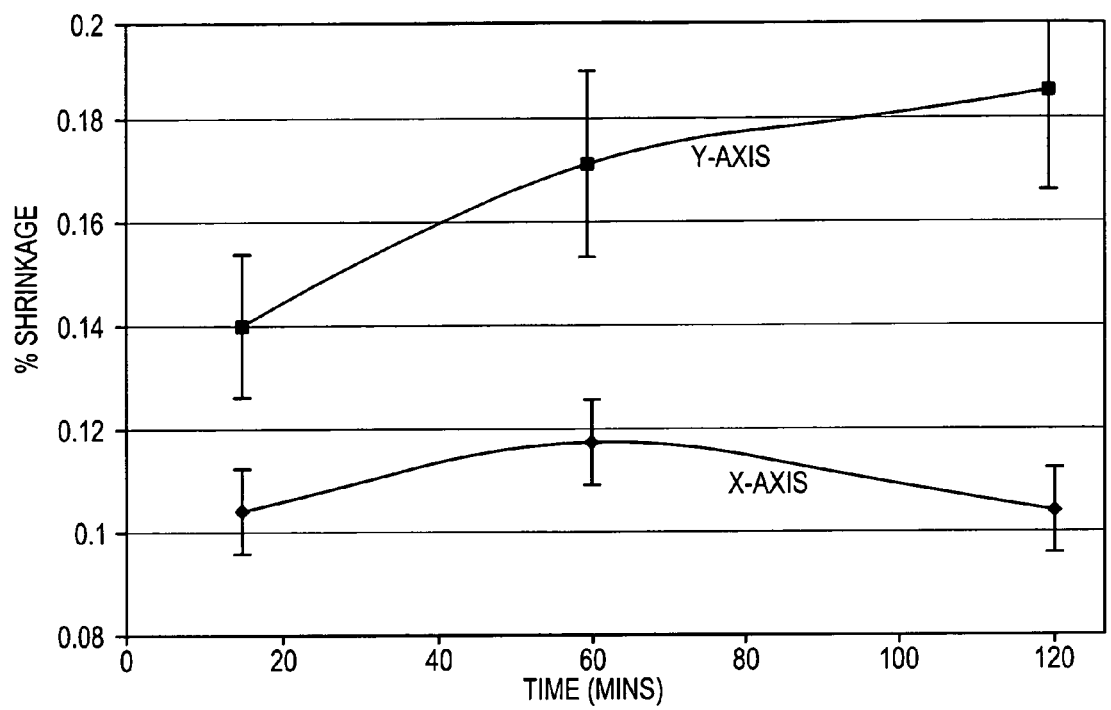
FIG. 5 is a graph that illustrates the shrinkage in a sheet of Be—Cu alloy after annealing at 600 F., in accordance with exemplary processing steps of FIG. 3A.

In step 305, a contact design is scaled. The scaling of a design, such as a mask design, first entails determining the desired final dimensions and shape of the two dimensional contact to be fabricated. Next, the desired final dimensions are scaled to produce a scaled two dimensional design having dimensions appropriately altered (typically enlarged) to account for processing effects taking place after two dimensional patterning that affect the final contact structure obtained. In one example, once a final desired contact structure is determined, a contact design that is to be used to produce the determined contact structure in an etched spring sheet is scaled to take into account shrinkage in the spring sheet after subsequent annealing that takes place during contact fabrication. FIG. 5 illustrates the shrinkage in a sheet of Be—Cu alloy after annealing at 600 F., which can be used to precipitation harden a contact after the contact is formed. While the shrinkage along the X-axis remains relatively constant at about 0.1%, the Y-axis shrinkage monotonically increases up to about 0.19% at 120 minutes annealing time. Accordingly, since the contact arms may be patterned and etched before an annealing process, a design pattern for contacts can be altered to take into account the absolute shrinkage that takes place and the relatively larger shrinkage along the Y-axis that would take place after the two dimensional contacts are patterned and heated.

In general, metallic sheet material provided for use as elastic contact source material is subject to a rolling process that introduces anisotropy in grain microstructure that is largest as between the rolling direction and the direction orthogonal to the rolling direction. This leads to anisotropic shrinkage after annealing in the case of an alloy material that undergoes grain boundary precipitation of a phase during annealing. Even in the absence of a sheet rolling process that introduces an anisotropic grain structure a sheet material with a uniform isotropic (within the plane of the sheet) microstructure that is subject to annealing that induces grain boundary precipitation will also experience shrinkage during the annealing. In the latter case, however, the shrinkage may be equal in the X- and Y-directions within the plane of the sheet.

Thus, either isotropic or anisotropic scaling of the reference mask design is preferable to produce a lithography mask whose dimensions are scaled to account for the shrinkage of the contacts during annealing. In the example of FIG. 5, the mask design can be scaled to increase the X-dimension by about 0.1% and the Y-dimension by about 0.2% above the desired contact size, for a contact to be annealed at about 120 minutes after the contact shape is patterned. Accordingly, after contact patterning (described further below), the initial oversize dimensions of the contact would shrink to the desired final dimensions after the annealing process.

Mask design scaling can be used to take into account additional effects besides the in-plane shrinkage experienced by a blanket spring sheet material. For example, pattern density of etched contacts within the spring sheet can affect the overall in-plane shrinkage. Accordingly, design scaling can be modified according to pattern density effects. In general, in a first sub-step of step 305, a two dimensional contact array design is fabricated in a spring sheet. In an experiment, the design can be fabricated in a series of spring sheets, where the sheet thickness and design density, among other things, is varied. Next, the patterned spring sheet is subject to an annealing condition or conditions to be used to harden the contacts. Subsequently, the shrinkage of the spring sheet in the X and Y-directions is measured empirically. In an experiment, the X-Y shrinkage can be determined as a function of material, sheet thickness, pattern density, pattern shape, and annealing conditions, among other parameters. These X- and Y-scaling factors are then stored in a matrix that can include the material type, thickness, annealing condition, contact design and contact density. For example, each entry in such a matrix can contain an X- and Y-shrinkage factor that can be applied to a reference design corresponding to the desired final contact shape. For each entry, the size and shape of the reference design is then altered using a scaling function based on the X- and Y-shrinkage factors, using a CAD or similar program, to produce a final mask design.

In step 306, lithographic patterning is applied to the spring sheet. This step typically comprises the substeps of applying a lithographically sensitive film ("photoresist" or "resist"), exposing the photoresist using the artwork selected in step 304, and developing the exposed resist to leave a patterned resist layer containing openings that lie above regions of the spring sheet to be etched. In one example, the resist is applied to both sides of the spring sheet, such that the spring sheet can be patterned and etched from both sides. In this case, matching two dimensional patterns are formed on both sides of the spring sheet so that the shape and size of the feature being etched at a given horizontal position on one side of the spring sheet matches the shape and size of the feature on the other side of the spring sheet at the same horizontal position. Dry film can be used as a resist for larger feature sizes of about 1-20 mil, and liquid resist can be used for feature sizes less than about 1 mil.

Figure 6A:
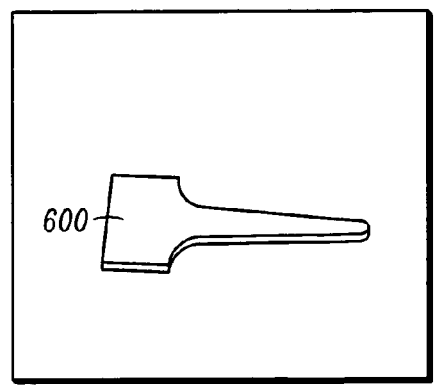
FIGS. 6A and 6B are schematic diagrams that illustrate a perspective view of exemplary two dimensional contact structures.
Figure 6B:
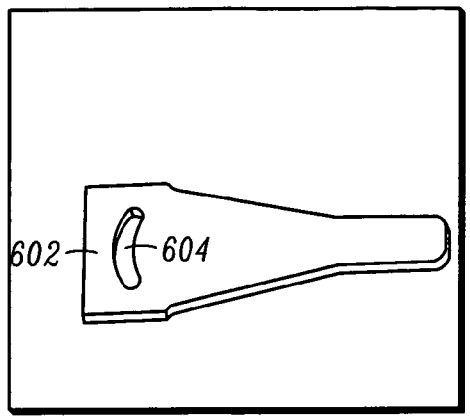

In step 308, the sheets are etched in a solution, for example, one that is specifically selected for the spring sheet material being used. Cupric or Ferric Chloride etchants are commonly used in the industry for etching copper alloy and spring steels. After etching, the protective layer of resist is removed from the spring sheet in a stripping process that leaves the etched features in the spring sheet. The etched features can comprise, for example, an array of contact features that contain two dimensional arms that lie within the plane of the spring sheet. FIGS. 6A and 6B illustrate a perspective view of exemplary two dimensional contact structures (contact features) 600 and 602, respectively. It is to be noted that the two dimensional features are shown as isolated features for the purposes of clarity. However, at step 308, portions of such contact features are actually integrally connected to a spring sheet, at least in portions. Contact structure 602 includes aperture 604, which is configured to act as an adhesive flow restrictor, as described below with respect to steps 316-320.

In step 310, a spring sheet is placed onto a batch forming tool that is configured to form the contact features into three dimensional features. The batch forming tool can be designed based on the original artwork used to define the two dimensional contact array features. For example, the batch forming tool can be a die having three dimensional features whose shape, size, and spacing are designed to match the two dimensional contact array and impart a third dimension into the contact features.

In one variation, a male and female component of the batch forming tool is fabricated by stacking together laminated slices, for example, using stainless steel. Each slice can be patterned by etching a pattern (for example, with a laser) through the slice that matches the cross-sectional shape of a contact structure or array of contact structures, as the contacts would appear when viewed along the plane of the interposer. For example, the cross-sectional shape can be designed to match the contact array profile as viewed along an X-direction of an X-Y contact array. To define the full die structure, the pattern of each slice is varied to simulate the variation of the contact array profile in the X-direction as the Y-position is varied. After assembly, the slices would constitute a three dimensional die designed to accommodate the two dimensional spring sheet and compress the two dimensional contacts into a third dimension. After the spring sheet is placed in the batch forming tool, the tool acts to form the features ("flanges") in all three dimensions to produce desired contact elements. For example, by pressing the spring sheet within an appropriately designed die, the two dimensional contact arms can be plastically deformed such that they protrude above the plane of the spring sheet after removal from the die.

In order to properly match the batch forming tool to the scaled two dimensional contact pattern, the etched pattern is scaled to match the scaled two dimensional contact array structure along a first direction, such as the X-direction. Scaling of the die in the Y-direction (the direction orthogonal to the slices) can, but need not be, performed. Preferably, the X-direction in which the die dimensions are scaled represents the direction having the larger scaling factor. In some cases, the die can be designed with enough tolerance so that strict scaling in the Y-direction is not needed.

Figure 6C:
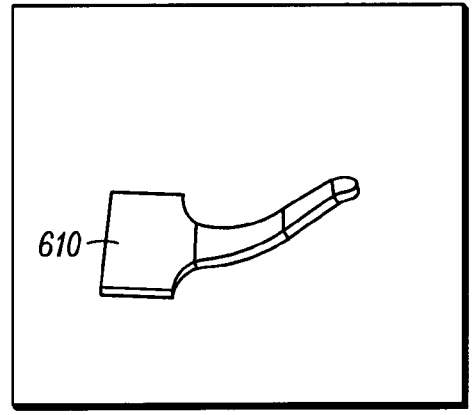
FIGS. 6C and 6D are schematic diagrams that illustrate a perspective view of exemplary three dimensional formed contact structures based on the two dimensional precursor structures of 6A, and 6B, respectively.
Figure 6D:
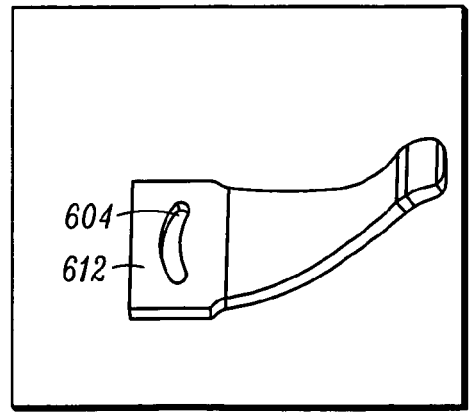

FIGS. 6C and 6D illustrate a perspective view of three dimensional formed contact structures 610 and 612, which are based on the two dimensional precursor structures of 6A and 6B, respectively. It is to be noted that the three dimensional contacts are shown as isolated features for the purposes of clarity. However, at step 310, portions of such contact features are actually integrally connected to a spring sheet, at least in portions, as illustrated in FIG. 2.

Figure 2:
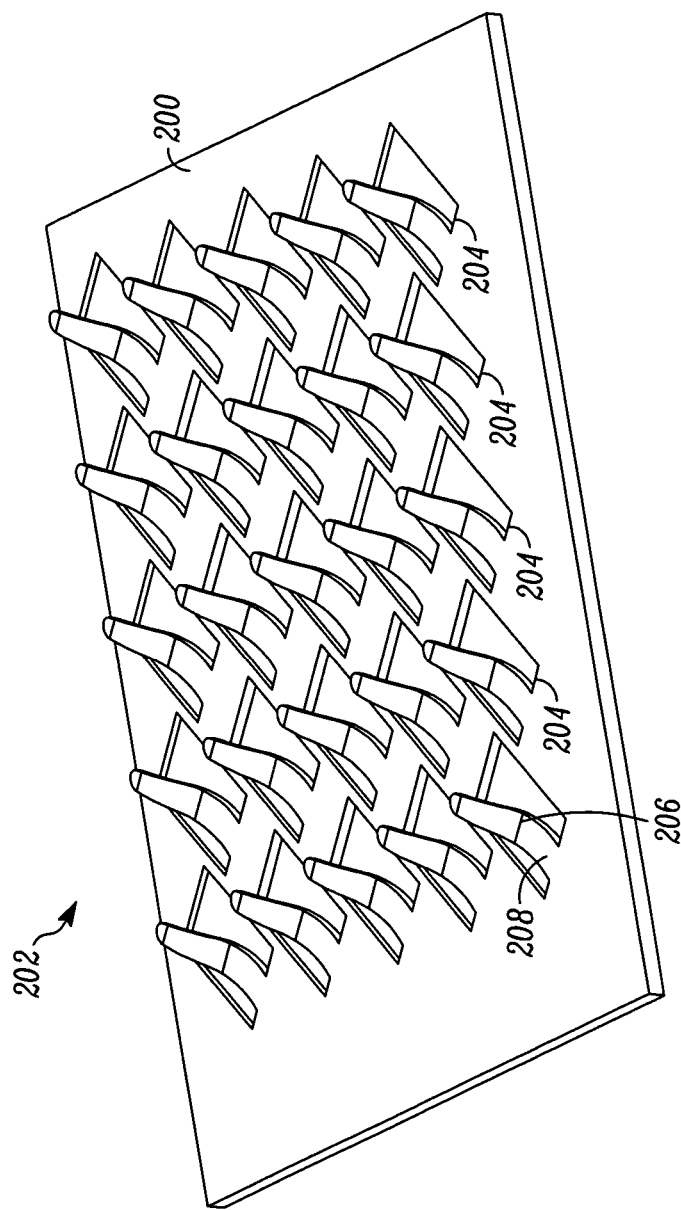
FIG. 2 is a schematic diagram that illustrates an exemplary conductive sheet having a pre-formed contact array, according to a configuration of the present invention.

FIG. 2 illustrates one example of a conductive sheet having an array of elastic contacts formed in three dimensions according to the steps outlined above. Conductive sheet 200 includes contact array 202 containing a plurality of three dimensional contacts 204, each having a base portion 208 and contact arm portions 206. At this stage of processing the contacts of array 202 are integrally connected to sheet 200 and are therefore not electrically isolated from each other. Base portions 208 are partially etched but sufficient material remains between the bases and the rest of the spring sheet to maintain the semi-isolated contacts and sheet as a unitary structure. In other configurations of the invention, no partial etch to define base portions is performed up to step 310.

In step 312, the conductive sheets can be heat treated to precipitation harden and enhance spring properties of the contacts. As mentioned above, this can impart higher strength, such as higher yield strength, and/or higher elastic modulus to the contact arms by, for example, precipitation hardening of a supersaturated alloy. Heat treatment can be performed in a non-oxidizing atmosphere, such as nitrogen, inert gas, or forming gas, to prevent oxidation of the conductive sheet.

In step 314, spring sheets having three-dimensionally formed contact elements are subjected to cleaning and surface preparation. For example, an alkaline clean can be performed, followed by a sulfuric oxide/hydrogen peroxide etch (micro-etch) to enhance adhesion properties of the spring sheet surface for subsequent lamination processing. The micro-etch can be used to roughen the surface, for example.

In step 315, the processes generally outlined in steps 2 and 4 of FIG. 1 are performed. An interposer substrate is provided with plated vias leading from one surface to the opposite surface of the substrate. Preferably, though not necessarily, a plurality of electrical conductive paths are provided that connect to respective conductive vias on one end and extend onto and over a portion of the surface of the substrate or within the substrate on the other end. For example, the plurality of electrical paths may simply comprise capture pads defined around conductive vias by etching a metal cladding layer of the substrate as described above. In other cases, the conductive paths can be surface or embedded traces arranged to provide connection to elastic contacts located at a distance from the conductive vias.

Figure 7A:
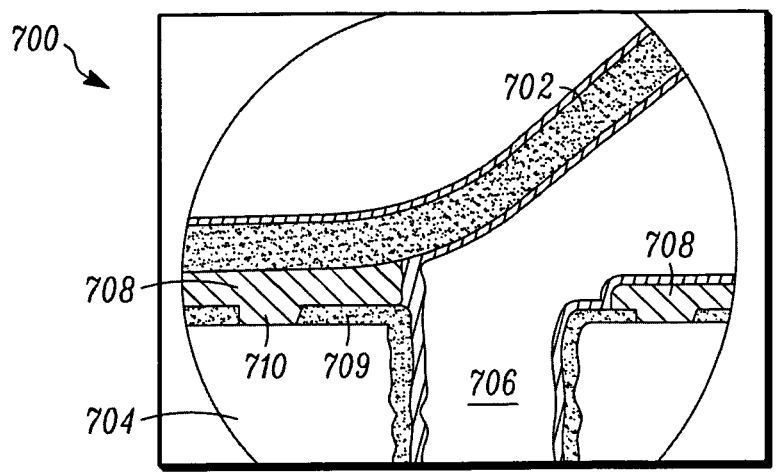
FIGS. 7A and 7B are images that illustrate an example of the effect of relief depressions on a contact structure according to the method of FIG. 3A.
Figure 7B:
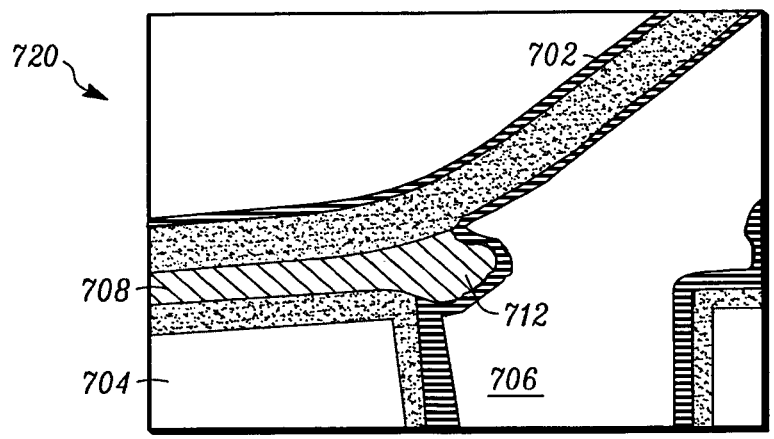

In step 316, flow restriction features are introduced into the substrate. These flow restriction features, discussed further below in relation to FIGS. 7A and 7B, provide reservoirs for adhesive layers used during bonding of the conductive spring sheet to the substrate. The reservoirs are located proximate to regions of the substrate that support the elastic contacts and serve to retain excess adhesive and reduce the flow of adhesive material under elastic contacts. Optionally, flow restrictors can be placed in the spring sheet material near contact arms in addition to or instead of in the substrate. This prevents undesirable alteration of mechanical properties of the elastic arms that can render them unsuitable for use. In one variant step 316 is performed during step 315.

In step 318, the spring sheet is bonded to a surface of a substrate. In one example, the substrate includes a low flow adhesion material that covers a dielectric core. When the spring sheet and substrate are joined together, an adhesive layer serves to bond the spring sheet and substrate. The substrate and spring sheet are pressed together under temperature and heat conditions that can be optimized for desired adhesion and flow based on the adhesion material. In one variant of the process, before placing the spring sheet and substrate together, the adhesive is placed on the bottom side of the spring sheet opposite to the side from which the elastic contacts protrude.

After bonding, the spatial relationship between the elastic contacts within the spring sheet and respective vias is fixed. For example, referring again to FIG. 2, array 202 can be arranged with respect to a substrate such that contacts 204 align with conductive vias in the substrate. In other words, array 202 can comprise an X-Y array of contacts whose spacing between contacts and number of contacts corresponds to a similarly spaced array of conductive vias having a similar number of vias as compared to the contacts. The relative direction of array of contacts 202 can be arranged so that each contact has the same relative position with respect to a corresponding via. For example, a 5×6 X-Y contact array of equally spaced contacts can be aligned on top of a 5×6 X-Y array of equally spaced conductive vias having the same spacing as the contacts, such that the X and Y directions of the contact array and conductive via array are the same.

Figure 7C:
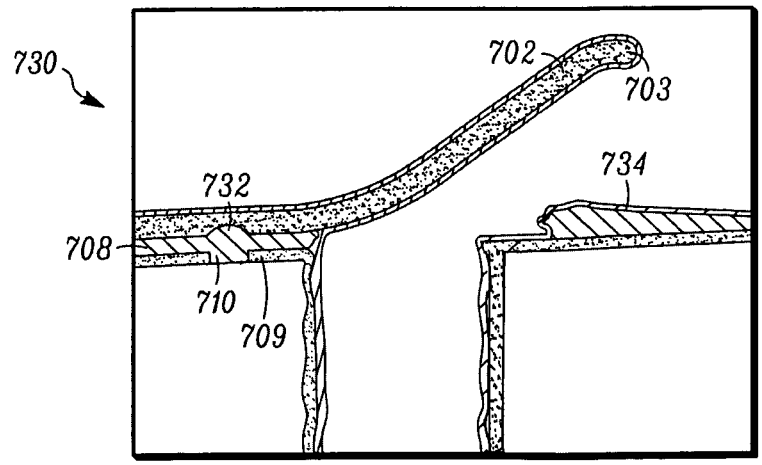
FIG. 7C is an image that illustrates another exemplary contact arrangement having a depression in the contact sheet containing the elastic arm.

After bonding, the adhesive layer is disposed between the spring sheet and substrate except in portions of the substrate such as vias. FIGS. 7A and 7B illustrate an example of the effect of the presence of flow restrictors on the interposer structure after step 318, in the region of an elastic contact, for the case where the contacts are placed adjacent to conductive vias. In this case, the adhesive flow restrictors (or "flow restrictors") are small through holes etched within a copper cladding layer on the substrate. The cladding layer shown can be a portion of a landing pad previously defined in step 315. In other cases, the flow restrictors can be partial depressions within the copper cladding layer or within the spring sheet, or through holes within the spring sheet. All such configurations serve to allow adhesive material to flow into initially empty space defined by the flow restrictor. In FIGS. 7A and 7B having contact structures 700 and 720, respectively, contact arms 702 are joined to substrates 704 having vias 706. The contact arms 702 are disposed over vias 706 and joined to substrate 704 using adhesion layer 708. The contact arms can be displaced downwardly during contact with an external component. In FIG. 7A, the presence of a through hole 710 in the copper cladding 709 on the substrate that acts as a flow restrictor results in no discernible flow of layer 708 into via 706. In contrast, in FIG. 7B, the absence of a relief structure (flow restrictor) results in appreciable flow of adhesion layer 712 material under the base of contact arm 702. FIG. 7C illustrates another contact arrangement 730 having a depression 732 in the contact sheet containing elastic arm 702. The depression acts as another adhesive flow restrictor in addition to hole 710. Again, no adhesive flow under the contact arm is observed.

Figure 7D:
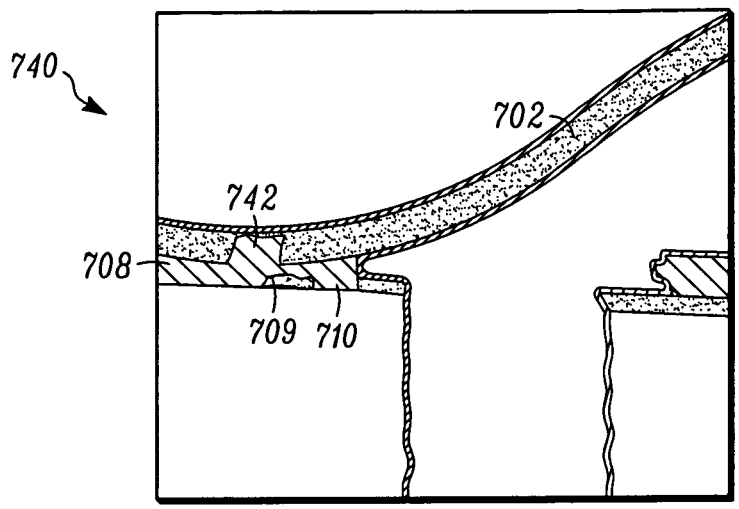
FIG. 7D is an image that illustrates an exemplary contact arrangement having a spring sheet through hole that is filled with extruded adhesive material from layer.

In one variant of the invention, in step 316, a through hole is formed in a spring sheet before bonding to a substrate, such that the through hole receives adhesive material that is extruded from the adhesive layer during bonding. Preferably, the spring sheet through hole is formed in step 308 when two dimensional contact features are etched, as illustrated, for example, by contact structure 602 of FIG. 6B. FIG. 7D illustrates contact arrangement 740 having spring sheet through hole 742 that is filled with extruded adhesive material from layer 708.

Figure 7E:
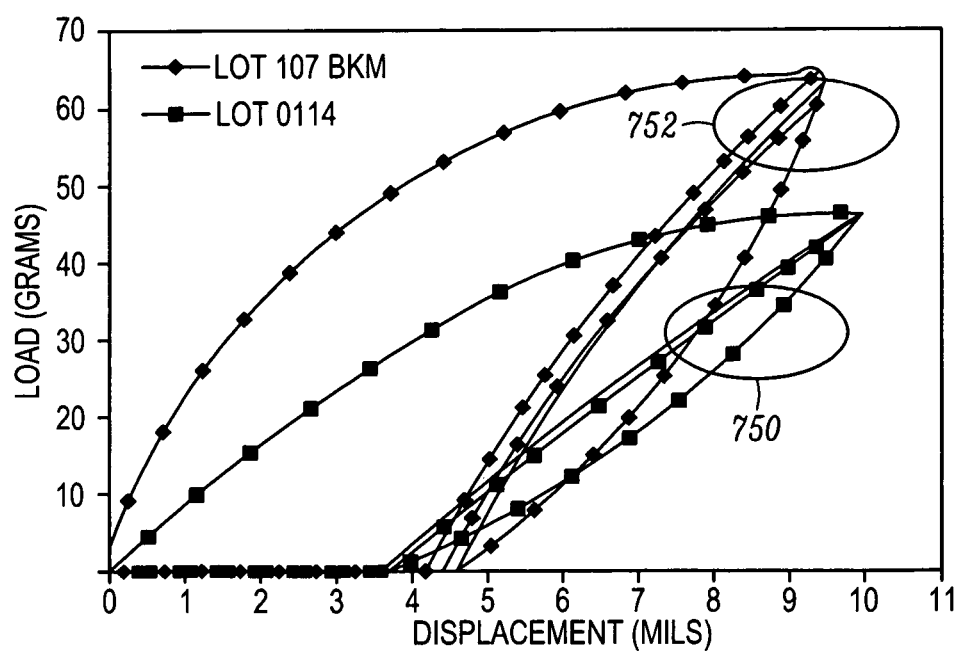
FIG. 7E is a graph that depicts load-displacement curves of exemplary contact arms in substrates with and without relief depressions, respectively.

As illustrated in FIG. 7E, which depicts load-displacement curves of contact arms in substrates with (750) and without (752) flow restrictors, the contacts not having restrictors are elastically much stiffer, requiring greater force to displace through a given distance.

In another variant of step 318, an adhesive layer and spring sheet through hole is tailored to produce an extruded bump that protrudes above the surface of the base of the spring sheet material. By proper arrangement of the position of the through hole, the extruded bump can be formed at least partially underneath a contact arm in a contact array formed from the spring sheet. For example, in an array of rolling beam contacts having the configuration illustrated in FIG. 7C, an extruded portion of layer 708 can be formed as a bump or region (see region 734) whose top surface is raised with respect to other portions of the substrate surface and whose raised surface lies underneath a distal end 703 of contact arm 702, such that the bump acts as a hard stop for contact arm 702 when it is displaced by contacting an external component.

In optional step 320, the process of step 318 is repeated for the substrate surface opposite of that used in step 318, resulting in a substrate having spring sheets that contain contact arrays joined to opposite sides of the substrate.

The contact array can be arranged so that each contact in the array is disposed on the interposer substrate near a respective conductive via to which it is electrically connected, or at some distance from the conductive via.

In other configurations of the present invention, during the bonding step of 318, the spring sheet may be joined to the interposer substrate such that the base of contacts are not located near vias. In this case, the array of contacts formed within the spring sheet may extend over portions of the substrate that do not contain vias. During the bonding steps 318 and 320, the array of contacts can be arranged with respect to substrate vias, so that contact arms of the contacts are located and extend in any desired direction with respect to vias to which the respective contact arms are to be electrically connected. Thus, because the contacts can be located remotely from vias, the contact arm design and length need not be constrained by the via size and via spacing. This facilitates the ability to increase the beam length of a contact arm and therefore the working range of the contacts, in comparison to contacts whose bases are formed around a via and whose distal ends are formed over vias, thereby limiting the contact arm length to the via diameter (see FIGS. 8A-C, discussed further below, for examples of the latter).

In step 322, the interposer substrate is subjected to a plating process. The plating process is used to plate desired portions of the substrate surface, which may include top and bottom surfaces, as well as vias (that may already be plated) that connect the top and bottom surfaces. This can serve to provide electrical connection, for example, between spring sheets disposed on opposite sides of the substrate, and therefore, contact elements on opposite sides of the substrate. Thus, vias extending from one substrate surface to the other surface become plated with a conductive layer that extends to the conductive sheet. After contacts residing on one or both surfaces of the substrate are subsequently singulated (electrically isolated by etching completely through the thickness the of spring sheet in a region surrounding each contact), the plated vias can serve as electrical connection paths between designated singulated contacts disposed on opposite surfaces of the substrate.

Preferably, in a preliminary sub-step before plating takes place, the interposer substrate is prepared for plating using a high pressure Al2O3 scrub process to remove debris and roughen surfaces to be plated.

The plating process can take place in two steps. In a first step, a relatively thinner electroless plating is performed. In one variant, the first step includes formation of a carbon seed layer. In the second step, an electrolytic plating process is performed. Step 322 can be used, for example, to form a continuous conductive layer that connects a conductive via to a spring sheet that is disposed on top of an adhesive layer separating the spring sheet from conductive layers coating the vias, which causes the contacts to be initially electrically isolated from the vias, as illustrated in FIG. 9.

Figure 9:
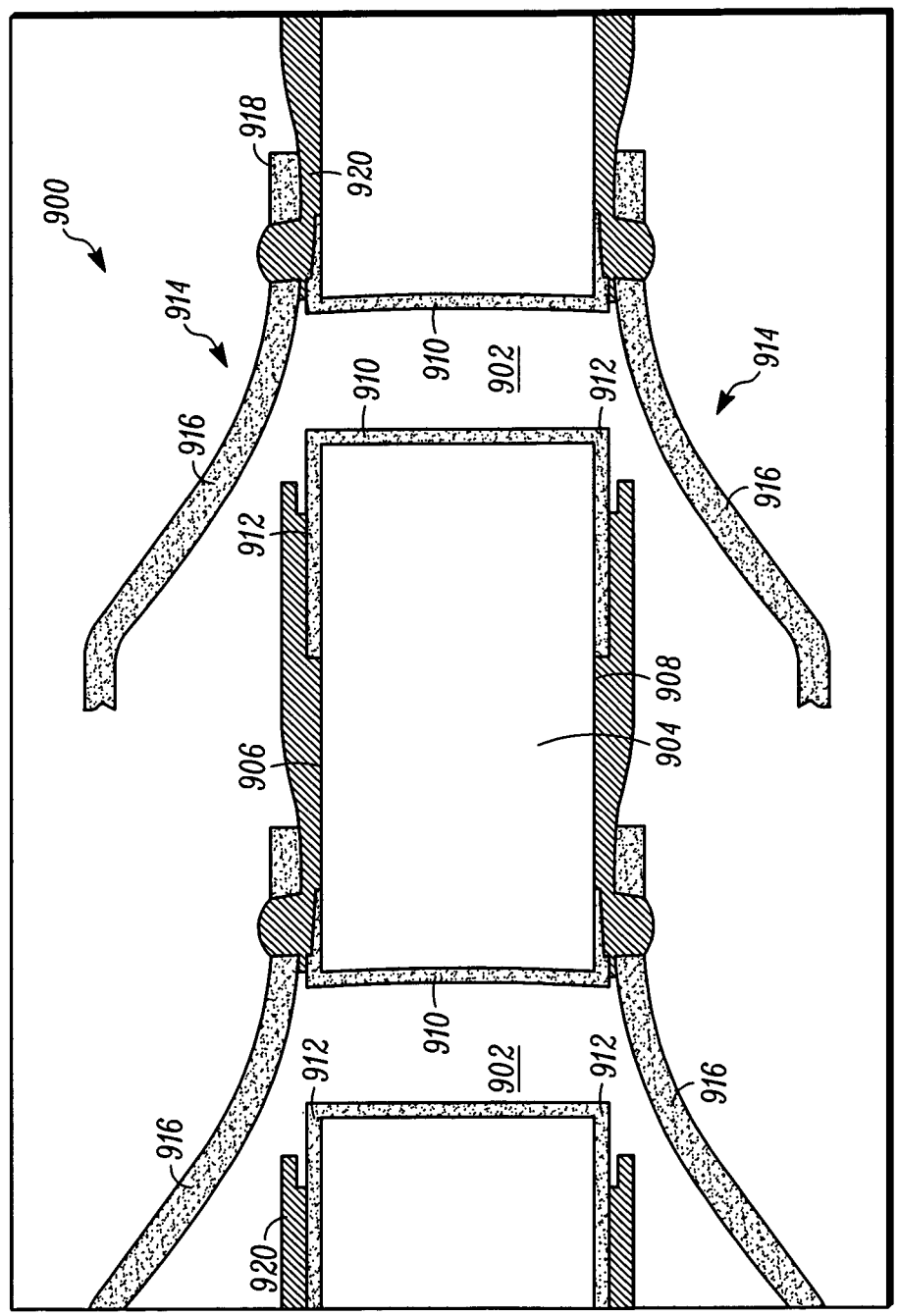
FIG. 9 is an image that illustrates a cross-sectional view of a portion of an interposer arranged according to another configuration of this invention.

FIG. 9 illustrates a cross-sectional view of a portion of an interposer 900, arranged according to one configuration of this invention. The arrangement of FIG. 9 corresponds to a stage of processing after step 320 and before step 322. In the portion of interposer 900 illustrated, two conductive vias 902 extend through substrate 904 from outer surface 906 to outer surface 908. The terms "outer surface" or "substrate surface," as used herein, refer to the substantially planar and relatively flat surfaces of the interposer, also referred to as top or bottom surfaces. It will be apparent that interposer 900 can include dozens, hundreds, or thousands of conductive vias 902, which can be arranged in a two dimensional X-Y pattern, for example. Vias 902 can be, for example, cylindrical in shape. Vias 902 can be regularly spaced, but need not be so spaced. For any X-Y array of vias, the spacing in the X-direction can differ from the spacing in the Y-direction.

Conductive vias 902 include a conductive layer 910 disposed on the vertical surface of the vias. In the exemplary interposer shown, the conductive layer 910, together with surface conductive paths 912, form a continuous metallic layer that extends from substrate surface 906 to substrate surface 908.

Surface conductive paths 912 may comprise a metal cladding material and are electrically connected to via conductive layers 910. Interposer 900 also includes elastic contacts 914 formed from a conductive sheet not visible in the figure. In the configuration illustrated in FIG. 9, elastic contacts 914 are formed on both sides (top and bottom surfaces) of substrate 904. However, in other configurations, contacts 914 may be formed on a single side of substrate 904. Elastic contacts 914 include contact arm portions 916 and base portions 918, which can be formed according to methods described above, and further described in discussion to follow. Contact arms 916 are electrically coupled to base portions 918, although not in the plane of the cross-section illustrated. Although the contact arms 916 are located directly above surface conductive paths 912, the base portion 918 of the contacts is clearly electrically isolated from the conductive paths 912 by adhesive layer 920. Accordingly, the plating process applied in step 322 is used to form a conductive layer that bridges the gap between layers 910, 912 and contacts 914. In so doing, a continuous path can be formed between pairs of contacts 914 disposed on opposite sides of the substrate.

Figure 10:
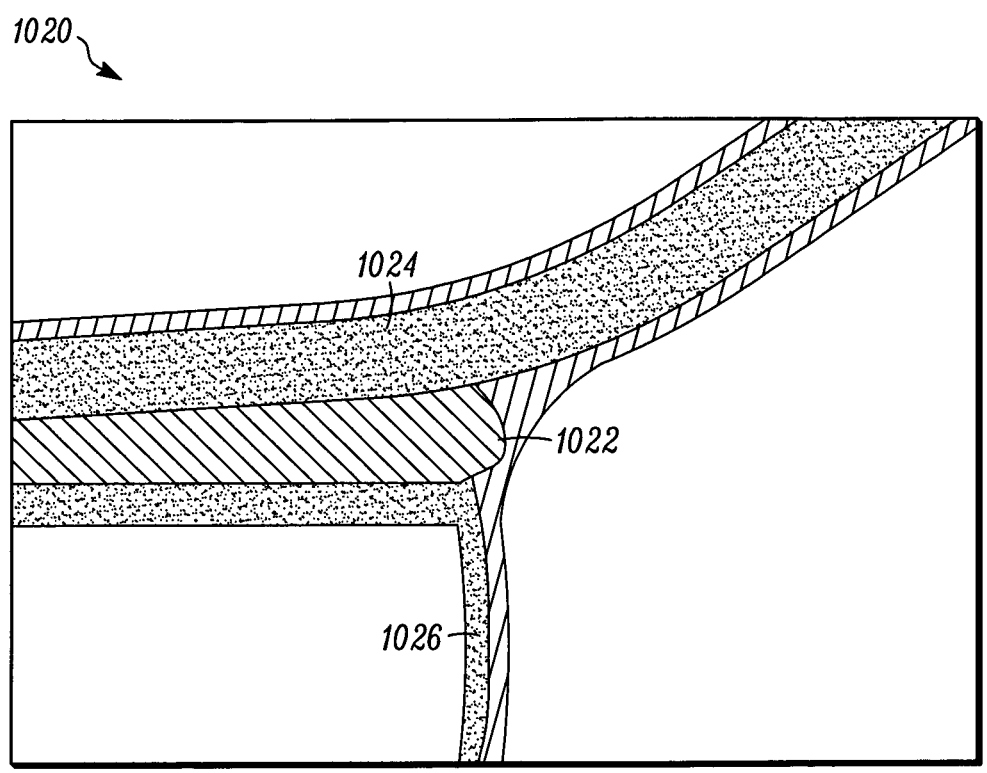
FIG. 10 is an image that illustrates a contact structure after formation of a conductive path between a contact and conductive via, according to one aspect of this invention.

FIG. 10 illustrates a contact structure 1020 after formation of a conductive path 1022 between a contact 1024 and conductive via 1026, according to one aspect of this invention.

In step 324, a photoresist material is applied to the substrate containing the spring sheet(s) and the resist layer is patterned to define individual contact elements within a spring sheet. In other words, the resist layer is patterned such that desired portions of the spring sheet between contact arms are unprotected by resist, while the contact arms and nearby portions are protected by the resist after development. In the case of a substrate with spring sheets applied on both surfaces, this step is performed for both substrate sides.

In step 326, an etch is performed that completely removes exposed portions of the spring sheet(s), such that individual contacts within a spring sheet become electrically isolated from each other (singulated). The contacts remain affixed to the substrate by a base portion defined in the singulation patterning process, such that the base portion (as well as contact arm(s)) is covered with resist during the etch. As described above, this process can also define conductive paths in the spring sheet material that lead from contacts to vias.

The singulated contacts are thus isolated from other contacts and from the spring sheet material, but can remain electrically connected to respective conductive vias through previous step 322.

If the singulated contacts are to be electrically connected to vias that do not lie underneath the contacts, the pattern of the exposed and developed resist layer can include remaining resist portions that define conductive paths from the contact base regions to the vias. For example, a patterned spring sheet can include holes having the approximate shape and size of vias and that are placed over vias when the spring sheet is bonded to a substrate. The spring sheet material would thus extend to the edge of the vias and can be connected to the conductive vias during step 322. During singulation of contacts contained within the spring sheet and located at a distance from the holes, the base portions can be isolated from other contacts by etching the spring sheet material immediately surrounding the portion of the spring sheet that is to constitute the contact base. However, a portion of the spring sheet can be protected during the singulation step that defines a path from the base portion to a conductive via, thus linking the base to the conductive via.

In a variant in which base portions of singulated contacts are to be connected to the ends of conductive paths formed on the surface of the interposer substrate underneath the adhesive layer, selected regions of the adhesive layer adjacent to the contact base can be removed to expose the conductive trace, and a subsequent plating process used to connect the trace to the base contact.

Figure 11:
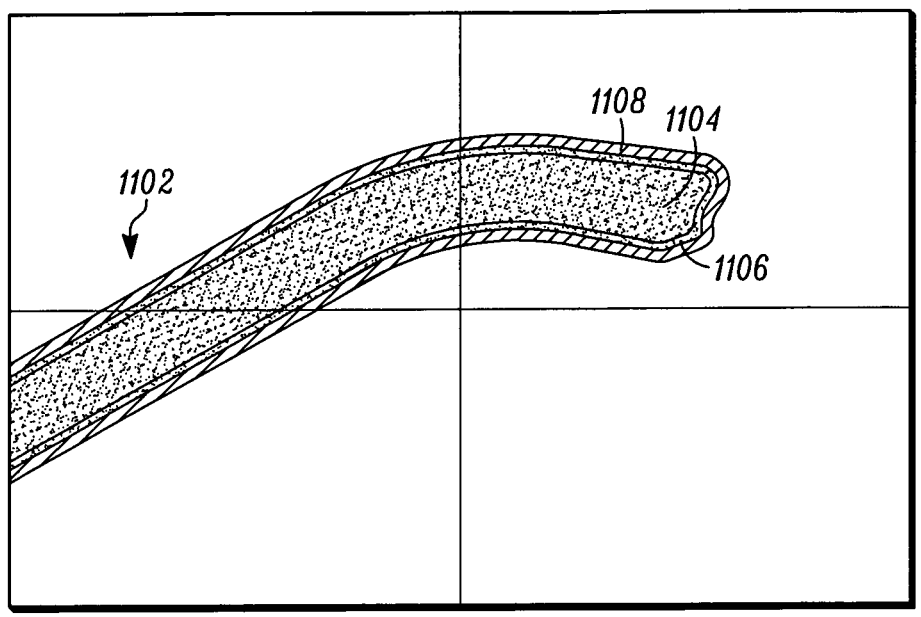
FIG. 11 is an image that illustrates a cross-sectional image of a contact arm, according to one configuration of the present invention.

After removal of resist, in step 328, an electroless plating process is performed to finish the contact elements. The electroless plating includes, for example, a Ni/Au stack (soft gold). The electroless plating is designed to add a coating layer to the contacts. Thus, in one configuration of the present invention, as illustrated in FIG. 11, the elastic contact arms 1102 contain an elastic core 1104, such as Be—Cu, typically 1-3 mils in thickness, which is coated in succession by plated Cu layer 1106 and Ni—Au layer 1108, having typical thicknesses in the range of 0.3-0.5 mils and 0.05-0.15 mils, respectively. The plated Cu and Ni—Au layers are preferably of a thickness that does not substantially degrade the elastic properties of the contact arms.

Figure 12:
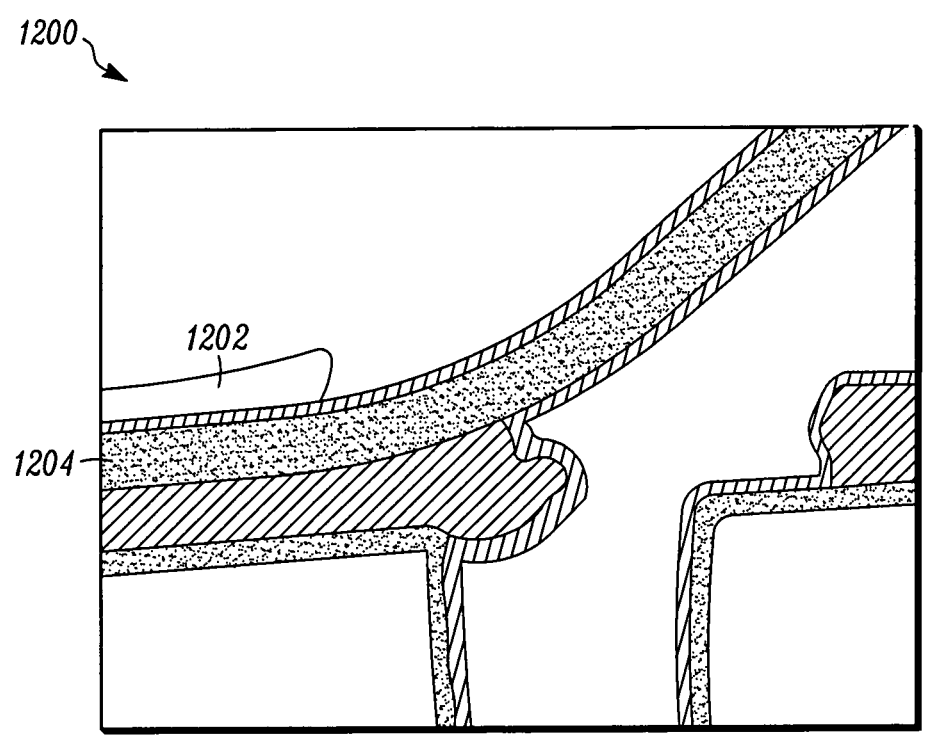
FIG. 12 is an image that illustrates an exemplary contact structure that includes a coverlay disposed on the contact.

In step 330, a coverlay is applied to the substrate having the array of isolated elastic contacts. The coverlay is a thin, semi-rigid material, for example, a bilayer material comprising an acrylic adhesive layer that faces and forms a bond to the substrate, and an upper layer, such as Kapton. The coverlay material is designed to encapsulate the contacts in regions adjacent to the contact arms. FIG. 12 illustrates a contact structure 1200 that includes coverlay 1202 on contact 1204.

The coverlay is preferably provided with holes that can be matched to the underlying substrate, such that the coverlay material does not extend substantially over contact arms of a contact or over vias provided in the substrate. The coverlay material can extend over the base portion of contacts up to the region where the elastic contact rises from the plane of the interposer substrate surface. By exact positioning of the end of the coverlay opening, the amount of counterforce from the coverlay layer acting on the contact arm can be modified such that the distal end of the contact arm is retained at a further distance above the substrate surface than without the coverlay present. The coverlay acts to provide a force to restrain the base of the contact when a force is applied to the contact arm, preventing rotation of the contact and separation from the substrate. This restraining force has the additional effect of retaining the distal end of the contact at a further distance above the surface of the substrate, which can increase the contact working distance on the order of 10% or so for contacts in the size range of about 40 mils.

As depicted in FIG. 3B, according to a different aspect of the present invention, exemplary steps involved are the same as those outlined in FIG. 3A up to and including step 324.

In step 350, a partial etch of the spring sheet is performed. The etch is performed such that a large portion of the spring sheet material is removed, wherein the contacts are nearly singulated. For example, the relative depth of the etched portions of the spring sheet can be 40-60% of the spring sheet thickness.

In step 352, the resist is stripped.

In step 354, resist is reapplied to the spring sheet(s) and the resist is patterned such that only the previously etched (exposed) portions of the substrate are masked after exposure and development.

In step 356, the substrate is exposed to an electrolytic plating process, such as a Cu/Ni/Au (hard gold) process. This serves to coat contact arms and portions of contacts near the contact arms that were exposed after resist development.

In step 358, the resist is removed to expose previous partially etched scribe lines.

In step 360, the interposer substrate is subjected to an etch, with the electrolytic Ni/Au that coats the contact arms and adjacent areas acting as a protective hard mask, such that the regions between contacts containing thin layers of spring sheet are completely removed, resulting in singulated contacts.

In step 362, a coverlay material is applied.

Figure 13:
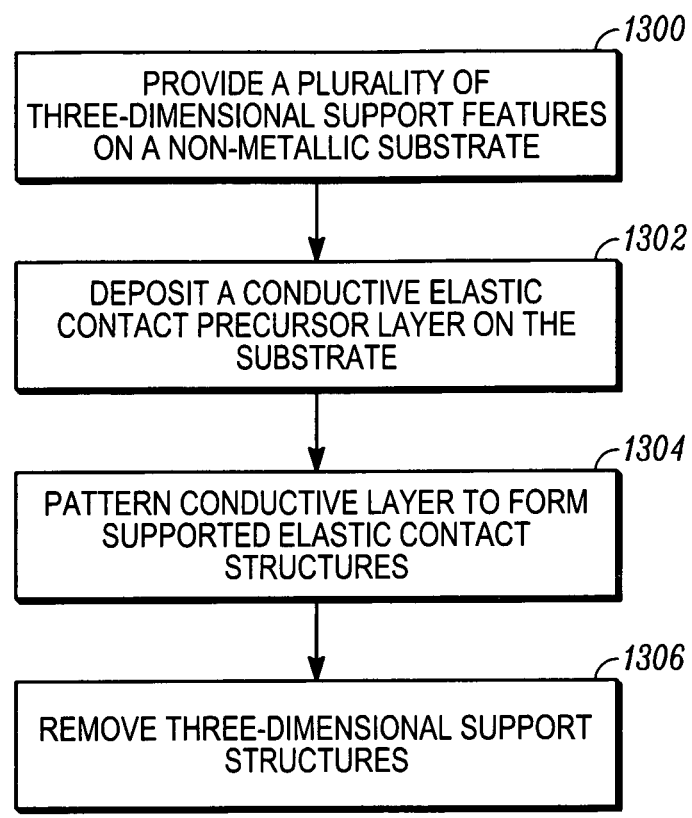
FIG. 13 is a schematic diagram that illustrates a method for forming an interposer, according to another aspect of this invention.

FIG. 13 illustrates exemplary steps involved in a method for forming an array connector, according to another aspect of this invention. The steps outlined in FIG. 13 are useful, for example, for fabricating single sided array connectors. The array connectors fabricated in accordance with the process of FIG. 13 can be formed on non-metallic substrates, such as a PCB board, a silicon wafer, or a ceramic substrate. The term "non-metallic substrates," as used herein, refers to substrates that are poor electrical conductors or electrical insulators, and can include semiconductor substrates as well as electrically insulating substrates.

The method that is outlined generally in FIG. 13, and disclosed in several variations with respect to FIGS. 14A-17H discussed below, facilitates fabrication of elastic contact arrays having contact size and pitch on the scale of microns or tens of microns, as opposed to the millimeter scale of present day connectors having elastic contacts. Advances in semiconductor technologies have led to shrinking dimensions within semiconductor integrated circuits and particularly, decreasing pitch for the contact points on a silicon die or a semiconductor package. The pitch, that is, the spacing between each electrical contact point (also referred to as a "lead") on a semiconductor device is decreasing dramatically in certain applications. For example, contact pads on a semiconductor wafer can have a pitch of 250 microns (10 mils) or less. At the 250-micron pitch level, it is very difficult and prohibitively expensive to use conventional techniques to make separable electrical connections to these semiconductor devices. The problem is becoming even more critical as the pitch of contact pads on a semiconductor device decreases below 50 microns and simultaneous connection to multiple contact pads in an array is required.

In step 1300, a non-conducting substrate is provided with a plurality of three dimensional support structures on a surface of the substrate. Details of an exemplary process used for forming the three dimensional support structures are disclosed in the discussion to follow with respect to FIGS. 14A-17H. In one example in which the substrate is a silicon wafer, the three dimensional support structures can be formed by depositing a blanket support layer, lithographically patterning the support layer, and selectively removing portions of the support layer. The remaining portions of the support layer form three dimensional support features that can be used to define the elastic contacts. Because semiconductor lithography processes using fine featured masks can be employed in the step of patterning the support layer, the three dimensional support features can have lateral dimensions on the order of microns or smaller. Accordingly, contact arms that are in part defined by the support features can be fabricated having dimensions similar to the support features.

However, the process of step 1302 can also be used in conjunction with PCB-type substrates provided, for example, with conductive vias. The scale of three dimensional support features arranged on a PCB-type substrate can be tailored toward the appropriate contact size to be used on the PCB substrate.

In step 1302, a conductive elastic contact precursor layer is deposited on the substrate provided with the support features. The term "conductive elastic contact precursor layer" refers to a metallic material that is generally formed as a layer on top of the substrate, and typically is at least partially conformal, such that a continuous layer is formed on flat parts of the substrate, as well as on the three dimensional support features. The term "precursor" is used to indicate that the metallic layer is a precursor to the final elastic contacts, in that the final elastic contacts are formed from the metallic layer. The mechanical properties of the metallic precursor layer are such that the desired elastic properties can be obtained once contact arms are formed. The metallic layer can be, for example, a Be—Cu alloy.

In step 1304, the metallic layer is patterned to form supported elastic contact structures. The term "supported elastic contact structures" refers to the fact that such structures have the general shape and size of the final elastic contacts of the contact array, but are not free-standing. In other words, at least portions of the contact arms are disposed on top of the support structures and are not free to move. The metallic layer patterning that forms the elastic contact support structures may also be used to singulate the contact structures. In this case, as in the case of singulation of spring sheets described above, individual contact structures are electrically isolated from other contact structures by removing at least portions of the metallic layer between the elastic contacts.

In step 1306, the support structures are selectively removed, leaving an array of three dimensional contacts having contact arms that extend above the substrate surface, and whose shape is in part defined by the removed three dimensional support structures.

Many variations of the above method are possible, as described below. For example, substrates can be provided with internal conductive paths that form circuits that connect to the elastic contacts on the substrate surface. Additional conductive layers can be provided on the substrate below the support layer that serve to extend base portions of the contacts.

According to another aspect of the present invention, a method for forming a connector having an array of contact elements includes providing a substrate, forming a support layer on the substrate, patterning the support layer to define an array of support elements, isotropically etching the array of support elements to form rounded corners on the top of each support element, forming a metal layer on the substrate and on the array of support elements, and patterning the metal layer to define an array of contact elements where each contact element includes a first metal portion on the substrate and a second metal portion extending from the first metal portion and partially across the top of a respective support element. The method further includes removing the array of support elements. The array of contact elements thus formed each includes a base portion attached to the substrate and a curved spring portion extending from the base portion and having a distal end projecting above the substrate. The curved spring portion is formed to have a concave curvature with respect to the surface of the substrate.

According to another aspect of the present invention, a method for forming a connector including an array of contact elements includes providing a substrate, providing a conductive adhesion layer on the substrate, forming a support layer on the conductive adhesion layer, patterning the support layer to define an array support elements, isotropically etching the array of support elements to form rounded corners on the top of each support element, forming a metal layer on the conductive adhesion layer and on the array of support elements, patterning the metal layer and the conductive adhesion layer to define an array of contact elements. Each contact element includes a first metal portion formed on a conductive adhesion portion and a second metal portion extending from the first metal portion and partially across the top of a respective support element. The method further includes removing the array of support elements.

Figure 14A:
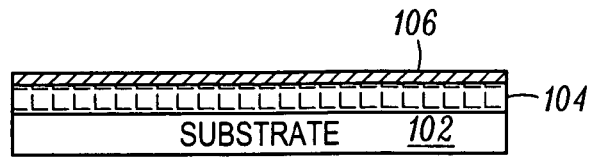
FIGS. 14A to 14H are schematic drawings that illustrate the processing steps for forming a connector according to one aspect of the present invention.
Figure 14B:
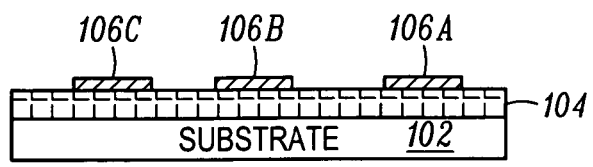

FIGS. 14A to 14H illustrate the processing steps for forming a connector containing an array of elastic contacts, according to one aspect of the present invention. Referring to FIG. 14A, a substrate 102 on which the contact elements are to be formed is provided. Substrate 102 can be a silicon wafer or ceramic wafer for example and may include a dielectric layer formed thereon (104). As described above, a dielectric layer of SOS, SOG, BPTEOS, or TEOS layer can be formed on substrate 102 for isolating the contact elements from substrate 102. Then, a support layer 104 is formed on substrate 102. Support layer 104 can be a deposited dielectric layer, such as an oxide or nitride layer, a spin-on dielectric, a polymer, or any other suitable etchable material. In one configuration, support layer 104 is deposited by a chemical vapor deposition (CVD) process. In another configuration, support layer 104 is deposited by a plasma vapor deposition (PVD) process. In yet another configuration, support layer 104 is deposited by a spin-on process. In yet another configuration, when substrate 102 is not covered by a dielectric layer or a conductive adhesive layer, the support layer can be grown using an oxidation process commonly used in semiconductor manufacturing.

After the support layer 104 is deposited, a mask layer 106 is formed on the top surface of support layer 104. Mask layer 106 is used in conjunction with a conventional lithography process to define a pattern on support layer 104 using mask layer 106. After the mask layer is printed and developed (FIG. 14B), a mask pattern, including regions 106A to 106C, is formed on the surface of support layer 104 defining areas of support layer 104 to be protected from subsequent etching.

Figure 14C:
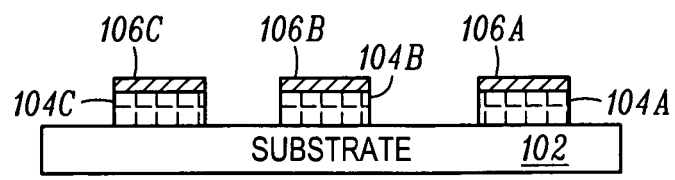
Figure 14D:
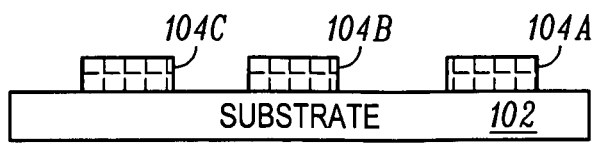

Referring to FIG. 14C, an anisotropic etching process is performed using regions 106A to 106C as a mask. As a result of the anisotropic etching process, support layer 104 not covered by a patterned mask layer is removed. Accordingly, support regions 104A to 104C are formed. The mask pattern including regions 106A to 106C is subsequently removed to expose the support regions (FIG. 14D).

Figure 14E:
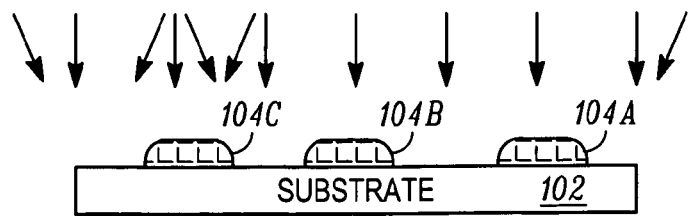

Referring to FIG. 14E, support regions 104A to 104C are then subjected to an isotropic etching process. An isotropic etching process removes material under etch in the vertical and horizontal directions at substantially the same etch rate. Thus, as a result of the isotropic etching, the top corners of support regions 104A to 104C are rounded off as shown in FIG. 14E. In one configuration, the isotropic etching process is a plasma etching process using $SF_6$, $CHF_3$, $CF_4$ or other well known chemistries commonly used for etching dielectric materials. In an alternate configuration, the isotropic etching process is a wet etch process, such as a wet etch process using a buffered oxide etch (BOE).

Figure 14F:
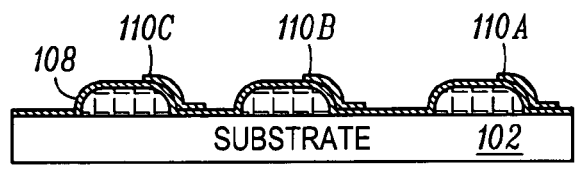

Then, referring to FIG. 14F, a metal layer 108 is formed on the surface of substrate 102 and the surface of support regions 104A to 104C. Metal layer 108 can be a copper layer or a copper-alloy (Cu-alloy) layer or a multilayer metal deposition such as Tungsten coated with Copper-Nickel-Gold (Cu/Ni/Au). In a preferred configuration, the contact elements are formed using a small-grained copper-beryllium (CuBe) alloy and then plated with electroless Nickel-Gold (Ni/Au) to provide a non-oxidizing surface. Metal layer 108 can be deposited by a CVD process, by electro plating, by sputtering, by physical vapor deposition (PVD) or using other conventional metal film deposition techniques. A mask layer is deposited and patterned into mask regions 110A to 100C using a conventional lithography process. Mask regions 110A to 100C define areas of metal layer 108 to be protected from subsequent etching.

Figure 14G:
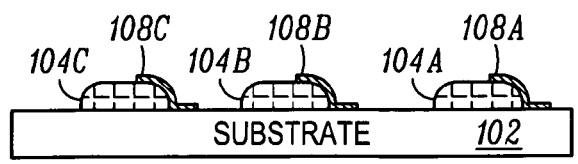
Figure 14H:
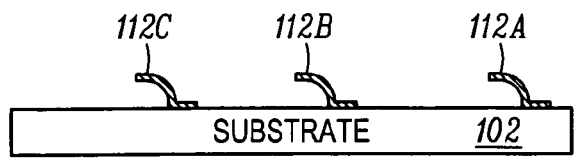

Then, the structure in FIG. 14F is subjected to an etching process for removing metal layer not covered by mask regions 110A to 100C. As a result, metal portions 108A to 108C are formed as shown in FIG. 14G. Each of metal portions 108A to 108C includes a base portion formed on substrate 102 and a curved spring portion formed on a respective support region (104A to 104C). Accordingly, the curved spring portion of each metal portion assumes the shape of the underlying support region, projecting above the substrate surface and having a curvature that provides a wiping action when engaging a contact point.

To complete the connector, support regions 104A to 104C are removed (FIG. 14H), such as by using a wet etch or an anisotropic plasma etch or other etch process. If the support layer is formed using an oxide layer, a buffered oxide etchant can be used to remove the support regions. As a result, free standing contact elements 112A to 112C are formed on substrate 102.

One of ordinary skill in the art, upon being apprised of the present invention, would appreciate that many variations in the above processing steps are possible to fabricate the connector of the present invention. For example, the chemistry and etch condition of the isotropic etching process can be tailored to provide a desired shape in the support regions so that the contact elements thus formed have a desired curvature. Thus, because contact properties can be altered by changing the contact shape, the processing steps describe above provide a method for tailoring contact properties by facilitating the ability to etch contact elements to obtain desired shapes. Furthermore, one of ordinary skill in the art would appreciate that through the use of semiconductor processing techniques, a connector can be fabricated with contact elements having a variety of properties. For example, a first group of contact elements can be formed with a first pitch while a second group of contact elements can be formed with a second pitch greater or smaller than the first pitch. Other variations in the electrical and mechanical properties of the contact element are possible, as will be described in more detail below.

FIGS. 15A to 15H illustrate the processing steps for forming a connector according to one configuration of the present invention. The processing steps shown in FIGS. 15A to 15H are substantially the same as the processing steps shown in FIGS. 14A to 14H. However, FIGS. 15A to 15H illustrate that different configuration of contact elements can be fabricated by using suitably designed mask patterns.

Referring to FIG. 15A, a support layer 124 is formed on a substrate 122. A mask layer 126 is formed on the support layer for defining mask regions for forming the connector. In the present configuration, mask regions 126A and 126B (FIG. 15B) are positioned close together to allow a contact element including two curved spring portion to be formed.

After an isotropic etching process is performed using mask regions 126A and 126B as mask, support regions 124A and 124B are formed (FIG. 15C). The mask regions are removed to expose the support regions (FIG. 15D). Then, support regions 124A and 124B are subjected to an isotropic etching process to shape the structures so that the top surface of the support regions includes rounded corners (FIG. 15E).

A metal layer 128 is deposited over the surface of substrate 122 and over the top surface of support regions 124A and 124B (FIG. 15F). A mask pattern, including regions 130A and 130B, is defined on metal layer 128. After metal layer 128 is etched using mask regions 130A and 130B as mask, metal portions 128A and 128B are formed (FIG. 15G). Each of metal portions 128A and 128B includes a base portion formed on substrate 122 and a curved spring portion formed on the respective support region (124A or 124B). The curved spring portion of each metal portion assumes the shape of the underlying support region, projecting above the substrate surface and having a curvature that provides a wiping action when engaging a contact point. In the present configuration, the distal ends of metal portions 128A and 128B are formed facing each other. To complete the connector, support regions 124A to 124B are removed (FIG. 15H). As a result, a free standing contact element 132 is formed on substrate 102. In the cross-sectional view of FIG. 15H, the two metal portions of contact element 132 appear to be unconnected. However, in actual implementation, the base portions of the metal portions are connected such as by forming a ring around the contact element or the base portions can be connected through conductive layers formed in substrate 122.

Figure 16A:
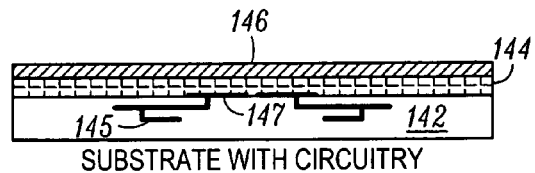
FIGS. 16A to 16H are schematic drawings that illustrate the processing steps for forming a connector according to another aspect the present invention.
Figure 16B:
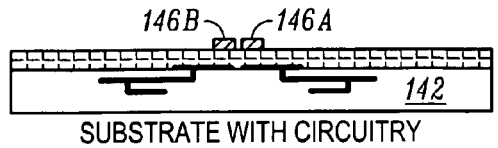

FIGS. 16A to 16H illustrate the processing steps for forming a connector, according to an alternate configuration of the present invention. Referring to FIG. 16A, a substrate 142 including predefined circuitry 145 is provided. Predefined circuitry 145 can include interconnected metal layers or other electrical devices, such as capacitors or inductors, which are typically formed in substrate 142. In the present configuration a top metal portion 147 of circuitry 145 is exposed at the surface of substrate 142. Top metal portion 147 is formed at the top surface of substrate 142 to be connected to the contact element to be formed. To form the desired contact element, a support layer 144 and a mask layer 146 are formed on the top surface of substrate 142.

Figure 16C:
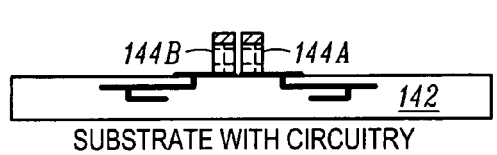
Figure 16D:
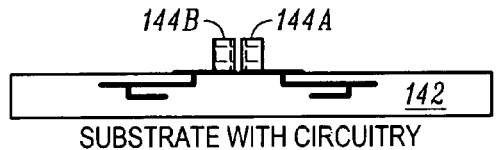
Figure 16E:
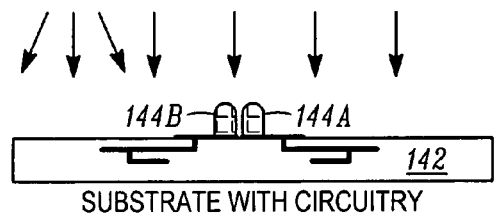
Figure 16F:
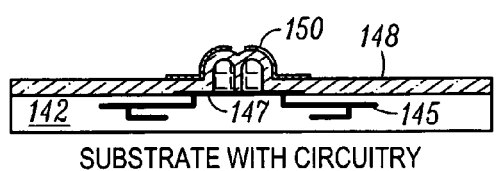
Figure 16G:
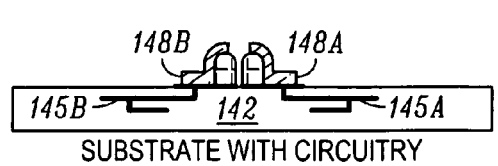

The processing steps proceed in a similar manner as described above with reference to FIGS. 15A to 15H. Mask layer 146 is patterned to form mask layer regions 146A and 146B (FIG. 16B) and support layer 144 is etched accordingly to form support regions 144A and 144B (FIG. 16C). The mask regions are removed to expose the support regions (FIG. 16D). Then, an isotropic etching process is carried out to round out the top corners of support regions 144A and 144B (FIG. 16E). A metal layer 148 is deposited on the surface of substrate 142 and over the support regions (FIG. 16F). Metal layer 148 is formed over top metal portion 147. As a result, metal layer 148 is electrically connected to circuit 145.

Figure 16H:
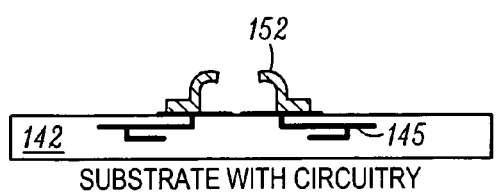

Metal layer 148 is patterned by a mask layer 150 (FIG. 16F) and subjected to an etching process. Metal portions 148A and 148B are thus formed (FIG. 16G) electrically connected to circuit portions 145A and 145B and having distal ends pointing towards each other. Support portions 144A and 144B are removed to complete the fabrication of contact element 152 (FIG. 16H).

As thus formed, contact element 152 is electrically connected to circuit 145. In the manner, additional functionality can be provided by the connector of the present invention. For example, circuit 145 can be formed to electrically connect certain contact elements. Circuit 145 can also be used to connect certain contact elements to electrical devices such as a capacitor or an inductor formed in or on substrate 142.

Fabricating contact element 152 as part of an integrated circuit manufacturing process provides further advantages. Specifically, a continuous electrical path is formed between contact element 152 and the underlying circuit 145. There is no metal discontinuity or impedance mismatch between the contact element and the associated circuit. In some prior art connectors, a gold bond wire is used to form the contact element. However, such a structure results in gross material and cross-sectional discontinuities and impedance mismatch at the interface between the contact element and the underlying metal connections, resulting in undesirable electrical characteristics and poor high frequency operations. The contact element of the present invention does not suffer from the limitations of the conventional connector systems and a connector built using the contact elements of the present invention can be used in demanding high frequency and high performance applications. In particular, the present invention provides connectors that do not have pin-type connection elements that can act as antenna during transmission of electrical signals at high frequency. Additionally, the unitary structure of elastic contacts wherein base and elastic portions are formed from a common sheet reduces the electrical impedance mismatch along the conductive path of a connector, thereby improving the high frequency performance.

FIGS. 17A to 17H illustrate the processing steps for forming an array of connectors according to an alternate configuration of the present invention. Like elements in FIGS. 14A to 14H and 17A to 17H are given like reference numerals to simplify the discussion. Contact elements of a connector fabricated according to the steps outlined in FIGS. 17A-H include a conductive adhesion layer in the base portion of the contact element for improving the adhesion of the contact element to the substrate.

Figure 17A:
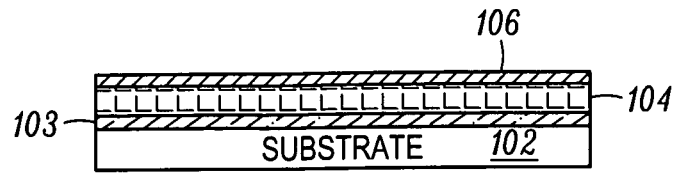
FIGS. 17A to 17H are schematic drawings that illustrate the processing steps for forming an array of connectors, according to a further aspect of the present invention.

Referring to FIG. 17A, a substrate 102 on which the contact elements are to be formed is provided. Substrate 102 can be a silicon wafer or ceramic wafer and may include a dielectric layer formed thereon (not shown in FIG. 17A). A conductive adhesion layer 103 is deposited on substrate 102 or on top of the dielectric layer if present. Conductive adhesion layer 103 can be a metal layer, such as copper-beryllium (CuBe) or titanium (Ti), or a conductive polymer-based adhesive, or other conductive adhesive. Then, a support layer 104 is formed on the adhesion layer 103. Support layer 104 can be a deposited dielectric layer, such as an oxide or nitride layer, a spin-on dielectric, a polymer, or any other suitable etchable material.

After the support layer 104 is deposited, a mask layer 106 is formed on the top surface of support layer 104. Mask layer 106 is used in conjunction with a conventional lithography process to define a pattern on support layer 104 using mask layer 106. After the mask layer is printed and developed (FIG. 17B), a mask pattern, including regions 106A to 106C, is formed on the surface of support layer 104 defining areas of support layer 104 to be protected from subsequent etching.

Figure 17B:
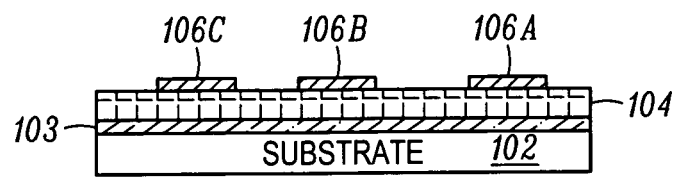
Figure 17C:
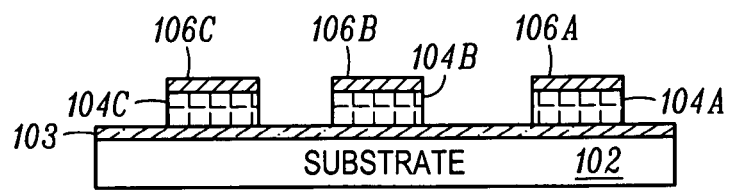
Figure 17D:
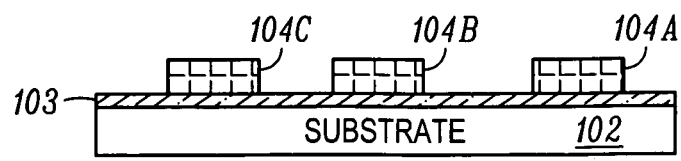

Referring to FIG. 17C, an anisotropic etching process is performed using regions 106A to 106C as a mask. As a result of the anisotropic etching process, portions of support layer 104 not covered by a patterned mask layer are removed. The anisotropic etching process stops on conductive adhesion layer 103 or partially in conductive adhesion layer 103. Thus, conductive adhesion layer 103 remains after the anisotropic etch process. Accordingly, support regions 104A to 104C are formed on the conductive adhesion layer. The mask pattern including regions 106A to 106C is subsequently removed to expose the support regions (FIG. 17D).

Figure 17E:
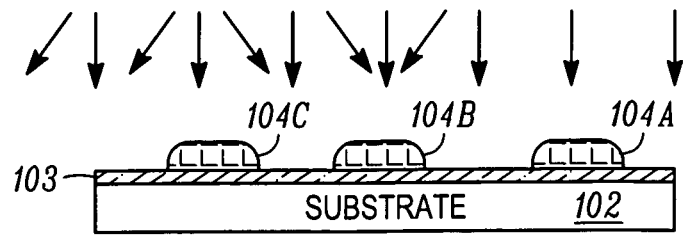

Referring to FIG. 17E, support regions 104A to 104C are then subjected to an isotropic etching process. An isotropic etching process removes material under etch in the vertical and horizontal directions at substantially the same etch rate. Thus, as a result of the isotropic etching, the top corners of support regions 104A to 104C are rounded off as shown in FIG. 17E.

Figure 17F:
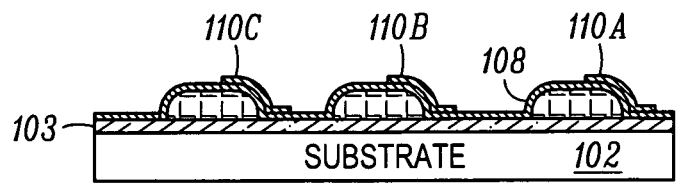

Then, referring to FIG. 17F, a metal layer 108 is formed on the surface of conductive adhesion layer 103 and the surface of support regions 104A to 104C. Metal layer 108 can be a copper layer or a copper-alloy (Cu-alloy) layer or a multilayer metal deposition such as Tungsten coated with Copper-Nickel-Gold (Cu/Ni/Au). In a preferred configuration, the contact elements are formed using a small-grained copper-beryllium (CuBe) alloy and then plated with electroless Nickel-Gold (Ni/Au) to provide a non-oxidizing surface. Metal layer 108 can be deposited by a CVD process, by electro plating, by sputtering, by physical vapor deposition (PVD) or using other conventional metal film deposition techniques. A mask layer is deposited and patterned into mask regions 110A to 110C using a conventional lithography process. Mask regions 110A to 110C define areas of metal layer 108 to be protected from subsequent etching.

Figure 17G:
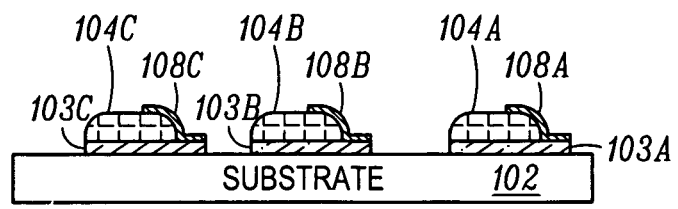

Then, the structure in FIG. 17F is subjected to an etching process for removing portions of metal layer and conductive adhesion layer not covered by mask regions 110A to 10C. As a result, metal portions 108A to 108C and conductive adhesion portions 103A to 103C are formed as shown in FIG. 17G. Each of metal portions 108A to 108C includes a base portion formed on a respective conductive adhesion portion and a curved spring portion formed on a respective support region (104A to 104C). Accordingly, the curved spring portion of each metal portion assumes the shape of the underlying support region, projecting above the substrate surface and having a curvature that provides a wiping action when engaging a contact point. The base portion of each metal portion is attached to a respective conductive adhesion portion which functions to enhance the adhesion of each base portion to substrate 102.

Figure 17H:
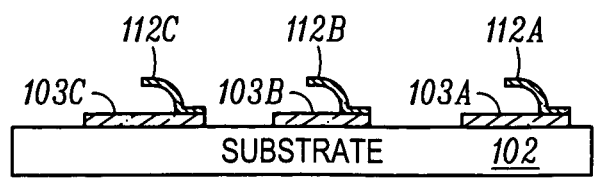

To complete the connector, support regions 104A to 104C are removed (FIG. 17H), such as by using a wet etch or an anisotropic plasma etch or other etch process. If the support layer is formed using an oxide layer, a buffered oxide etchant can be used to remove the support regions. As a result, free standing contact elements 112A to 112C are formed on substrate 102. As thus formed, each of contact elements 112A to 112C effectively includes an extended base portion. As shown in FIG. 17H, each conductive adhesion portion serves to extend the surface area of the base portion to provide more surface area for attaching the contact element to substrate 102. In this manner, the reliability of the contact elements can be improved.

As one of ordinary skill in the art would appreciate, some details of the process flows outlined in FIGS. 14A-17H can be tailored according to the type of substrate used for the connector. For example, the processing temperature used for layers deposited on the contact array substrate can be adjusted according to the ability of a substrate to withstand high temperature processing. Similarly, the type of deposition process can be chosen to have maximum compatibility with the substrate type. For example, deposition processes that do not require high vacuum environments would be preferred for substrates that have very high outgassing rates.

Generally speaking, configurations of the present invention provide a scalable, low cost, reliable, compliant, low profile, low insertion force, high-density, separable and reconnectable electrical connection for high speed, high performance electronic circuitry and semiconductors. The electrical connection can be used, for example, to make electrical connections from one PCB to another PCB, MPU, NPU, or other semiconductor device.

In one configuration of the invention, a connection system includes a beam land grid array (BLGA). The electrical and mechanical functionality of the BLGA lends itself to numerous applications in the electronics space. It allows for short interconnections to be established between almost any electrical contact surfaces, thus maintaining high electrical performance. Some suitable applications include test, burn-in, prototyping, and full wafer burn-in applications, which require high electrical performance. Optimized electrical, thermal, and mechanical properties are realized by the use of the BLGA electrical contact elements.

In one configuration of this invention, there is provided a separable and reconnectable contact system for electronically connecting circuits, chips, boards, and packages together. The system is characterized by its elastic functionality across the entire gap of separation between the circuits, chips, boards, or packages being connected, i.e., across the thickness of the connection system. The invention includes a beam land grid array (BLGA) configuration but is not limited to that particular structural design.

Figure 18A:
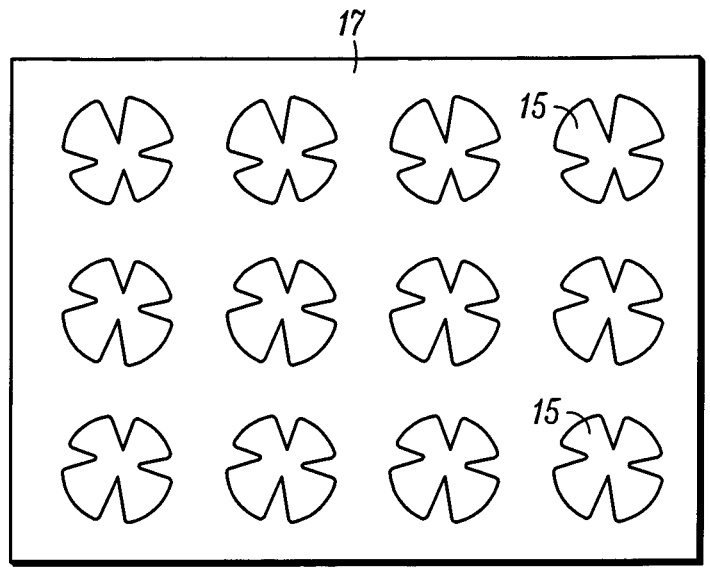
FIG. 18A is a schematic diagram that illustrates plan views of a contact arm array, in accordance with one configuration of the present invention.
Figure 18B:
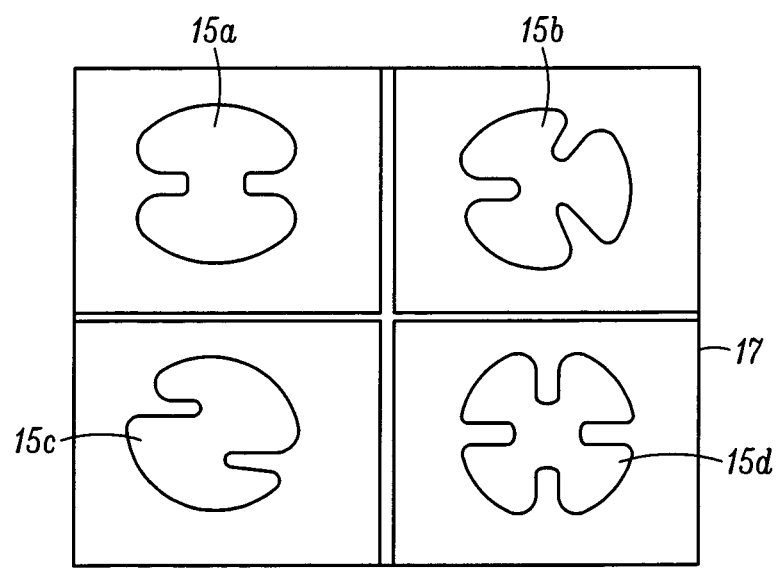
FIG. 18B is a schematic diagram that depicts a plan view of several different exemplary contact arm designs.

An exemplary array according to one configuration of the invention is illustrated in FIG. 18A. Contact arms 15 are fabricated in carrier layer 17. Different design patterns for the contact arms 15 are respectively illustrated by elements 15a, 15b, 15c, and 15d in FIG. 18B.

Figure 19:
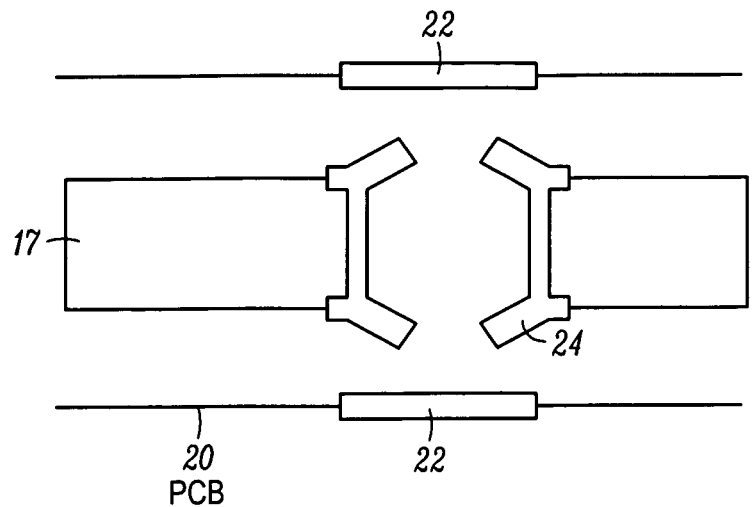
FIG. 19 is a schematic diagram that depicts a sectional view of an exemplary BLGA system of this invention, and its attachment to a PCB.

In FIG. 19, carrier 17 is shown making contact with the pad 22 of PCB 20 by means of BLGA contact wipers 24, similar to the contact arms 15 at the top of the carrier.

Figure 20:
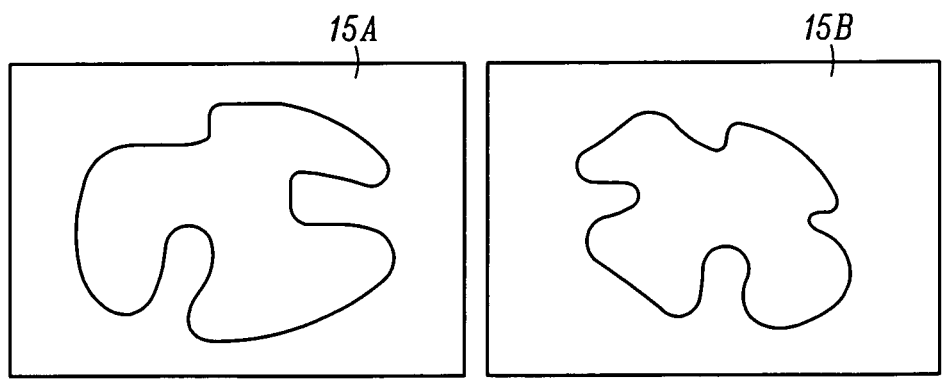
FIG. 20 is a schematic diagram that depicts angled plan views of two example contact arm designs for the BLGA system of this invention.

FIG. 20 depicts angled plan views 15A and 15B of exemplary contact arm designs for a BLGA system according to two different configurations of this invention.

Figure 21:
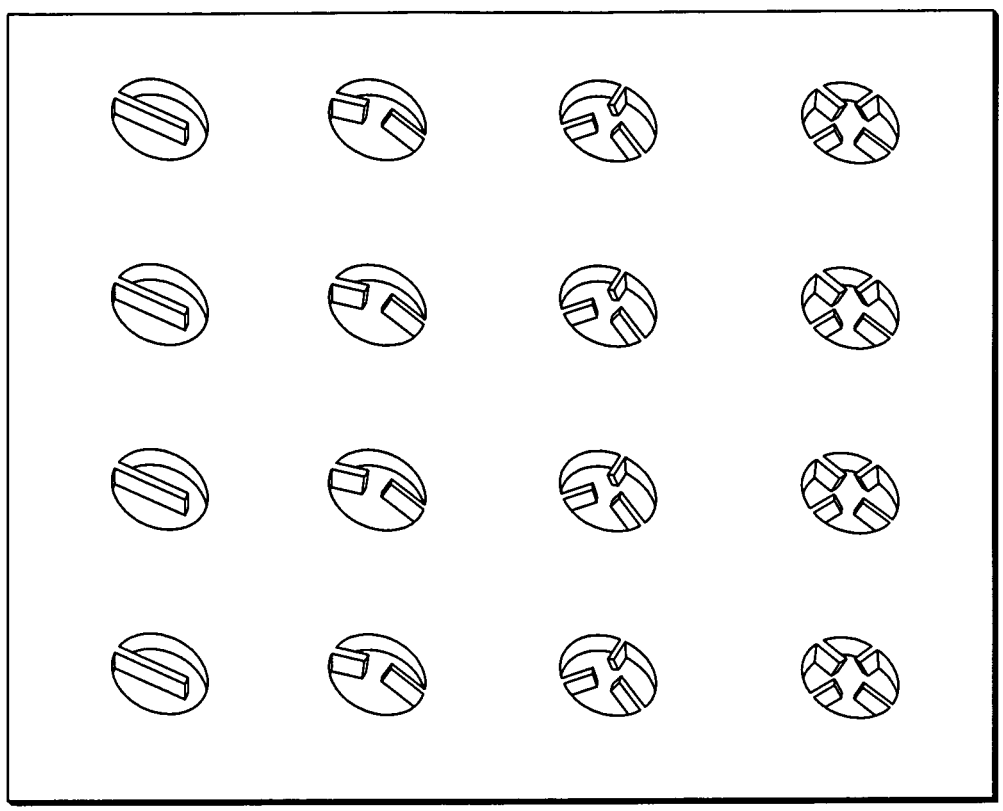
FIG. 21 is a schematic diagram that shows an enlarged perspective view of different exemplary contact arm designs for contacting solder balls.

Referring to FIG. 21, a plurality of contact arm designs are shown for a BLGA system. Like those mentioned, these contact patterns can also be used to fabricate spring-like (elastic) contact structures in a contact array device such as an interposer or BLGA, according to processes described further below. A typical material used for the elastic contacts is Be/Cu.

Referring again to FIGS. 8A and 8B, enlarged top and side views of one exemplary version of contact elements 15 are illustrated.

Figure 8A:
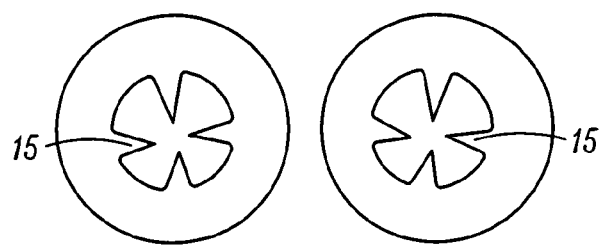
FIGS. 8A and 8B are schematic diagrams that illustrate top and side views of contact arms arranged in accordance with configurations of this invention.
Figure 8B:
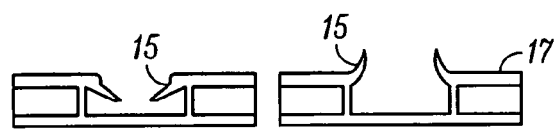
Figure 8C:
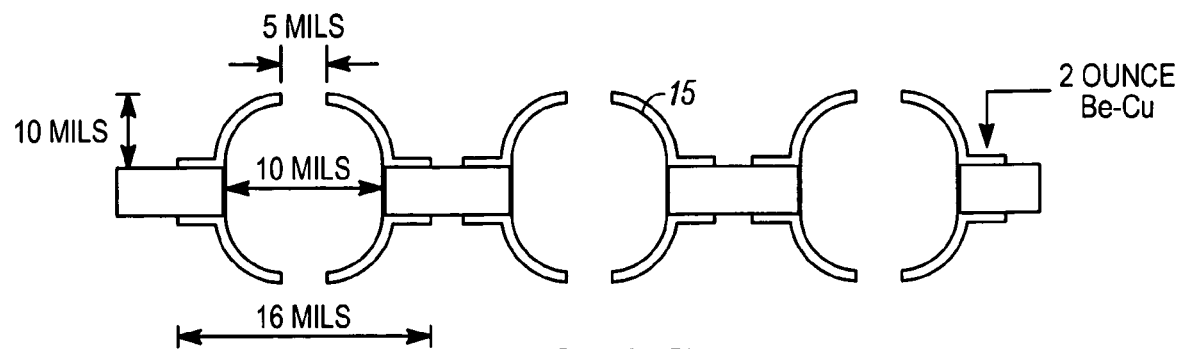
FIG. 8C is a schematic diagram that depicts an enlarged sectional view of exemplary contact arms for a BLGA contact array.

Referring to FIG. 8C, a sectional, an enlarged view of an exemplary set of contact elements 15 for a BLGA or interposer system is shown. The elements can be etched into a sheet of beryllium-copper, for example. Beryllium copper (BeCu) alloys have high strength and good elastic properties. In other words, BeCu can be elastically deformed over a significant range without substantial plastic flow. The BeCu alloy can be formed by precipitation hardening processes, wherein Be-rich precipitates form within a Cu-rich matrix. This can occur, for example, during slow cooling from high temperature, which can cause a Be-rich phase to precipitate from a Cu matrix due to decreased solubility of the Be at lower temperatures. Accordingly, in one configuration of this invention, contact elements 15 comprising a BeCu alloy can be elastically displaced over a large range in a repeated fashion without undergoing plastic deformation.

Figure 22:
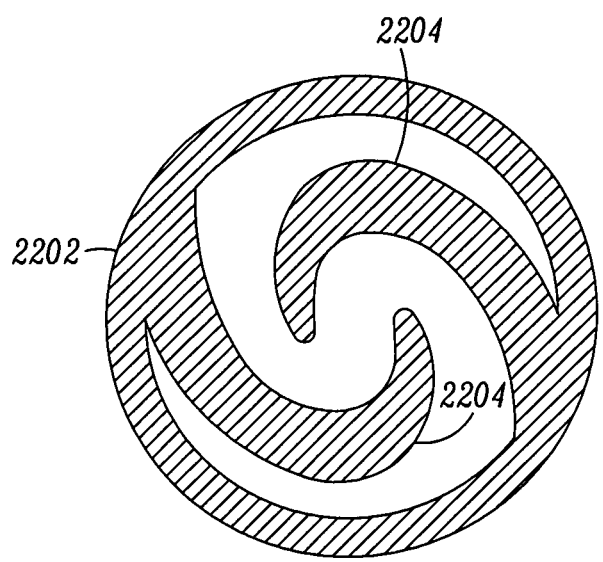
FIG. 22 is a schematic diagram that illustrates a top schematic view of a contact arranged in accordance with another configuration of this invention.

FIG. 22 illustrates a top schematic view of a contact arranged in accordance with another configuration of this invention. In this arrangement, contact 2202 includes two spiral shaped contact arms 2204.

Figure 23:
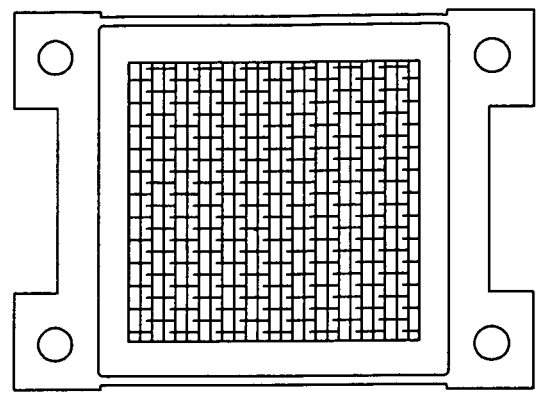
FIGS. 23 and 24 are schematic diagrams that illustrate a top view and sectional view, respectively, of an exemplary clamping system for the contact systems of this invention.
Figure 24:
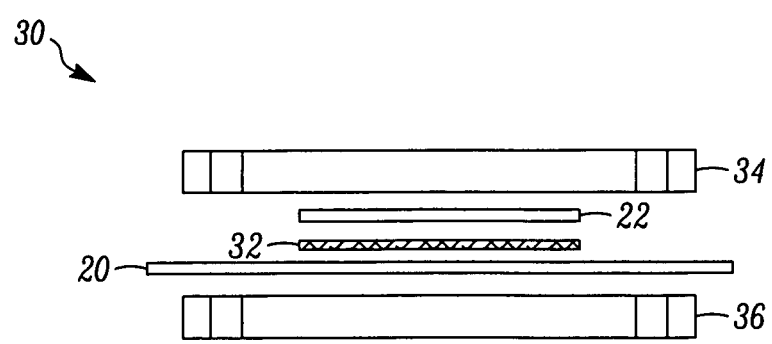

Referring to FIGS. 23 and 24, a clamping mechanism 30 is shown in sectional and top views, respectively. The contact system arranged in accordance with configurations of this invention is depicted as an interposer 32, which is clamped between a PCB 20 and a package 22 that is to be attached by placing the assembly between a top plate 34 and a backing plate 36, which are screwed together or otherwise compressed together.

The contact systems arranged according to different configurations of this invention can be used with high frequency semiconductor devices or almost any type of electrical interface including, but not limited to: BGA, CSP, QFP, QFN, and TSOP packages.

Compared to stamped, formed, or coiled springs, a contact system of the present invention provides greater elasticity, without limiting electrical properties. The system is readily scalable to small pitch and small inductance, whereas pogo pins, and nano-springs are very limited in this regard.

Compared with polymer-based and dense metal systems, a contact system of the present invention is not limited in its mechanical properties, durability, contact force, and working range, while providing good electrical properties.

The contact system of this invention is characterized by its elastic functionality across the entire gap between the electrical devices to be connected, i.e., from device contact to device contact. Thus, in accordance with one configuration of this invention, a double sided connector arranged has an array of elastic contacts disposed on each side of the connector substrate. Both contact arrays, when engaging respective external components on the respective opposite sides of the connector substrate, can be displaced elastically over an entire range of movement available to the elastic contact arms of the contacts.

Figure 25:
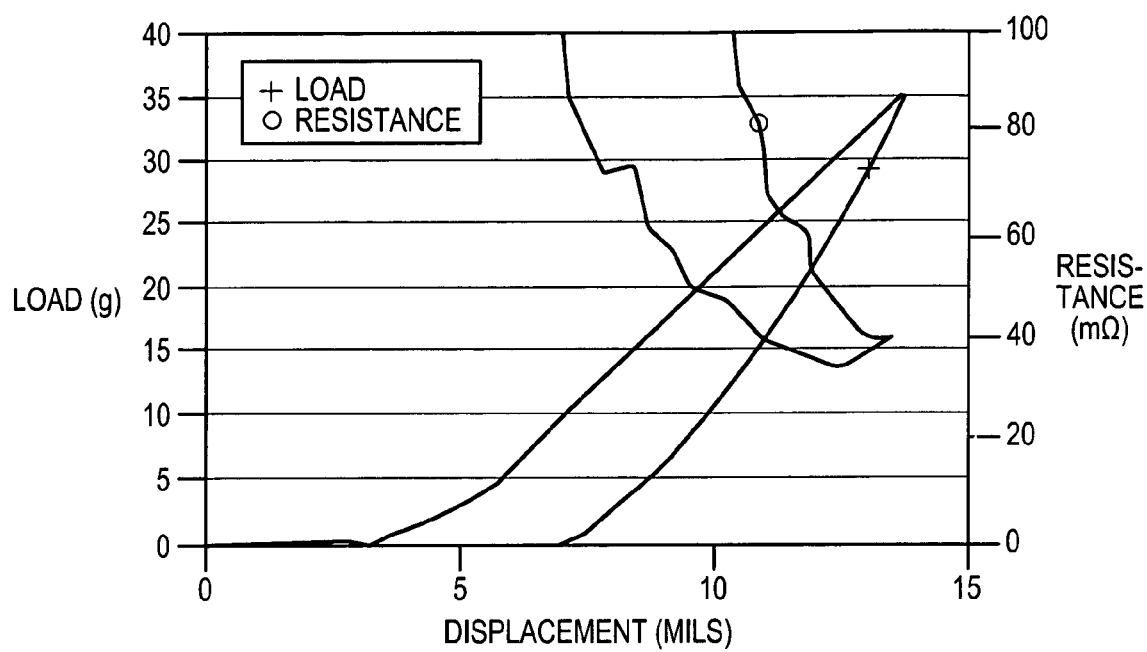
FIG. 25 is a graph of the load versus displacement for an exemplary BLGA system of this invention.

Referring to FIG. 25, a graph of load versus displacement for BLGA attachment systems of this invention is illustrated. FIG. 25 illustrates the concept of working range. The load versus displacement curve (lower hysteresis curve) illustrates that the contact has elastic behavior during insertion (the displacing downwardly of a contact arm by an external component) over a range from about 6.5 to 14 mils. The resistance versus displacement curve indicates that the insertion resistance is below about 60 mOhm between about 7 and 14 mils displacement. For purposes of this example, if the acceptable electrical resistance for the contact is determined to be 60 mOhm or lower, then a working range, defined for this example as a displacement range during contact insertion in which the contact behaves elastically and exhibits resistance of 60 mOhm or less, is about 7 mils (the range between 7 and 14 mils over which the contact is both elastic and has resistance below the defined acceptable limit).

Typical mechanical and electrical characteristics for the contacts of this invention include a large working range greater than 5 mils, a low contact force less than 30 g, wiping action having both horizontal and vertical components for reliability, high durability greater than two hundred thousand cycles, high temperature operability greater than 125° C., good elasticity, low inductance less than 0.5 nH, high current capacity greater than 1.5 A, a small scalable pitch less than 20 mils, and a functional elasticity across the entire gap separating the two devices, boards, or substrates to be electrically connected.

In one configuration of this invention, the elasticity range for a contact is approximately between 0.12 mm and 0.4 mm for a size range for the flange springs of between approximately 0.12 mm and 0.8 mm. Thus, the elasticity to size ratio is in the approximate range of between 0.5 and 1.0. This ratio is a measure of the relative distance in which a contact arm can be elastically displaced as compared to the length of the elastic contact arm (flange spring).

In accordance with other configurations of this invention, the contact structures 15 shown generally in FIGS. 8A-C can be formed by the processes outlined in FIGS. 17A and 17B. The contacts include one or more arrays of elastically deformable contacts, wherein the elastically deformable contacts are integrally formed from a metallic sheet, for example, a Cu alloy sheet. The alloy material of the metallic sheet is configured to provide high elasticity, such that highly elastic contact arms can be fabricated therefrom. The term "highly elastic," as used herein with respect to contacts, refers to contacts that can be repeatedly displaced without significant plastic flow (that is, without surpassing a mechanical yield stress (or strain)) over the range of mechanical displacement that takes place during connection to external components. Accordingly, an interposer formed from the array of deformable elastic contacts can be connected and disconnected multiple times to a substrate without degradation in mechanical or electrical performance.

For example, an interposer fabricated according to one configuration of this invention, and substantially similar to that shown in FIG. 8C, may have an array of elastic contacts with a working range of 15 mil on one or both sides of the interposer. When connecting to a substrate, such as a PCB board, the array of contacts can accommodate a variation in relative height of up to about 15 mil for points of contact where each contact of the array of contacts comes into contact with a corresponding conductive features of the PCB. In other words, a first contact (or contact element) at a point P1 in an array can contact a conductive feature of a PCB board having a relative height H1, while a second contact at point P2 of the array can contact a conductive feature of the PCB board having a relative height H1-12 mil.

Figure 26:
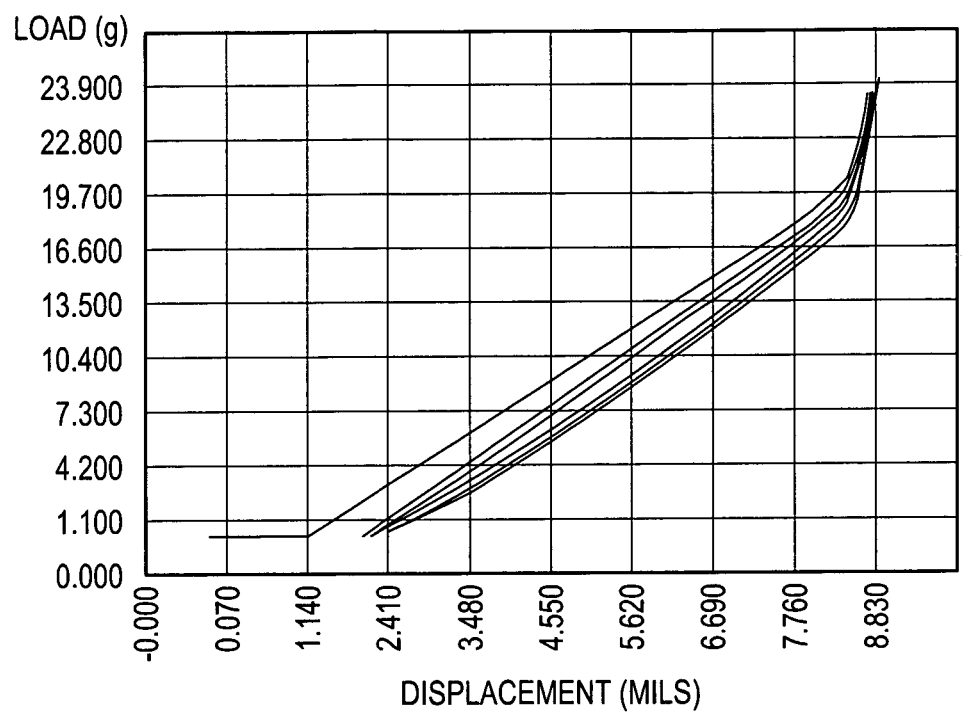
FIG. 26 is a graph of the load versus displacement for an exemplary BLGA system of this invention.

Thus, by the time electrical contact is established at point P2, the contact at point P1 may be elastically displaced by about 12 mils, that is, one or more of the contact arms displaced downwardly toward the plane of the interposer by about 12 mils. However, because the contacts are fabricated from a highly elastic sheet, upon removal from contacting the PCB, the contact arm at point P1 can return to the same relative height with respect to the interposer surface as compared to before initial contact with the PCB board. The interposer can thus be disconnected from the PCB board and reconnected without a substantial reduction in working range, thus extending the usefulness of the interposer to applications in which disconnection and reconnection may be performed multiple times. FIG. 26 illustrates a load-displacement behavior for an exemplary contact fabricated in accordance with the present invention, illustrating a highly elastic response over repeated measurements.

Figure 27A:
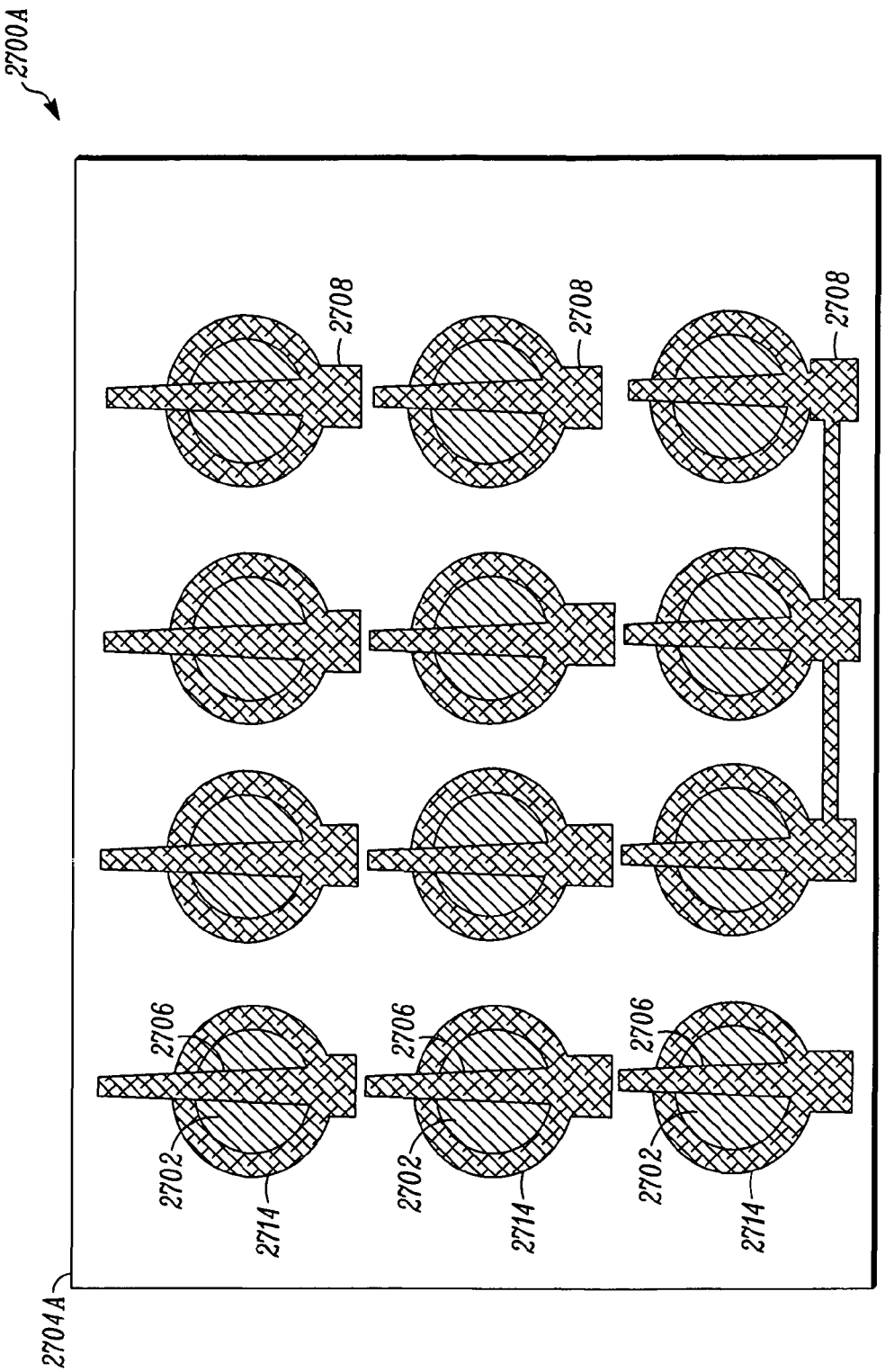
FIGS. 27A-D are schematic diagrams that illustrate in plan view alternative interposers according to further configurations of this invention.

FIGS. 27A-D illustrate alternative configurations of interposers in plan view that can be formed according to the steps outlined in FIGS. 1, 3A, and 3B. Interposers 2700A-D include conductive vias 2702 that extend through respective insulating substrates 2704A-D. Contact arms 2706 project above the plane of respective substrates 2704A-D, in a fashion similar to that shown in FIG. 9 for contacts 914. An annular shaped conductive path 2714 surrounds each conductive via 2702 on the surface of the substrate, similar to conductive path 912 of FIG. 9. Contact base portions 2708, in turn, make electrical contact with conductive paths (horizontal traces) 2714. The paths 2714 can be, for example, portions of a pre-existing metal cladding that are not covered with an adhesive layer in the regions surrounding the via (see FIG. 9). Conductive paths 2714 can be formed by selective plating the regions immediately surrounding vias. In FIG. 27A, contact arms 2706 extend over the corresponding conductive vias 2702 to which they are connected by conductive paths 2714. As compared to contacts illustrated in FIGS. 18A-21 and 8A-C, which generally are centered over vias, the arrangements of contacts illustrated in FIGS. 27A-D afford the ability to make much longer contact arms for a given array pitch. This is because, as illustrated in FIGS. 18A-21 and 8A-C, the length of contact arms centered over a via is generally comparable to or smaller than the via diameter, whereas the contact arms illustrated in FIGS. 27A-D have portions that extend over planar portions of their respective substrates (that is, not over the vias) so that their length can be much larger than the via diameter, often comparable to the via separation (pitch).

Figure 27B:
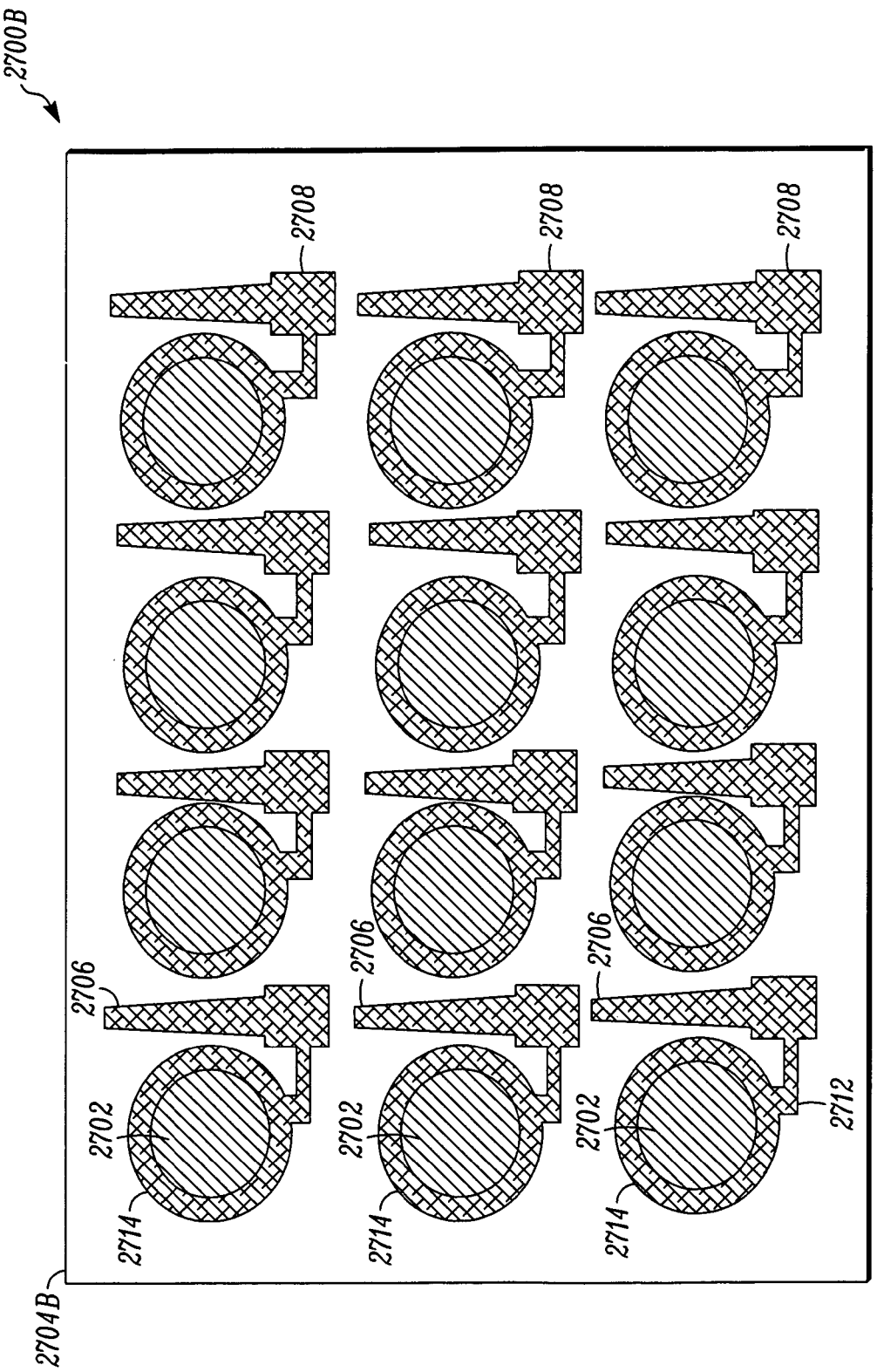

FIG. 27B illustrates a configuration in which contact arms 2706 do not extend over conductive vias 2702. Conductive paths 2714 include an L-shaped portion extending from the annular portion that serves to electrically connect contact bases 2708 and respective conductive vias 2702.

Figure 27C:
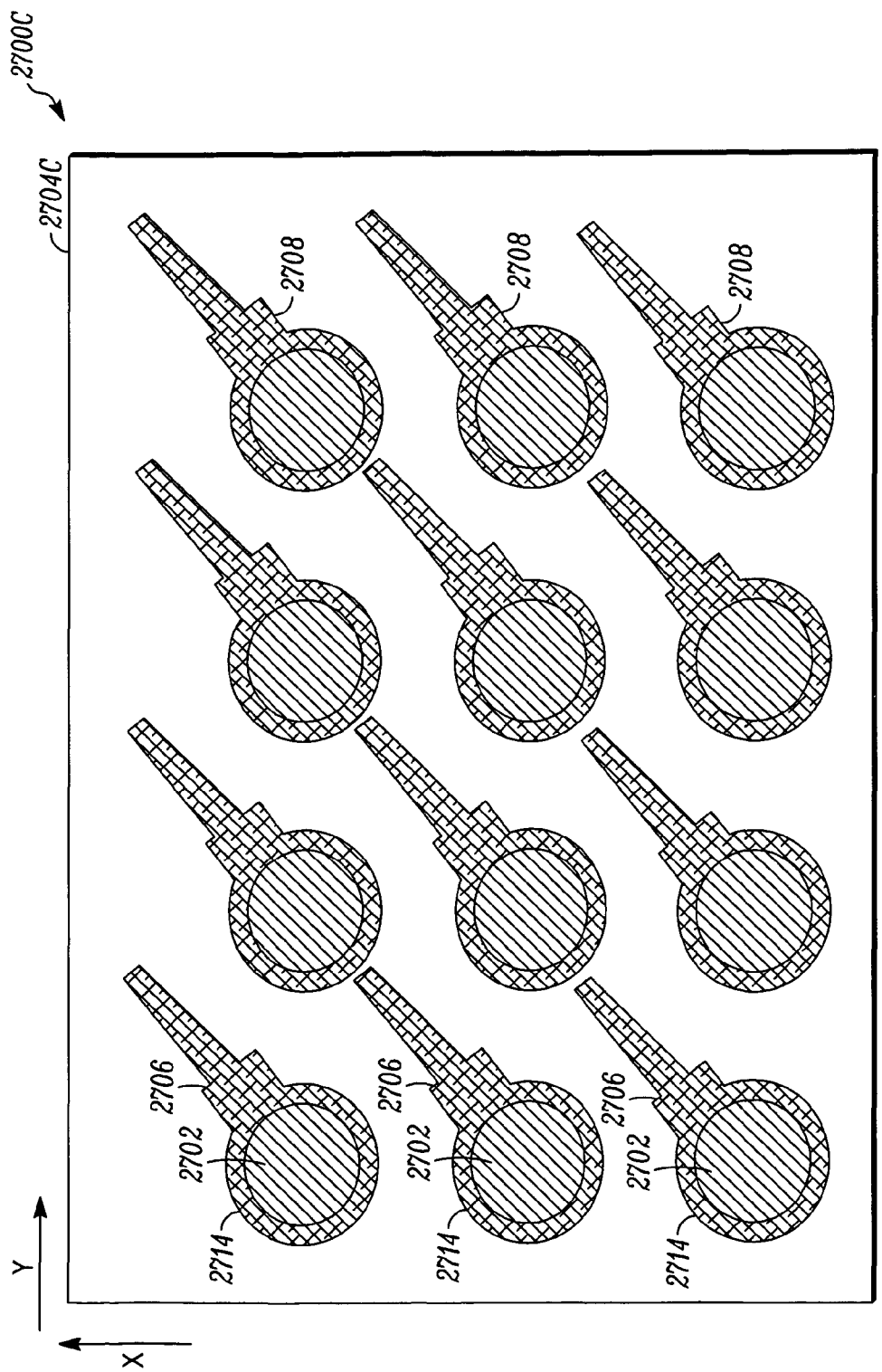

FIG. 27C illustrates a configuration in which contact arms 2706 extend from their respective base portions away from conductive vias 2702 to which they are electrically connected. In addition, the longitudinal direction of contact arms 2706 extends at about a 45 degree angle (from a plan-view perspective) with respect to "X" and "Y" directions of the conductive via array. This allows contact arms 2706 to extend a further distance without extending over conductive vias 2702, than if the contacts were oriented between vias along an X- or Y-direction. Thus, if the array pitch is defined as the distance along the X- or Y-directions between nearest neighbors (the array pitch in this case is the same for either contacts or vias), the contact length can actually exceed the array pitch, since the diagonal distance along a square array is a factor of 1.41 times the array pitch. For other orthogonal arrays (rectangular arrays), having two different pitches corresponding to mutually orthogonal directions, the length of the diagonal also exceeds the length of the longer of the two array pitches. Thus, in configurations of this invention, a contact arm length can be increased by orienting the arm at an angle with respect to X- or Y-axes of an array.

Thus, referring again to FIG. 27B, in one variation of the method of FIG. 1, conductive paths 2714 that comprise annular conductive portions surrounding conductive vias are formed in step 2. In the bonding step 8, a spring sheet containing non-singulated contacts is placed on substrate 2704B, such that continuous portions of the spring sheet extend from each contact to a conductive path 2714 of a via 2702. After contact singulation in step 12, conductive paths 2712 that extend between contact bases 2708 and vias 2702, are formed by etching the spring sheet in the shape of the conductive path 2712 and base 2708. As noted above, the blanket spring sheet containing unsingulated contacts can be previously electrically connected to the via by electroplating regions surrounding the via to join the via and spring sheet across the insulating adhesive layer.

Contact arm 2706 and conductive path 2712 normally comprise the same spring sheet material. Thus, during patterning of a resist layer used to define singulated contacts, contact arms 2706, base portions 2708, and conductive paths 2712 would be covered with resist after exposure and development, and remain unetched during the etch process that removes spring sheet material between each contact. Conductive path 2712 accordingly constitutes a narrow portion of the etched spring sheet.

Figure 27D:
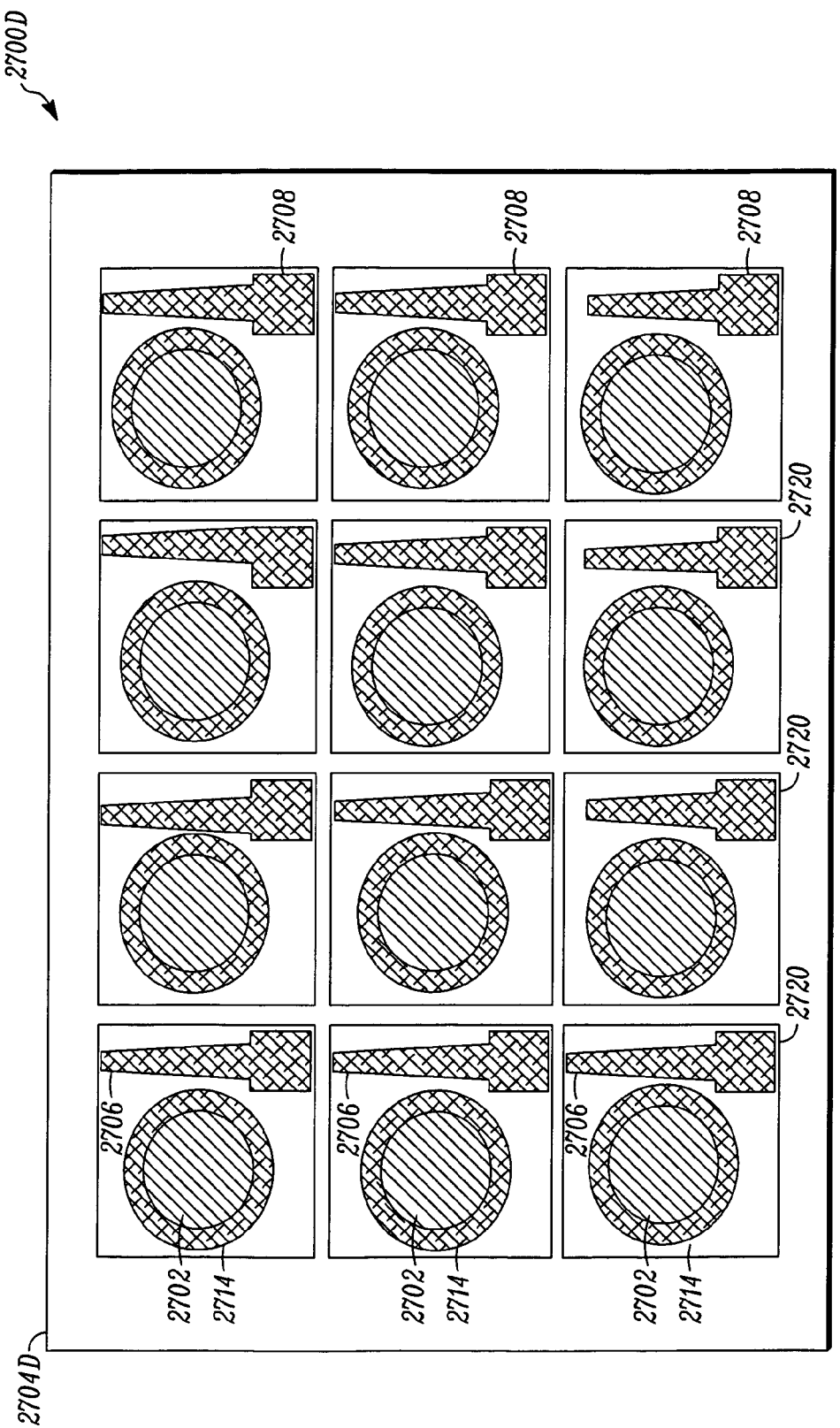

FIG. 27D illustrates another contact arrangement 2700D, according to an additional configuration of the present invention. Conductive capture pads 2720 that surround vias 2702 may be separated from base portions 2708 by an adhesive layer (see, e.g., layer 920 of FIG. 9). In this configuration, electrical connection between contact base portions 2708 and vias 2702 can be made by removing a small portion of the adhesive layer (not shown) to expose pad 2720 in the region of base 2708 and forming a connection between the base and pad during an plating step.

Figure 28:
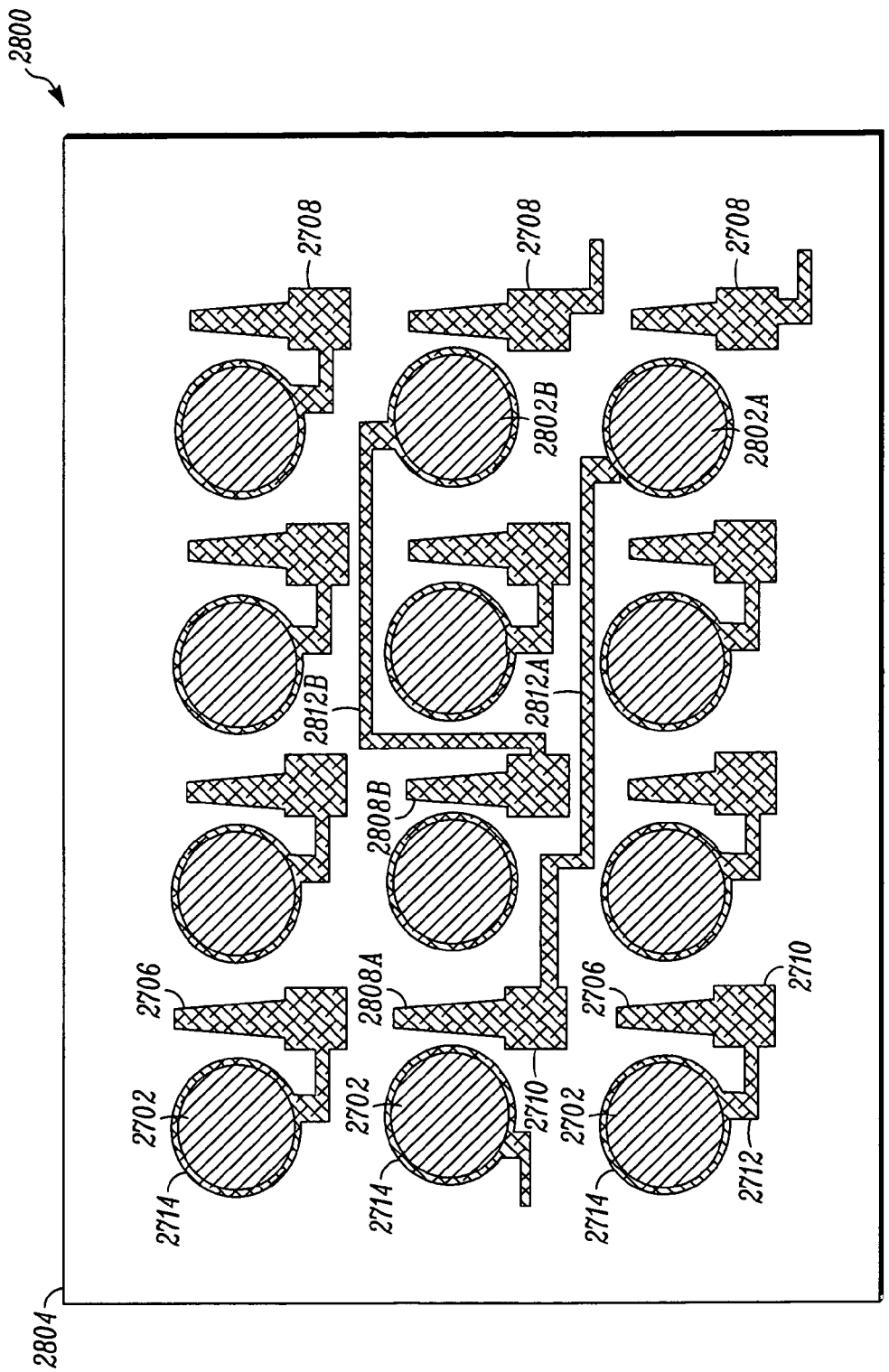
FIG. 28 is a schematic diagram that illustrates an interposer having two contacts each remotely connected to a conductive via, according to another configuration of this invention.

In other configurations of this invention, selected elastic contact arms from an array of contacts can be more remotely coupled to contact vias, wherein a conductive path extends over a further distance on an interposer substrate surface. For example, a "circuit" pattern of conductive paths can be formed in which a plurality of conductive paths each terminates at a conductive via on one end and a base of an elastic contact at the other end. However, the contact base need not be adjacent or even near the conductive via to which it is electrically coupled using the conductive path. FIG. 28 illustrates interposer 2800 having two contacts 2808A, 2808B each remotely connected to a respective conductive via 2802A, 2802B through conductive paths 2812A, 2812B, respectively, according to another configuration of this invention. Conductive vias 2802A and 2802B extend through insulating substrate 2804 in a similar manner to those illustrated in FIGS. 27A to 27D.

Figure 29A:
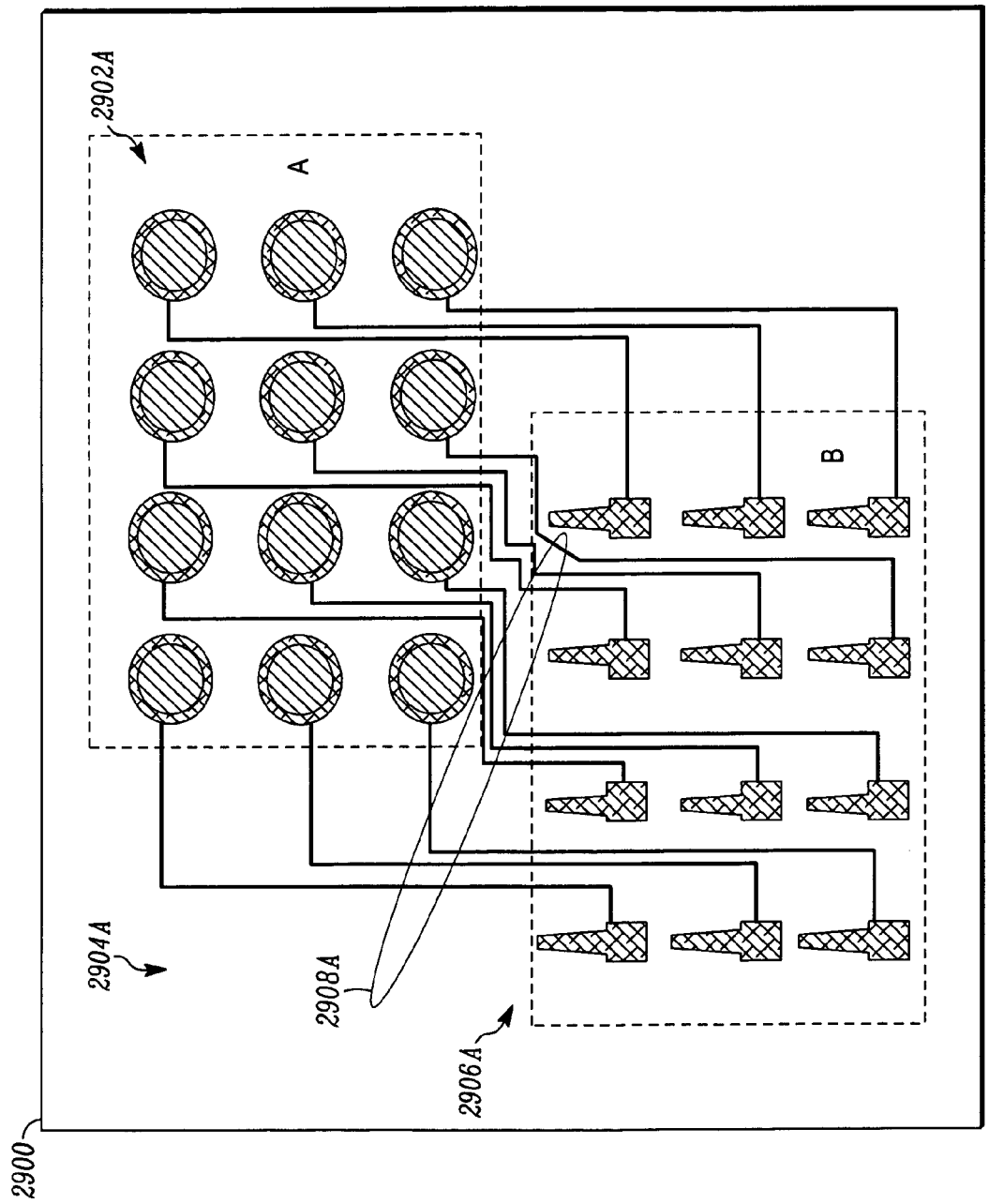
FIG. 29A is a schematic diagram that illustrates an interposer that includes a conductive via array arranged in a first region of insulating substrate and a contact array arranged in a second region of substrate.

In other configurations of this invention, a plurality of contacts can be arranged as a group in a first portion of a substrate surface, while a plurality of conductive vias is arranged in a second portion of a substrate. FIG. 29A illustrates an interposer 2900 that includes a conductive via array 2902A arranged in a first region of insulating substrate 2904A, and a contact array 2906A arranged in a second region of substrate 2904A. Contact array 2906A is electrically connected to conductive via array 2902A through conductive paths that form a circuit 2908A, which includes a plurality of conductive lines. Each conductive line terminates at a conductive via on one end and an elastic contact on the other end. In other configurations of this invention, the circuitry of conductive paths can be arranged so that multiple elastic contacts can be electrically connected to a common conductive via, and, alternatively, multiple conductive vias can be electrically connected to a common elastic contact.

The process illustrated in FIGS. 1, 3A, and 3B provides for flexibility in establishing the positional relationship between elastic contacts and respective conductive vias. Such flexibility provides the ability to tailor an interposer to the structure of components to be connected by the interposer. For example, for components having a similar planar dimension to the interposer, a first component to be connected to one side of an interposer may have all the active electrical devices (with respective electrical leads) arranged in one region of the component surface. The first component may be designed to be reversibly connected through a spring connection, so that it can be contacted by an array of elastic contacts in a first region of an interposer (see region A of FIG. 29A). A second component to be connected to the opposite side of the interposer may have devices grouped in a different region with respect to the first region. The second group can be designed to couple to the interposer through a solder connection at vias, such that a via array of the interposer can be arranged over the second region (see region B of FIG. 29A).

Because elastic contact portions of contacts are independently spatially configurable in their position and direction with respect to the array of conductive vias to which the contacts are electrically coupled, interposers with superior properties can be fabricated in accordance with aspects of this invention. For example, the pitch of contacts in a contact array affixed to an interposer surface can be different than the pitch of a conductive via array. In such case, where an interposer is used to interconnect a first component having the pitch of the contact array with a second component having the pitch of the conductive via array, it may be convenient to arrange the contact array in a separate portion of the substrate from the conductive via array (see FIG. 29B).

In addition, for any given pitch of an external component to be connected to the interposer, the direction that contact arms extend from a contact base can be arranged to maximize the contact arm length (and therefore the working distance) for the given pitch. Thus, contact arms can be arranged in an elastic sheet, such that the arms extend in a diagonal direction with respect to a square or rectangular array.

By providing a highly elastic contact arm, a contact array with a larger working distance can be fabricated. In applications in which reversible contact of the interposer to external components is desired, the additional ability to provide a relatively longer contact arm for a given array pitch affords a greater "reversible working range." The term "reversible working range" refers to a range (such as a distance range) through which an interposer contact (or contact array) can be reversibly displaced while meeting specified criteria for performance, such as electrical conductivity, inductance, high frequency performance, and mechanical performance (such as a requirement that external applied force be below a certain value). Reversibility denotes that the working range of the contact (array) is preserved when the contact arms of the contact array are brought into contact with an external device, compressed, released from contact, and subsequently brought back into contact with an external device. Thus, a contact having a reversible working range of about 20 mil would maintain acceptable properties, such as conductivity and inductance, throughout a distance of 20 mil while being compressed and released repeatedly.

The working range or reversible working range of elastic contacts arranged in an array can be further expressed in terms of the pitch of the array. Configurations of the present invention provide interposers whose array pitch and contact size are generally scalable from an array pitch of about 50 mils down to an array pitch of microns or less. In other words, the processes for making the contact arrays and via arrays can be scaled down from current technology (~1-2 mm pitch) at least by a factor of 10-100. Accordingly, as the contact array pitch decreases, contact size and working range may decrease. For a given array pitch, the normalized working range is defined as the working range divided by the pitch. The normalized working range is similar to the elasticity to size ratio mentioned above. However, the former parameter refers to a ratio of an elastic displacement range of a contact arm as compared to the length (size) of the elastic contact arm, whereas the normalized working range is a measure of the relative displacement range of elastic contacts (in which properties of interest are acceptable) as compared to the space between contacts (pitch). Because configurations of this invention provide elastic contacts whose length can exceed the array pitch (see discussion with respect to FIG. 27C), the vertical range of displacement of a contact arm (equal to the working range at the limit) can attain a large fraction of the size of the array pitch. For example, if a contact arm at rest above the interposer substrate forms an approximate 45 degree angle viewed in cross section, the height of the distal end of the contact above the substrate is about 0.7 times its length. Accordingly, when the contact arm is brought into contact with an external component, its range of travel can approximate the value of 0.7 times the contact length before the contact arm encounters the substrate surface. In this case, if the contact arm length is designed to lie along an array diagonal (and has a length about a factor of 1.2-1.4 times the array pitch), the normalized displacement achievable (equivalent to an upper limit on the normalized working range) would be in the range of 0.8-1.0. In practical implementations of this invention, normalized working ranges between about 0.25 and at about 1.0 are possible.

In configurations of this invention employing BeCu, spring steel, or another highly elastic conductive material, the yield stress is designed to exceed the displacement force applied to a contact arm when the contact arm is displaced through its maximum displacement. Accordingly, after an interposer whose contacts are displaced to the maximum extent is released from contact with an external component, the height of the distal end of the contact arms above the interposer substrate surface can be maintained through repeated contact with external electrical components. This is because the contact arms have a relatively larger elastic range, and are therefore subject to little or no plastic deformation (yield) during repeated loading of an external component. In other words, the contacts exhibit an elastic response over the entire working range, such that the contacts do not exhibit plastic yielding up to the point at which the contacts cannot be displaced further. Accordingly, the normalized reversible working range (defined as the normalized working range divided by the array pitch) of elastic contacts can be in the range of 0.25 to 0.75 for configurations of this invention. For 1.12 mm array pitch, a reversible working range of about 0.3 mm to 1.0 mm is possible for contacts arranged according to configurations of the present invention.

In other configurations of this invention, a contact array having N number of contacts can be aligned on top of a substrate surface having a M number of vias. In such an arrangement, not every via would uniquely couple to contact, if M>N, or not every contact would uniquely couple to a via if M<N. In some configurations of this invention, elastic contacts are aligned to vias such that a contact extends over a via, as illustrated in FIG. 9. However, in other configurations of this invention, the contacts may be arranged so that elastic arm portions do not extend over conductive vias. For example, referring again to FIG. 9, elastic portions 916 can be arranged to extend to the right so that portions 916 lie over substrate 904 rather than over conductive vias 902. In other configurations of this invention, elastic contact arms, such as portions 916 can be arranged such that, when considered in plan view, no portions of the contact arms overlap conductive vias.

In some configurations of this invention, elastic contacts such as those illustrated in FIGS. 2 and 27A-29B can be arranged on both sides of an interposer, while in other configurations the contact arrays are only arranged on one side of a connector. In addition, different configurations of contact arrays can be arranged on opposite sides of an interposer. For example, in one configuration of this invention, a first side of an interposer contains a "local coupling" of contacts and conductive vias, such as illustrated in FIG. 27A, while an opposite side of the interposer contains a "remote coupling" of contacts and conductive vias, as illustrated in FIG. 29A. It will be understood that this invention includes configurations in which other combinations of single contacts, irregularly spaced contacts, and multiple arrays of contacts can be arranged on one side of an interposer, and connected in combinations of remote and local coupling to respective conductive vias.

Figure 29B:
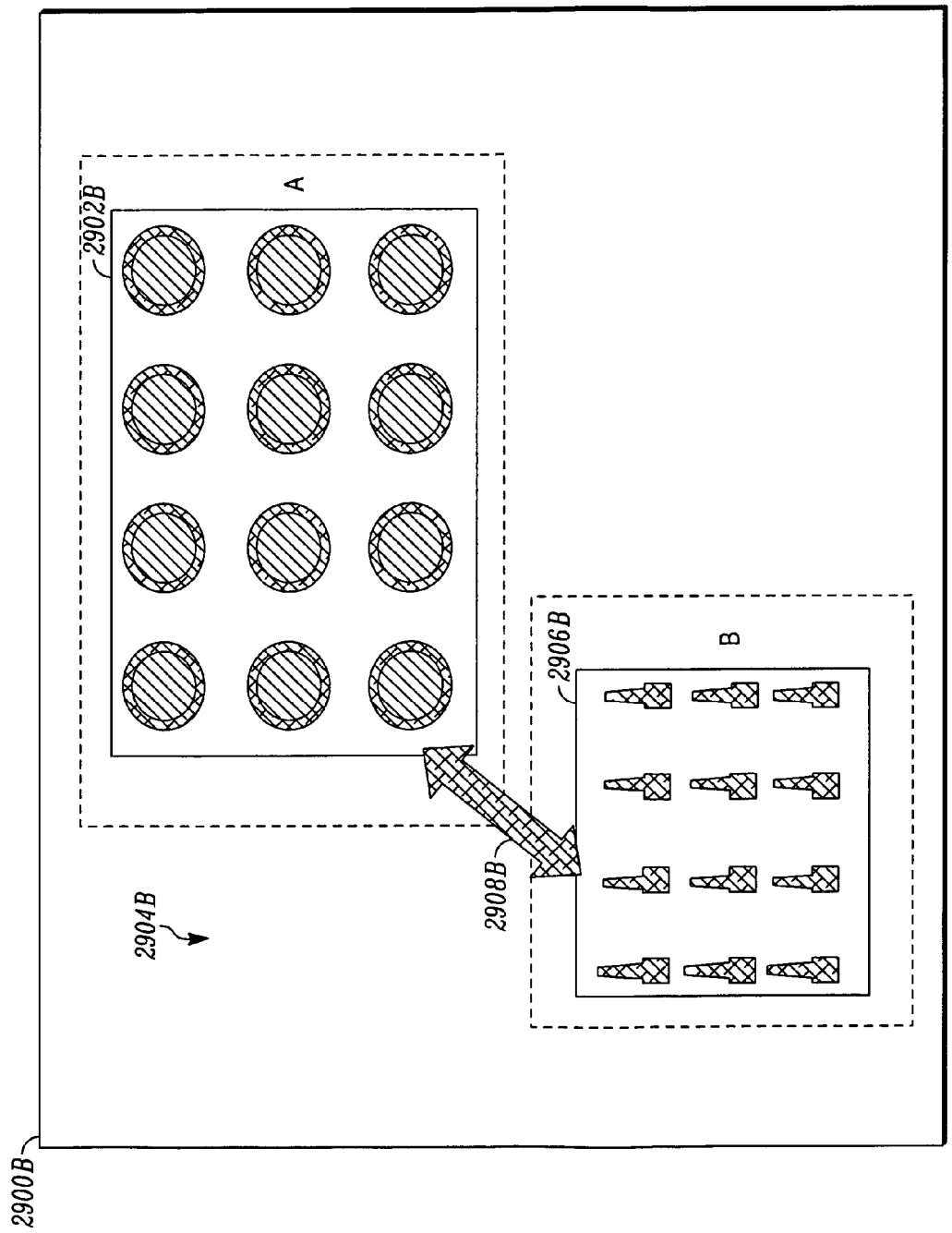
FIG. 29B is a schematic diagram that illustrates another interposer that includes an elastic contact array and an array of conductive vias having a second pitch, according to another configuration of this invention.

In another configuration of the present invention, as illustrated in FIG. 29B, an interposer 2900B for connecting two components includes an elastic contact array 2906B arranged in a first region of insulating substrate 2904B and having a first pitch, wherein the contact array is electrically coupled (via conductive paths 2908B) to an array of conductive vias 2902B arranged in a second region of insulating substrate 2904B and having a second pitch different from the first pitch. Accordingly, the interposer can be used to electrically interconnect a first electrical component having electrical contact points spaced according to the first pitch and a second electrical component having electrical contact points spaced according to the second pitch. For example, the conductive via array might couple to a pin array in a second component having the second pitch, while the elastic contacts couple to a ball array of the first component having the first pitch.

In FIGS. 27B, 28, 29A, and 29B, conductive paths that connect respective elastic contacts to conductive vias may reside on the top surface of an interposer. However, in some configurations of the present invention, the conductive paths, for example paths 2908A depicted in FIG. 29A, can be formed and embedded within an interposer below the surface, such that the ends of each conductive path still form an electrical connection to respective vias or elastic contacts. For example, a conductive line 2908A can be embedded below the surface of substrate 2904A and rise to the substrate surface at one end to connect to an elastic contact base in array 2906A. At the opposite end of the same conductive line 2908A, the conductive line can connect to a conductive via of array 2902A at, for example, a conductively plated vertical wall at a region below the substrate surface or on the surface.

Additionally, because lithographic patterning of contact arrays is performed independent of the interposer substrate structure, the contact arrays can be arranged in any desirable configuration with respect to interposer substrate conductive vias. Thus, an array of contacts where each contact is electrically connected to a given via in an array of vias, need not be located adjacent to that array of vias. This affords flexibility in design of the contact size and shape, since the contacts arms can in principle be designed to be much larger than a via diameter, for example. This affords a larger vertical working distance in comparison to arrangements where contact arms are located over vias.

In further configurations of the present invention, heterogeneous contacts are provided on a same side of a substrate, such as an interposer. One example of a heterogeneous contact arrangement is an array of contacts whose contact arm length varies between contacts. For example, a contact array can comprise two mutually interspersed contact sub arrays in which every other contact have mutually the same contact arm length and adjacent contacts have differing contact arm length.

Figure 30A:
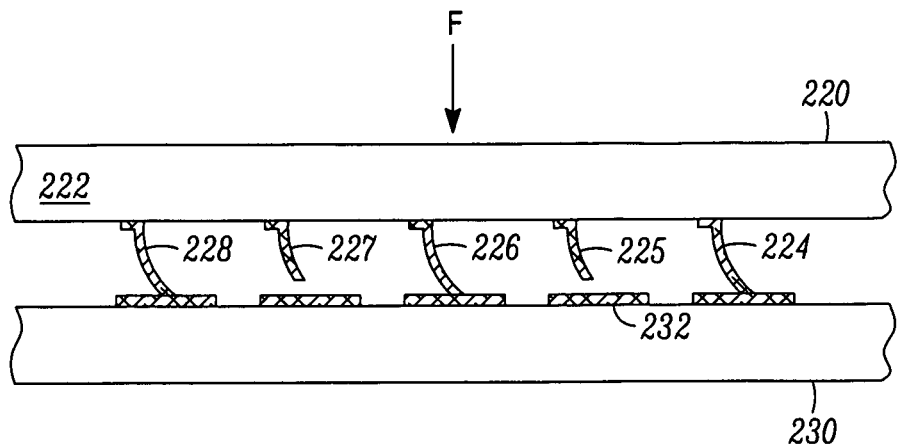
FIGS. 30A and 30B are schematic diagrams that cross-sectional views of a connector, according to an alternate embodiment of the present invention.
Figure 30B:
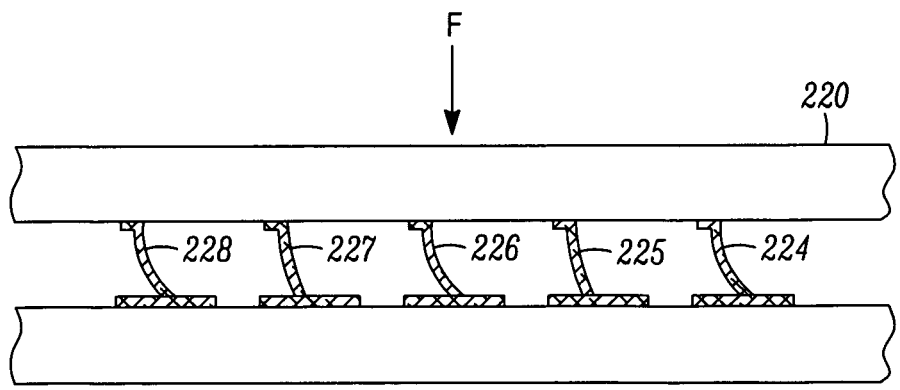

FIGS. 30A and 30B are cross-sectional views of a connector according to an alternate configuration of the present invention. Referring to FIG. 30A, a connector 220 includes a first set of contact elements 224, 226 and 228 and a second set of contact elements 225 and 227, all formed on a substrate 222. The first set of contact elements 224, 226 and 228 has a curved spring portion longer than the curved spring portion of the second set of contact elements 225 and 227. In other words, the height of the curved spring portion of contact elements 224, 226 and 228 is greater than the height of the curved spring portion of contact elements 225 and 227.

By providing contact elements having different height, connector 220 of the present invention can be advantageously applied in "hot-swapping" applications. Hot-swapping refers to mounting or demounting a semiconductor device while the system to which the device is to be connected is electrically active without damaging to the semiconductor device or the system. In a hot-swapping operation, various power and ground pins and signal pins must be connected and disconnected in sequence and not at the same time in order to avoid damages to the device or the system. By using a connector including contact elements with different heights, taller contact elements can be use to make electrical connection before shorter contact elements. In this manner, a desired sequence of electrical connection can be made to enable hot-swapping operation.

As shown in FIG. 30A, connector 220 is to be connected to a semiconductor device 230 including metal pads 232 formed thereon. When an external biasing force F is applied to engage connector 220 with semiconductor device 230, the tall contact elements 224, 226 and 228 make contact with respective metal pads 232 first while shorter contact elements 225 and 227 remain unconnected. Contact elements 224, 226 and 228 can be used to make electrical connection to power and ground pins of semiconductor device 230. With further application of the external biasing force F (FIG. 30B), shorter contact elements 225 and 227, making connection to signal pins, can then make connection with respective metal pads 232 on device 230. Because the contact elements of the present invention have a large elastic working range, the first set of contact elements can be further compressed than the second set of contact elements without compromising the integrity of the contact elements. In this manner, connector 220 enables hot-swapping operation with semiconductor device 230.

As described above, when the contact elements of the connector of the present invention are formed using semiconductor fabrication processes, contact elements having a variety of mechanical and electrical properties can be formed. In particular, the use of semiconductor fabrication processing steps allows a connector to be built to include contact elements having different mechanical and/or electrical properties. Such "semiconductor" fabrication processes nevertheless can be employed in conjunction with substrates, such as PCB substrates, to form elastic contact arrays having contact sizes larger than the typical micron or sub-micron sizes typical of present day semiconductor devices. For example, the processes illustrated, for example, in FIGS. 14A-17H, can be used to form contact arrays on PCB-type substrates having array pitches in the range of about 10-100 microns.

Thus, according to another aspect of the present invention, a connector of the present invention is provided with contact elements having different operating properties. That is, the connector includes heterogeneous contact elements where the operating properties of the contact elements can be selected to meet requirements in the desired application. In the present description, the operating properties of a contact element refer to the electrical, mechanical and reliability properties of the contact element. By incorporating contact elements with different electrical and/or mechanical properties, the connector of the present invention can be made to meet all of the stringent electrical, mechanical and reliability requirements for high-performance interconnect applications.

According to one aspect of the present invention, the following mechanical properties can be specifically engineered for a contact element or a set of contact elements to achieve certain desired operational characteristics. First, the contact force for each contact element can be selected to ensure either a low resistance connection for some contact elements or a low overall contact force for the connector. Second, the elastic working range of each contact element over which the contact element operates as required electrically can be varied between contact elements. Third, the vertical height of each contact element can be varied. Fourth, the pitch or horizontal dimensions of the contact element can be varied.

According to alternate aspects of the present invention, the electrical properties can be specifically engineered for a contact element or a set of contact elements to achieve certain desired operational characteristics. For instance, the DC resistance, the impedance, the inductance and the current carrying capacity of each contact element can be varied between contact elements. Thus, a group of contact elements can be engineered to have lower resistance or a group of contact elements can be engineered to have low inductance.

In most applications, the contact elements can be engineered to obtain the desired reliability properties for a contact element or a set of contact elements to achieve certain desired operational characteristics. For instance, the contact elements can be engineered to display no or minimal performance degradation after environmental stresses such as thermal cycling, thermal shock and vibration, corrosion testing, and humidity testing. The contact elements can also be engineered to meet other reliability requirements defined by industry standards, such as those defined by the Electronics Industry Alliance (EIA).

When the contact elements in the connectors of the present invention are fabricated as a MEMS grid array, the mechanical and electrical properties of the contact elements can be modified by changing, for example, the following design parameters. First, the thickness of the curved spring portion of the contact element can be selected to give a desired contact force. For example, a thickness of about 30 microns typically gives low contact force on the order of 10 grams or less while a flange thickness of 40 microns gives a higher contact force of 20 grams for the same displacement. The width, length and shape of the curved sprint portion can also be selected to give the desired contact force.

Second, the number of curved spring portions to include in a contact element can be selected to achieve the desired contact force, the desired current carrying capacity and the desired contact resistance. For example, doubling the number of curved spring portions roughly doubles the contact force and current carrying capacity while roughly decreasing the contact resistance by a factor of two.

Third, specific metal composition and treatment can be selected to obtain the desired elastic and conductivity characteristics. For example, Cu-alloys, such as copper-beryllium, can be used to provide a good tradeoff between mechanical elasticity and electrical conductivity. Alternately, metal multi-layers can be used to provide both excellent mechanical and electrical properties. In one configuration, a contact element is formed using titanium (Ti) coated with copper (Cu) and then with nickel (Ni) and finally with gold (Au) to form a Ti/Cu/Ni/Au multilayer. The Ti can provide rigidity and high mechanical durability while the Cu can provide excellent conductivity as well as elasticity and the Ni and Au layers can provide excellent corrosion resistance. Finally, different metal deposition techniques, such as plating or sputtering, and different metal treatment techniques, such as alloying, annealing, and other metallurgical techniques can be used to engineer specific desired properties for the contact elements.

Fourth, the curvature of the curved spring portion can be designed to give certain electrical and mechanical properties. The height of the curved spring portion, or the amount of projection from the base portion, can also be varied to give the desired electrical and mechanical properties.

One feature of the above processes illustrated in particular in FIGS. 1 and 3A-3B is that the need for expensive tools to form contact structures is avoided. A great deal of contact design flexibility is afforded by the fact that two dimensional contact design is accomplished by well established computer-aided design. In other words, a mask or patterning process to form a desired contact structure can be designed using Gerber or other systems. Custom design can be performed or contact shapes can be selected from design libraries. Similarly, forming tools can be easily fabricated using designs that are matched to the contact array design of the spring sheet array to be formed. The lithographic techniques used for patterning spring sheets and/or forming tools are robust and inexpensive.

In the specific examples illustrated in FIGS. 2, 7A, 7B, 7C, 7D, 9 and 12 contact arms have the shape of rolling beams. By proper choice of material, contact shape design, and processing conditions, discussed further below, the performance of such contacts can be extended beyond that achievable by conventional contacts made for interposers. The contacts illustrated in FIG. 9, for example, can be engineered to be highly elastic, such that little or no fatigue occurs with repeated up and down displacement of the contacts during coupling and decoupling to an external device. Additionally, the length of the contacts can be designed independent of the via size or via spacing, so that larger working ranges (related to the vertical displacement range of the contacts) can be achieved in comparison to contacts formed directly over vias. Moreover, by proper choice of composition of a conductive sheet for forming the contact arms, and proper heat treatment of the contacts, as well as proper interposer design, the mechanical properties of the contact arms can be tuned to fit the desired application. For example, as discussed further below, the effective elastic modulus of the contacts as well as the elastic range can be varied by heat treatment of Cu alloys used to form the contact, as well as design of the region near the contact base.

The mechanical properties of the elastic contacts can be further tailored by engineering of the adhesive layer during the bonding process. Adhesive layers suitable for configurations of the present invention typically contain a polymer inner layer surrounded by epoxy layers on top and bottom. It has been experimentally determined that proper choice of adhesive layer can increase working range by about 0.5-1 mil for contacts having a working range on the order of 6-8 mils. In addition, by providing adhesive reservoirs acting as flow restrictors, in the substrate or spring sheet (see elements 710, 732, and 742 of FIGS. 7A, 7C, and 7D, respectively) superior contact properties are obtained after bonding. By proper design of such flow restrictors, the adhesive flow can be minimized. By preventing adhesive from flowing to the underside of a contact arm during bonding of a spring sheet, the flow restrictors facilitate fabrication of contact arms having a longer effective length. In other words, the point about which the contact arm rotates during downward displacement is effectively shorter when adhesive is located on the underside of the contact arms near the contact base (compare contacts 702 of FIGS. 7A and 7B). By ensuring no adhesive is located under the contact arm, thus extending the effective contact arm length, a greater displacement of a contact arm for a given load (stress) occurs, thereby reducing the possibility that the contact arm is subject to a yield stress before it reaches its maximum displacement.

Figure 31:
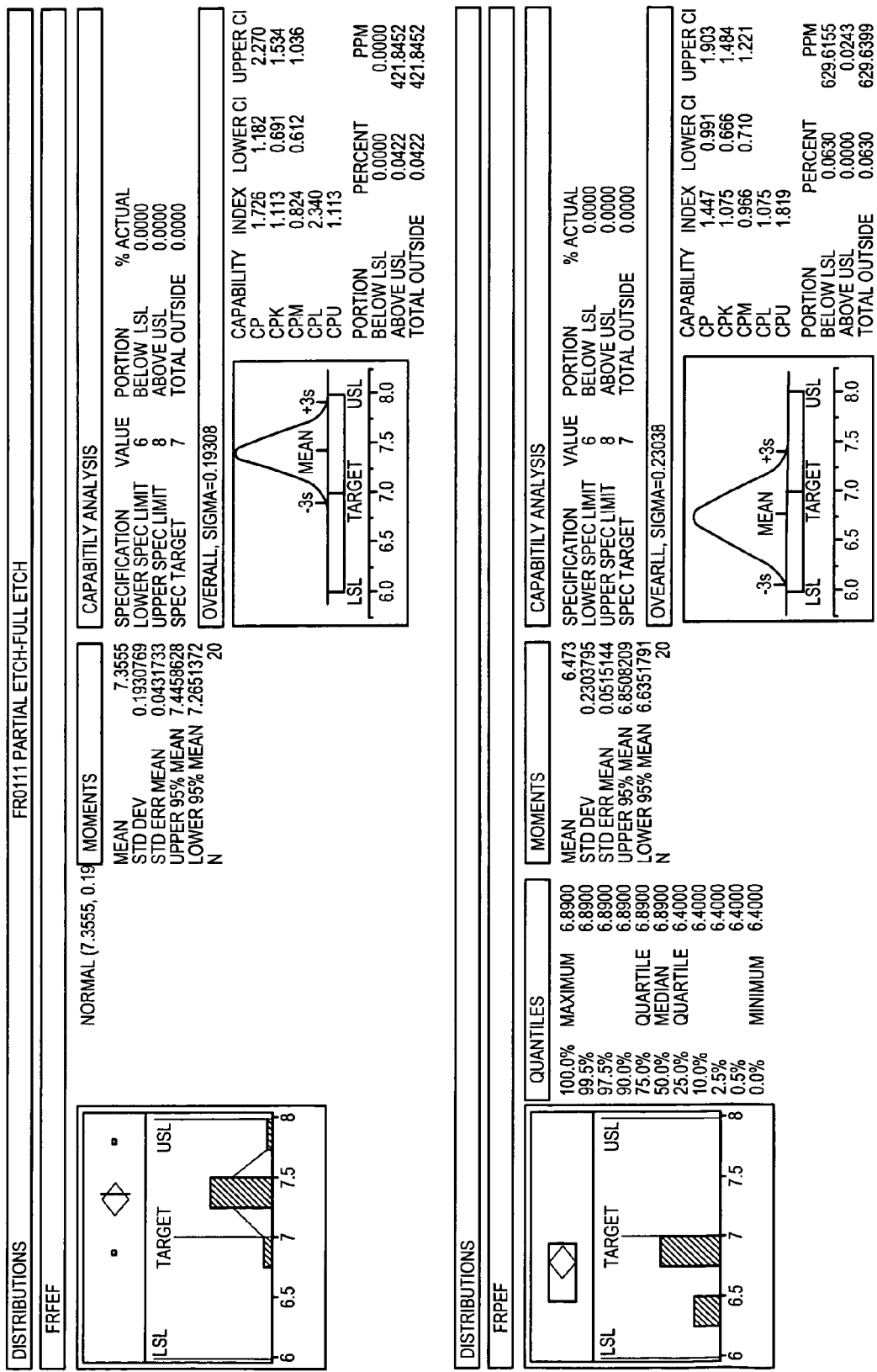
FIGS. 31 and 32 are data sheets that illustrate the effect of changing the adhesive type and flow restrictor configuration on elastic contact working range.
Figure 32:
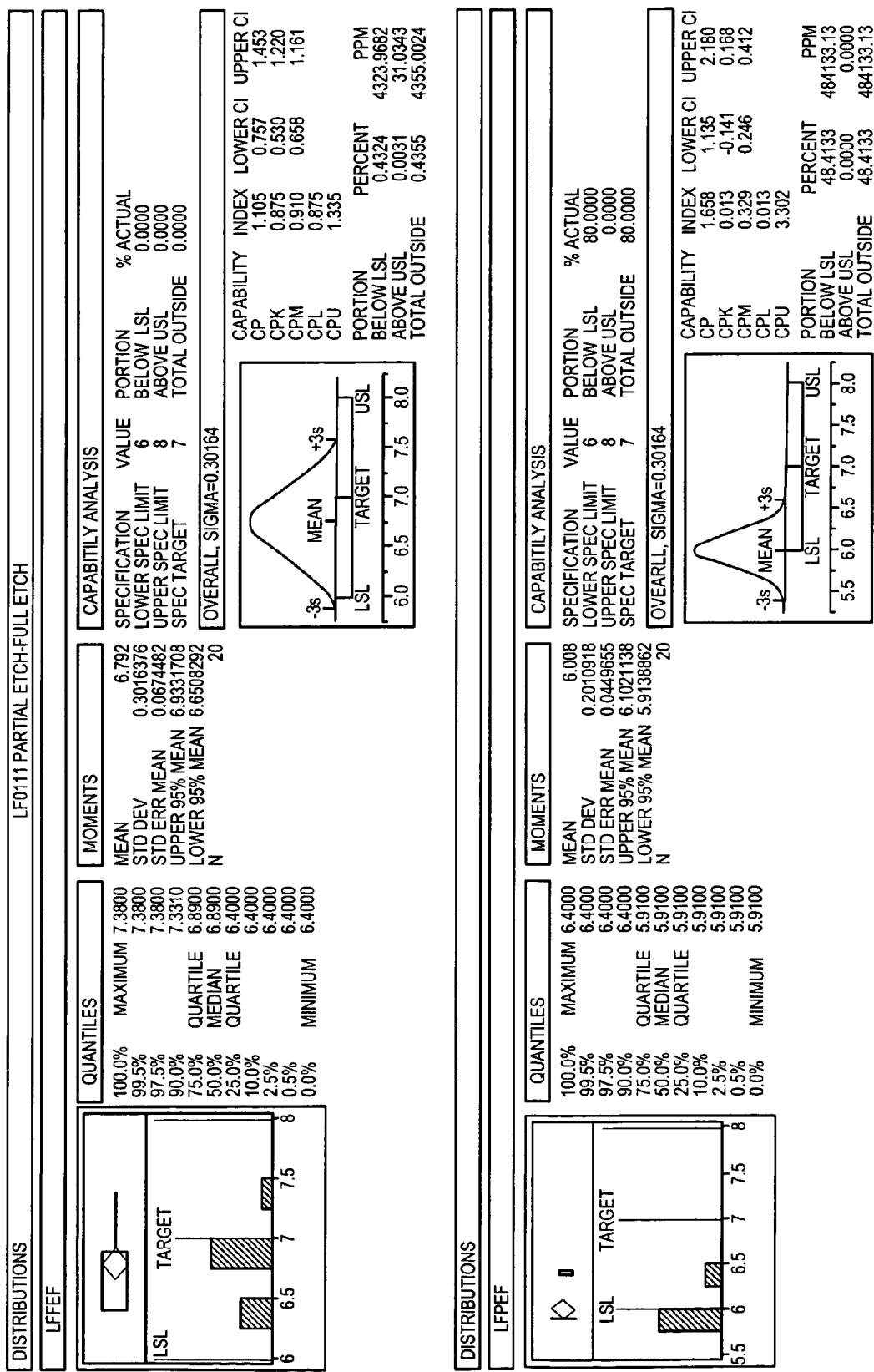

The effect of tailoring the adhesive layer and flow restrictors adjacent to the adhesive layer is shown in FIGS. 31 and 32, which illustrate for contacts bonded with FR011 and LF0111 adhesive materials, respectively, the measured working range for substrates having partially etched flow restrictors and fully etched flow restrictors. Changing adhesive material results in a change in working range of about 0.6-0.7 mil, while changing from a partially to fully etched flow restrictor induces a similar change in working range (See FIGS. 7C and 7D for a comparison of substrates having partially etched as opposed to fully etched flow restrictors).

Figure 33A:
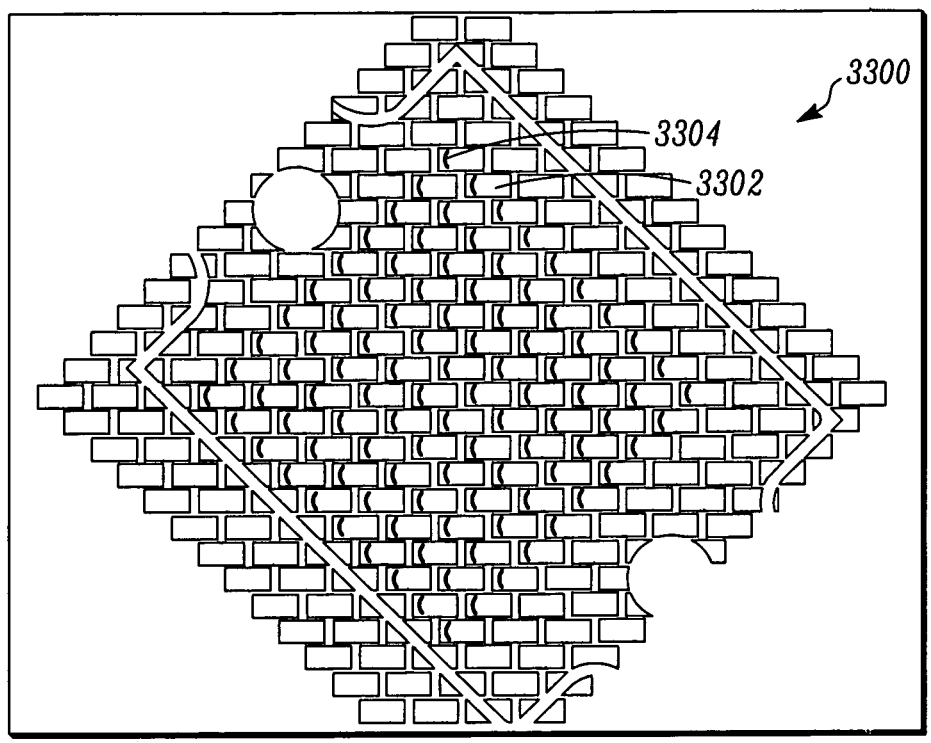
FIG. 33A is an image that illustrates, in accordance with a further configuration of this invention, a capture pad layout that includes pads having an arc-shaped slot configured to capture adhesive during a bonding process.

FIG. 33A illustrates, in accordance with a further configuration of this invention, a capture pad layout 3300 that includes pads 3302, each provided with an arc-shaped slot 3304 configured to capture adhesive during a bonding process. The slots are designed to form a concentric arc around a via (not shown). For example, a substrate provided with a metal cladding having the pattern of pads 3302 can have vias drilled through the substrate and located on each pad to be concentric with a given slot 3304. Contacts in a spring sheet to be bonded to the substrate can be arranged such that the contact arms extend from base portions located above the slots 3304. During bonding, adhesive that is forced toward the open via can be collected in a slot 3304 provided near the edge of the via.

Figure 33B:
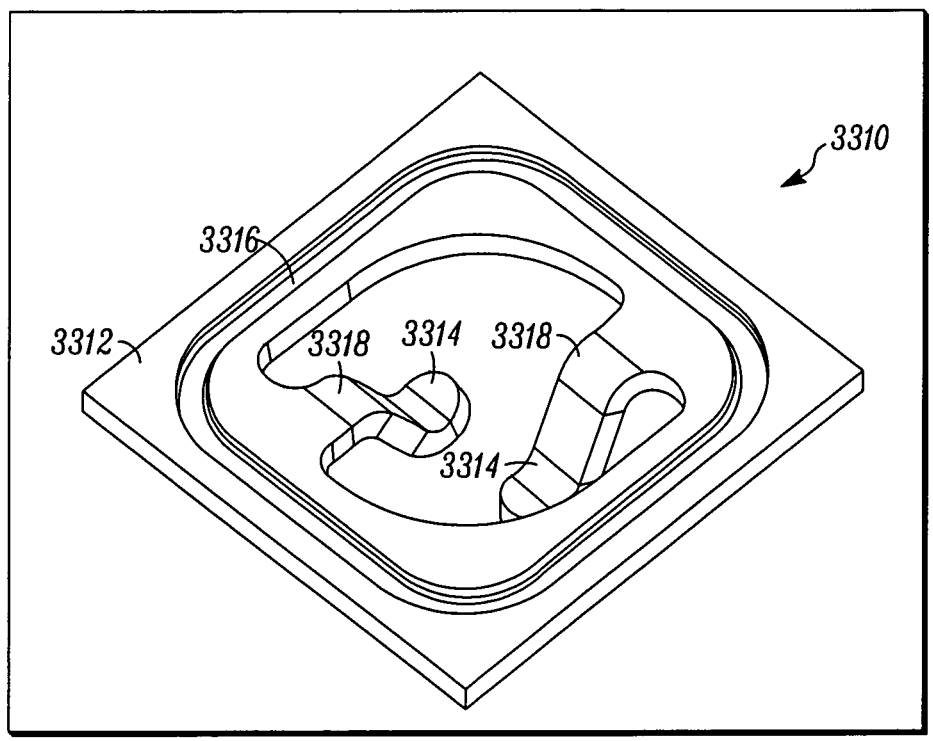
FIGS. 33B-33E are schematic diagrams that illustrate, in perspective view, flow restrictor variations provided in exemplary contact structures, according to further configurations of the present invention.

FIGS. 33B-33E illustrate, in perspective view, flow restrictor variations provided in exemplary contact structures, according to further configurations of the present invention. In each figure, the upper contact surface shown represents the contact surface that is configured for bonding to a connector substrate. FIG. 33B illustrates a dual contact arm contact 3310 having a partially etched region 3316 forming a square-like depression within base portion 3312 and surrounding the region where contact arms 3314 join base 3312. When contact 3310 is bonded to a substrate, excess adhesive is accommodated within square depression 3316 that acts as a flow restrictor, preventing adhesive from flowing under regions 3318.

Figure 33C:
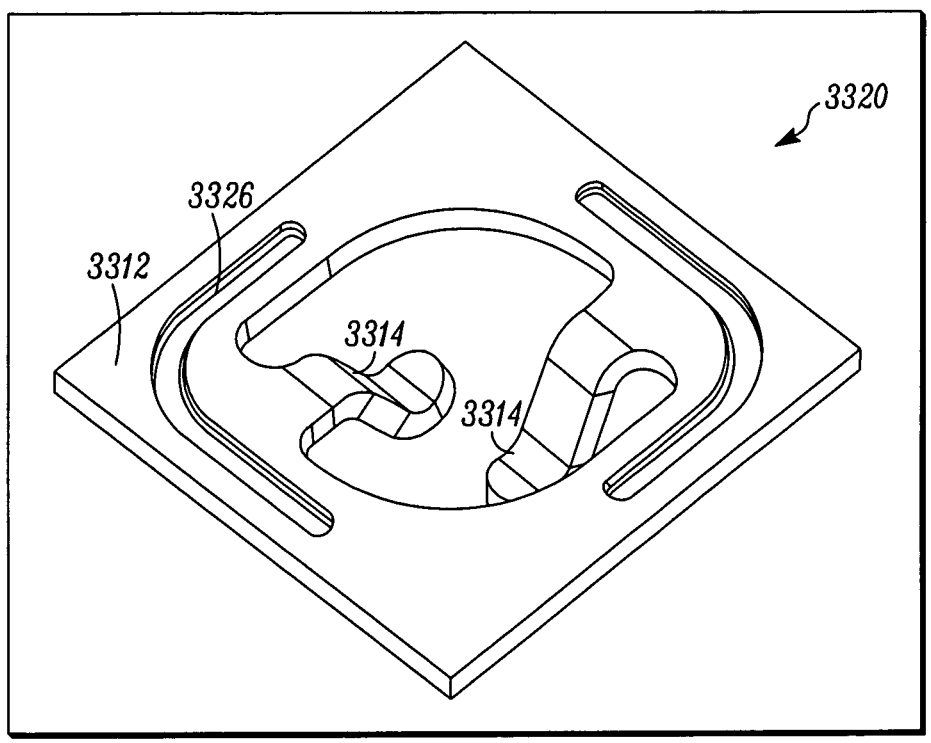

FIG. 33C illustrates a further contact structure 3320, in which flow restrictors 3326 are provided as two portions covering approximately one half of the square depression of regions 3316 and located adjacent to where contact arms 3314 join base 3312.

Figure 33D:
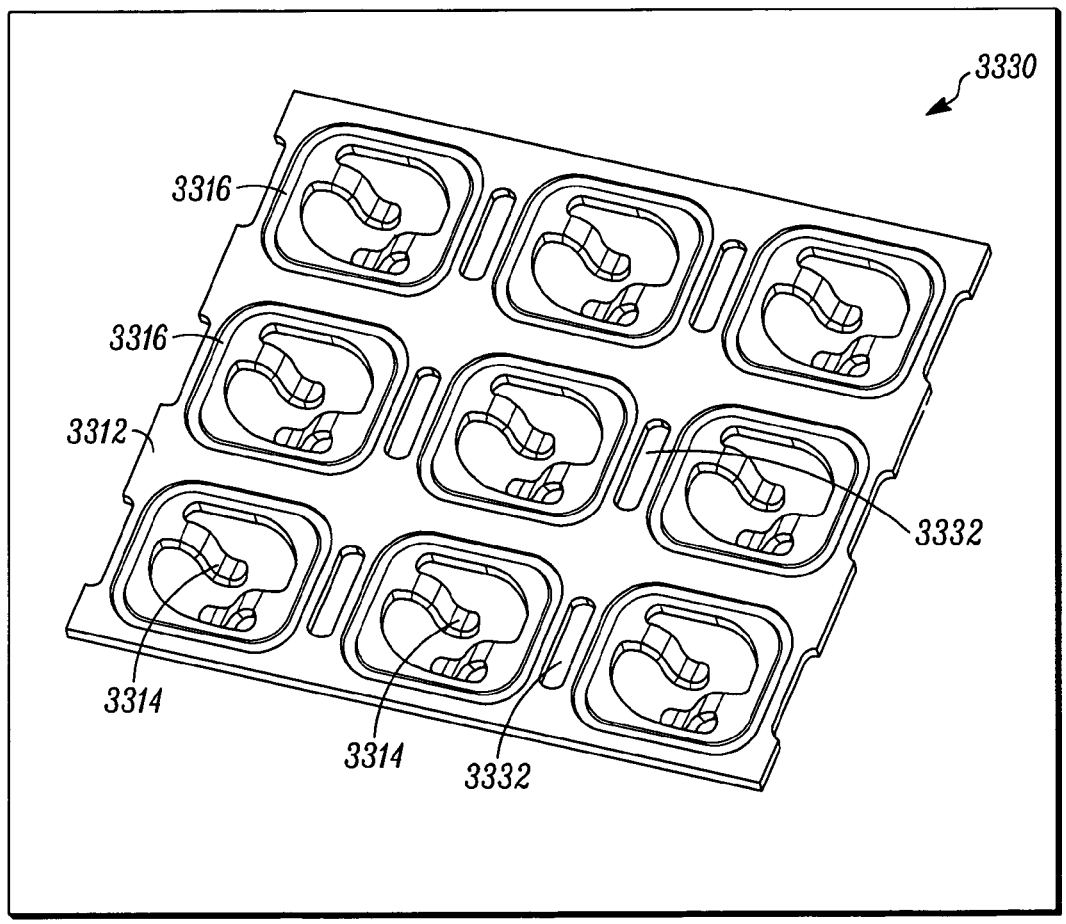

FIG. 33D illustrates a further contact structure 3330, illustrating an array of contacts that each include, in addition to partially etched flow restrictors 3316, fully etched oval regions 3332. Regions 3332 are each located adjacent to a portion of regions 3316 and near to regions in which contact arms 3314 join base portions 3312.

Figure 33E:
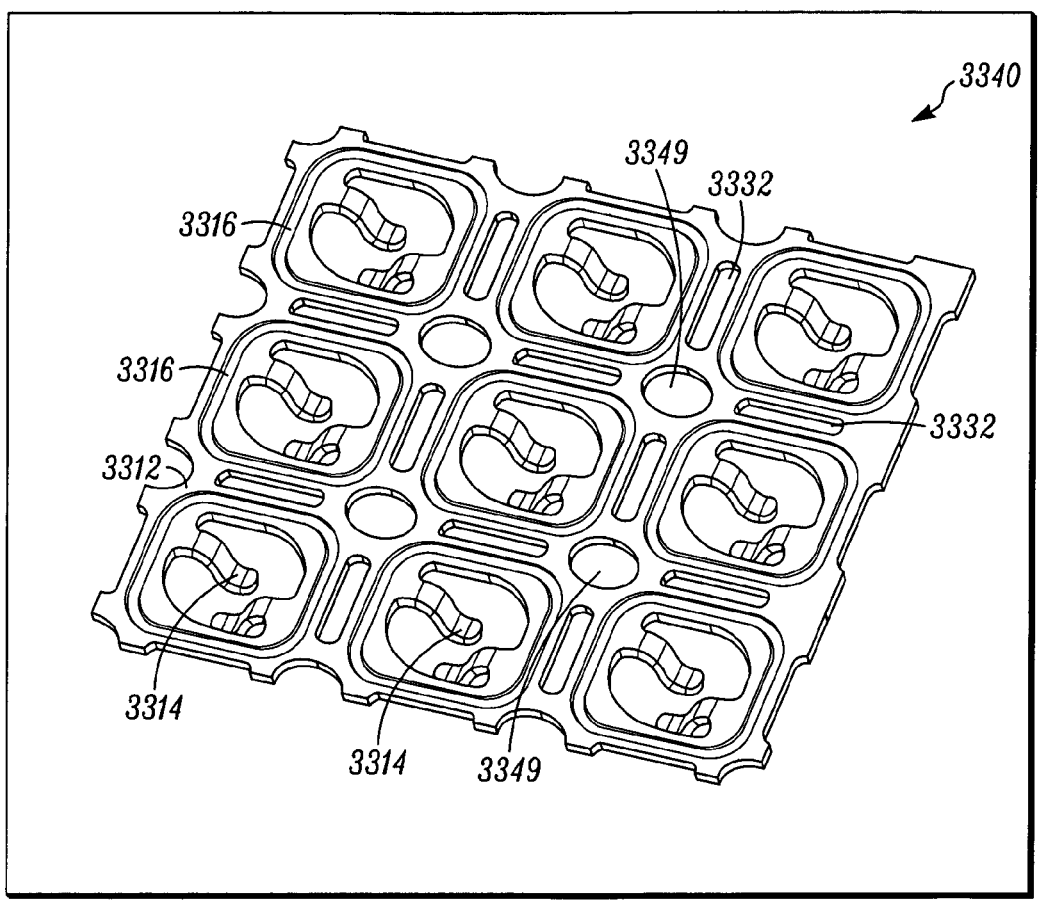

FIG. 33E illustrates another contact structure 3340, having features similar to those of contact structure 3330, with the addition of circular fully etched flow restrictors 3349 that are located in corner regions between contacts of the contact array.

Figure 34A:
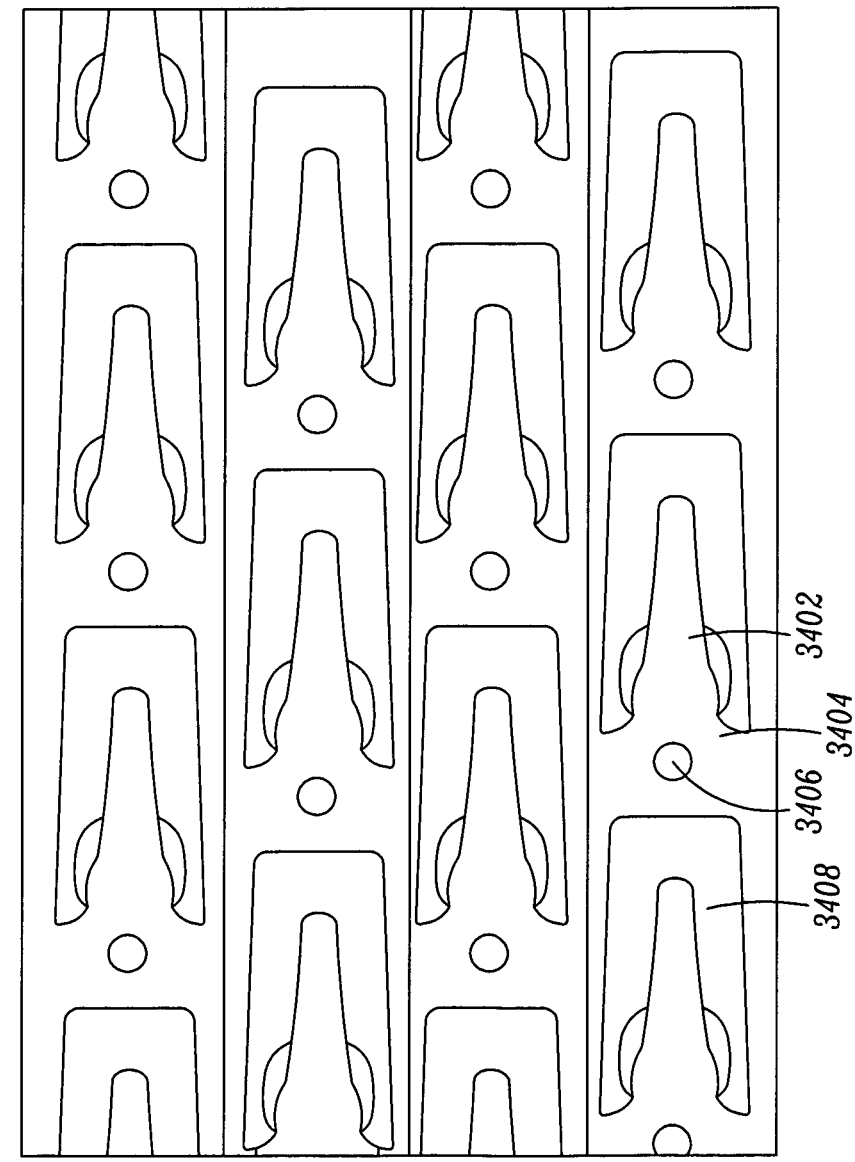
FIG. 34A is an image that illustrates a plan view of an exemplary contact arrangement according to a further configuration of this invention.
Figure 34B:
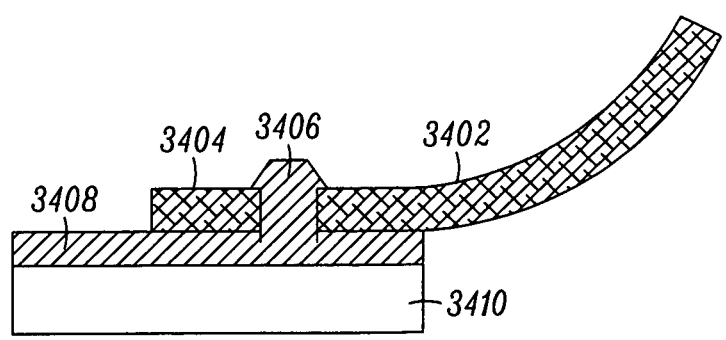
FIG. 34B is a schematic diagram that illustrates a cross-section view of a portion of the exemplary contact arrangement of FIG. 34A.

In addition, open through holes in the spring sheet can be provided to allow adhesive to flow up and over the top of the spring sheet. In one example, a contact structure includes a base portion provided with a hole within and around which adhesive material is disposed. In one configuration of this invention, the adhesive material has a rivet-like structure that forms by extrusion of adhesive through an aperture, such as a circular hole in the spring sheet, during bonding of the spring sheet to the substrate. The head of the rivet forms around the hole and acts to restrain the contact during mechanical deflection of the contact arm. FIG. 34A illustrates a plan view of an exemplary contact arrangement according to a further configuration of this invention. Arrangement 3400 includes an array of contacts 3402 whose base portions 3404 contain through holes 3406 that are configured to accommodate adhesive flow from an underlying adhesive layer 3408. Adhesive flowing through a circular hole 3406 can form a mound that extends (out of the page of FIG. 34A) above the plane of the base 3404 and extends beyond the outer diameter of the hole. When viewed in cross-section, as illustrated in FIG. 34B, the adhesive forms a mushroom, or rivet-like structure that serves to affix the base portion 3404 to the substrate 3410.

Figure 34C:
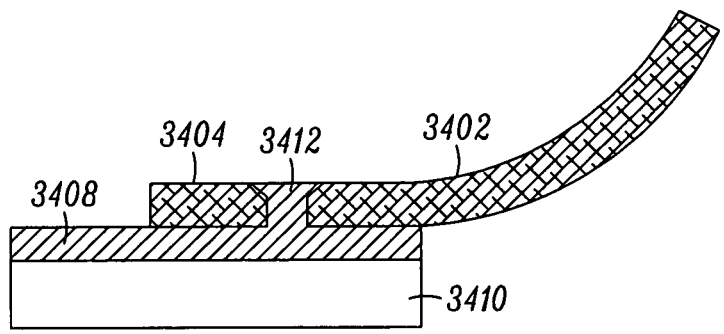
FIG. 34C is a schematic diagram that illustrates a variant of the contact structure of FIGS. 34A and 34B.

FIG. 34C illustrates a variant of the contact structure of FIGS. 34A and B, in which the top surface of the adhesive extruded within through hole 3412 does not substantially extend above the surface of the base. Because the through hole has a tapered cross section that increases in diameter towards the surface, the extruded adhesive portion 3410 forms a mechanical restraint to movement of the base without extending above the top surface of the base portion 3404.

Such a cross-sectional shape can be imparted to a through hole etched in a spring sheet by use of isotropic etchants.

The adhesive rivet portion 3406 can also act as a hard stop that prevents an external component from hitting other portions of a substrate, such as substrate 3410. As contact arm 3402 is displaced downwardly by a feature in an external device toward substrate 3410, other portions of the external device may approach substrate 3410 in other locations. An array of rivets 3406 can act to prevent the other portions of the external component from approaching too closely to substrate 3410, and thereby prevent damage during coupling to the external component.

In other configurations of the present invention, portions of the adhesive layer displaced upwardly to form rises or bumps near the edge of vias can also act as hard stops, in this case for adjacent contact arms (see adhesive layer portion 734 in FIG. 7C). The top of the adhesive layer thus prevents the contact arm from extending too far in a downward direction and can thereby reduce the tendency of the contact arm to reach a yield strain (displacement) point.

Figure 35:
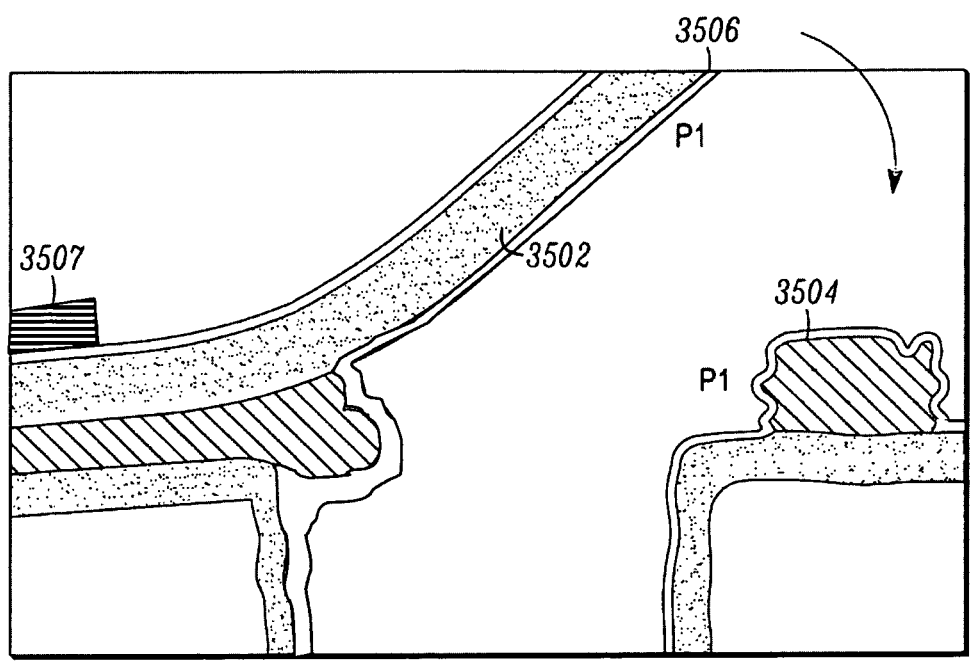
FIG. 35 is an image that illustrates a contact structure after forming conductive portions on top of an adhesive layer, according to one aspect of this invention.

In addition, the ability to raise the local surface level of the adhesive in given locations in the substrate provides a means to electrically shunt contacts during displacement of the contacts towards the substrate. After the formation stage illustrated in FIG. 7C, for example, an electroplating step takes place that coats exposed portions of the adhesive layer, with a conductive layer 3504 that can engage contact 3502, as illustrated in FIG. 35, leading to a smaller electrical path length and lower resistance. After the point P1 where the electrical shunting takes place, the distal end of contact arm 3506 can still be displaced downwardly.

Finally, the mechanical response of the contacts can be tailored by engineering a coverlay structure 3507 that is placed on top of portions of the contacts proximate to the contact arms.

The foregoing disclosure of configurations of the present invention has been presented for purposes of illustration and description. It is not intended to be exhaustive or to limit the invention to the precise forms disclosed. Many variations and modifications of the configurations described herein will be apparent to one of ordinary skill in the art in light of the above disclosure. The scope of the invention is to be defined only by the claims appended hereto, and by their equivalents.

Further, in describing representative configurations of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for fabricating an electrical connector having an insulating substrate comprising:
    providing a plurality of conductive vias in the insulating substrate;
    providing conductive paths to the conductive vias;
    forming an array of elastic contacts in a conductive sheet;
    bonding the conductive sheet of elastic contacts to the insulating substrate;
    electrically connecting the elastic contacts to conductive paths; and
    singulating at least one of the elastic contacts from an other elastic contact after the bonding and connecting steps.

2. The method of claim 1 further comprising offsetting at least one of the conductive vias from at least one of the elastic contacts to which it is electrically coupled by a conductive path or trace.

3. The method of claim 1 further comprising the step of scaling the contacts before forming and singulating them.

4. The method of claim 1 further comprising forming relief depressions in the substrate to receive bonding material.

5. The method of claim 1 further comprising plating at least a selected portion of at least one of the elastic contacts with conductive at predetermined location.

6. The method of claim 1 further comprising applying a coverlay that to a portion of base of at least one of the elastic contacts and a portion of the adjacent substrate after the step of singulating the contacts.

7. The method of claim 1 further comprising heat treating the conductive sheet.

8. The method of claim 1 further comprising:
    forming conductive paths that are embedded within the substrate, each conductive path contacting a conductive via.

9. The method of claim 1 further comprising using a spacer material.

10. The method of claim 1 in which the elastic contacts in a spring sheet are adhered to the connector using non-conductive adhesive.

11. The method of claim 1 in which the elastic contacts in a spring sheet are adhered to the connector using conductive adhesive.

12. The method of claim 1 in which the elastic contacts in a spring sheet are adhered to the connector using intermetallic bonding.

13. The method of making an electrical connector including the steps of claim 1 and further including the step of providing at least one flow restricting feature in at least one of the substrate and the spring sheet.

14. The method of making an electrical connector including the steps of claim 1 wherein the step of singulating the elastic contacts includes the step of masking to define areas for selective plating, plating desired metallurgy then masking and etching the sheet to define the contact structure.

15. The method of making an electrical connector including the steps of claim 14 wherein the step of singulating the elastic contact includes the step of chemically singulating one elastic contact from an other elastic contact.

16. The method of making an electrical connector including the steps of claim 1 and further including the step of forming a scaled sheet of elastic contacts into three-dimensional elastic contacts.

17. The method of making an electrical connector including the steps of claim 16 and further including the step of using a scaled forming tool to form a plurality of two-dimensional elastic contacts simultaneously into a three-dimensional shape.

18. The method of making an electrical connector including the steps of claim 1 and further including the step of forming at least one elastic contact having one distance from plane of the spring sheet and forming at least one other elastic contact having a second distance from the plane of the spring sheet, where the first distance differs from the second distance.

19. The method of making an electrical connector including the steps of claim 1 and further including the step of heat treating the spring sheet prior to bonding the conductive sheet to the substrate.

20. The method of making an electrical connector including the steps of claim 1 wherein the step of providing conductive paths to the conductive vias includes the step of plating.

21. The method of making an electrical connector including the steps of claim 1 and further including the step of forming at least a first set elastic of contacts having a first pitch and a second set of elastic contacts with a second pitch on the same sheet, where the first pitch differs from the second pitch.

22. A method for fabricating an electrical connector having an insulating substrate comprising:
- providing a plurality of conductive vias in the insulating substrate;
- providing conductive paths coupled to at least some of the conductive vias;
- forming an array of elastic contacts in a conductive sheet;
- bonding the conductive sheet of elastic contacts to the substrate;
- singulating at least one of the elastic contacts from an other elastic contact after the bonding electrically connecting the elastic contacts to conductive paths by means of plating.

* * * * *